US012744548B2

(12) United States Patent
King et al.

(10) Patent No.: US 12,744,548 B2
(45) Date of Patent: Sep. 22, 2026

(54) PERFORMING COMPARISON OPERATIONS USING VECTOR FLOATING POINT VALUES

(71) Applicant: Imagination Technologies Limited, Kings Langley (GB)

(72) Inventors: Rostam King, Hertfordshire (GB); Peter Smith-Lacey, Hertfordshire (GB)

(73) Assignee: Imagination Technologies Limited, Kings Langley (GB)

(*) Notice: Subject to any disclaimer, the term of this patent is extended or adjusted under 35 U.S.C. 154(b) by 1116 days.

(21) Appl. No.: 17/702,240

(22) Filed: Mar. 23, 2022

(65) Prior Publication Data

US 2022/0350606 A1 Nov. 3, 2022

(30) Foreign Application Priority Data

Mar. 23, 2021 (GB) ..................................... 2104067

(51) Int. Cl.
*H03M 7/24* (2006.01)
*G06F 7/02* (2006.01)
(Continued)

(52) U.S. Cl.
CPC ................ *H03M 7/24* (2013.01); *G06F 7/02* (2013.01); *G06F 7/483* (2013.01); *G06T 15/06* (2013.01);
(Continued)

(58) Field of Classification Search
CPC . G06F 7/02; G06F 7/026; G06F 7/483; G06T 15/06; G06T 1/20; H03M 7/24
See application file for complete search history.

(56) References Cited

U.S. PATENT DOCUMENTS 4,858,166 A 8/1989 Schatzberger et al.
8,134,566 B1 * 3/2012 Brown .................... G06T 15/04 345/522

(Continued)

FOREIGN PATENT DOCUMENTS

EP 0259971 A1 * 3/1988 ............. G06T 15/83
WO 2018077671 A1 5/2018

OTHER PUBLICATIONS

Kulish; The Fifth Floating-Point Operation for Top-Performance Computers; Institut fur Angewandte Mathematik; 1997 (Year: 1997).*

(Continued)

*Primary Examiner* — James Trujillo
*Assistant Examiner* — Jakob Oscar Gudas
(74) *Attorney, Agent, or Firm* — Potomac Law Group, PLLC; Vincent M DeLuca

(57) ABSTRACT

A particular comparison operation in ray tracing is performed using floating point values received in scalar format. The received values are promoted to vector format, wherein the received floating point values are used as a first component of vector floating point values. A second component of the vector floating point values is set to a non-zero, finite value. The comparison operation uses the vector floating point values to determine a vector result having first and second components. A scalar result of the particular comparison operation is determined, the magnitude of the scalar result being given by the magnitude of the first component. If the first component is non-zero, the sign of the scalar result equals the sign of the first component. If the first component is zero and the second component is non-zero, the sign of the scalar result equals the sign of the second component of the vector result.

19 Claims, 12 Drawing Sheets

(51) Int. Cl.

| | |
|---|---|
| ***G06F 7/483*** | (2006.01) |
| ***G06F 9/30*** | (2018.01) |
| ***G06T 15/06*** | (2011.01) |

(52) U.S. Cl.
CPC ...... *G06F 9/30036* (2013.01); *G06F 9/30038* (2023.08)

(56) References Cited

U.S. PATENT DOCUMENTS

| | | | |
|---|---|---|---|
| 8,217,935 B2 | 7/2012 | Purcell et al. | |
| 9,858,710 B2 | 1/2018 | Hwang et al. | |
| 9,928,640 B2 | 3/2018 | Woop et al. | |
| 10,459,688 B1 | 10/2019 | Burgess et al. | |
| 12,462,467 B2 | 11/2025 | Burns | |
| 2002/0033835 A1 | 3/2002 | Sowizral et al. | |
| 2003/0103054 A1* | 6/2003 | Montrym | G06T 15/005 345/506 |
| 2012/0078987 A1* | 3/2012 | Nystad | G06F 7/5525 708/207 |
| 2013/0321420 A1 | 12/2013 | Laine et al. | |
| 2016/0005215 A1 | 1/2016 | Hwang et al. | |
| 2018/0182158 A1 | 6/2018 | Karras et al. | |
| 2019/0369960 A1 | 12/2019 | Mueller et al. | |
| 2020/0019683 A1 | 1/2020 | Cannon et al. | |
| 2020/0051314 A1 | 2/2020 | Laine et al. | |
| 2020/0193685 A1 | 6/2020 | Saleh et al. | |
| 2021/0287421 A1* | 9/2021 | Saleh | G06T 15/005 |
| 2022/0207690 A1 | 6/2022 | Burns et al. | |
| 2025/0182380 A1 | 6/2025 | Burgess et al. | |
| 2025/0285358 A1 | 9/2025 | Muthler et al. | |

OTHER PUBLICATIONS

Malik; Importance of Vector Processing; Journal Of Harmonized Research in Engineering 1(2), 2013, 161-166 (Year: 2013).*

"Ray tracing primitives"; https://www.cl.cam.ac.uk/teaching/1999/AGraphHCI/SMAG/node2.html#SECTION00023100000000000000.

Havel et al; "Yet Faster Ray-Triangle Intersection (Using SSE4)"; IEEE Transactions On Visualization and Computer Graphics; vol. 16; No. 3; May/Jun. 2010; pp. 434-438.

Kensler et al; "Optimizing Ray-Triangle Intersection via Automated Search"; School of Computing; University of Utah; pp. 1-6.

Mahovsky et al; "Fast Ray-Axis Aligned Bounding Box Overlap Tests with Plucker Coordinates"; vol. 9; No. 1; pp. 35-46.

Möller et al; "Fast, Minimum Storage Ray/Triangle Intersection"; pp. 1-7.

Shevtsov et al; "Ray-Triangle Intersection Algorithm for Modern CPU Architectures"; Russia, Moscow, Jun. 23-27, 2007; pp. 1-7.

Smits; "Efficiency Issues for Ray Tracing"; University of Utah; Feb. 19, 1999; pp. 1-12.

Toth; "On Ray Tracing Parametric Surfaces"; Computer Graphics Development; Ford Motor Company; vol. 19; No. 3; 1985; San Francisco Jul. 22-26; pp. 171-179.

Woop et al; "Watertight Ray/Triangle Intersection"; Journal of Computer Graphics Techniques; vol. 2; No. 1; 2013; pp. 65-82.

Patterson, D.A. et al: "Computer Organization and Design," The Hardware/Software Interface (5th Edition), Morgan Kaufmann, 2013. (Year: 2013).

* cited by examiner

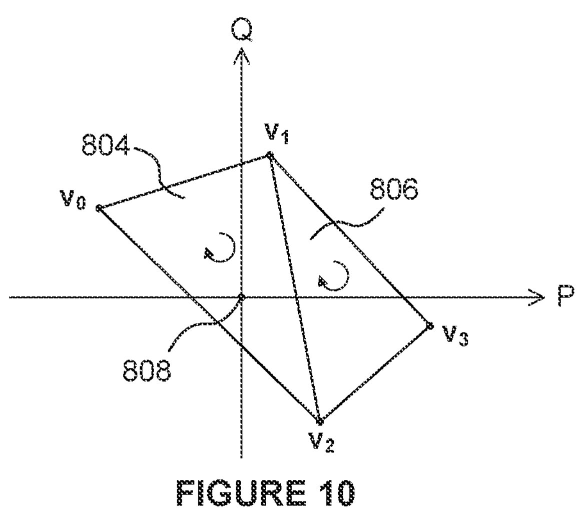
FIGURE 10
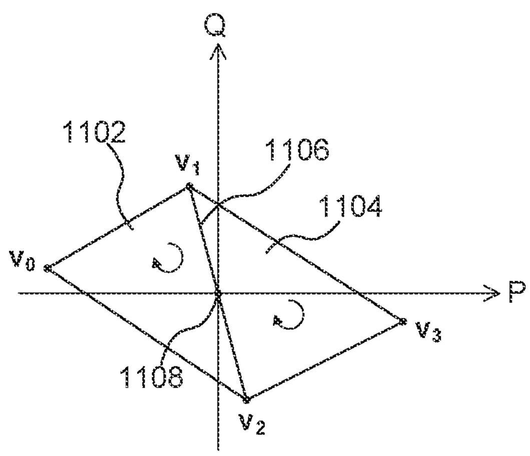
FIGURE 11
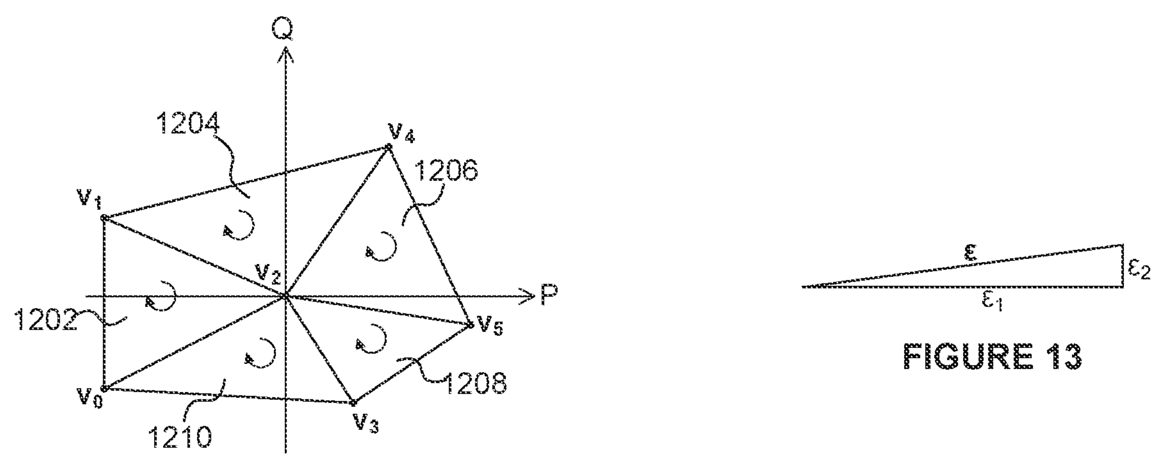
FIGURE 12
FIGURE 13

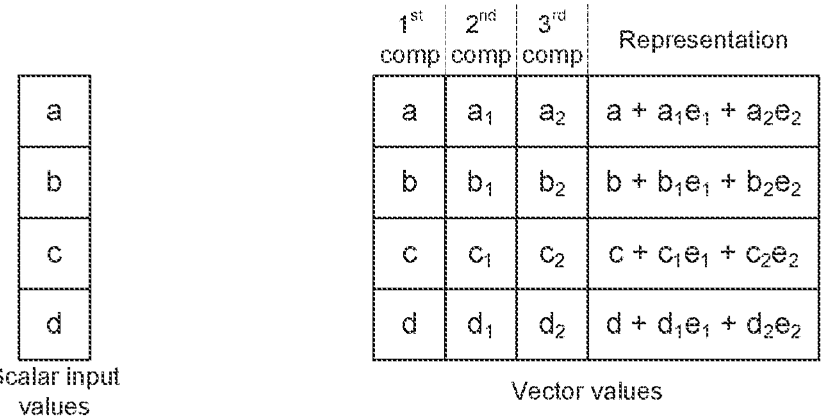
FIGURE 14a
FIGURE 14b
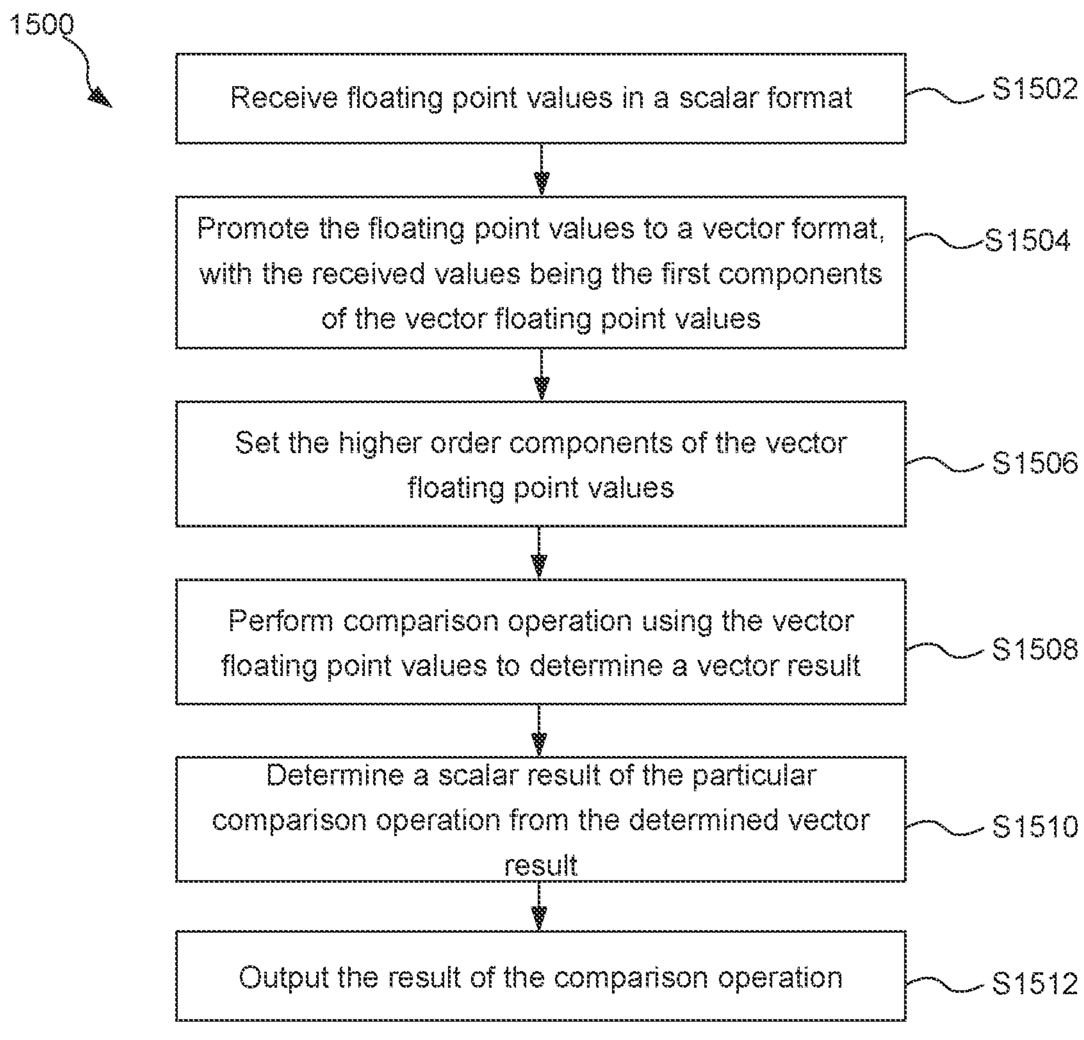
FIGURE 15

PERFORMING COMPARISON OPERATIONS USING VECTOR FLOATING POINT VALUES

FIELD

The present disclosure is directed to techniques of performing operations, such as comparison operations, using floating point values in a processing module, for purposes such as intersection testing in a ray tracing system.

BACKGROUND

Values can be represented in computer systems using many different formats, such as integer, fixed point and floating point formats. Floating point formats allow a huge range of values to be represented with relatively few bits (compared to integer and fixed point formats). Furthermore, numerical results often only need to be given up to some degree of relative precision, so some errors (e.g. rounding errors) may be acceptable. For example, multiplication of floating point values produces additive relative error. For these reasons, floating point formats are often used in computer systems which may operate on very small and very large values. A floating point value is represented with: (i) a sign bit, (ii) a plurality of bits, e, to indicate an exponent, and (iii) a plurality of bits, s, to indicate a significand. As an example, the IEEE 754 standard specifies a single-precision binary floating point format in which a value can be represented with 32 bits, made up of 1 sign bit, 8 exponent bits and 23 significand bits. The sign bit indicates the sign of the value (either positive or negative). The exponent is an 8-bit unsigned integer from 0 to 255, and an exponent bias of 127 is used, such that the exponent can, theoretically, lie in the range −127 to +128, although as explained below, exponents of 0 and 255 are usually reserved for subnormal values and infinities/NaNs respectively, so the exponent range is usually −126 to +127. The significand indicates 23 fractional bits to the right of a binary point and an implicit leading bit with a value 1 (unless the exponent is stored with all zeros). The represented value is $(-1)^{sign}\times 2^{exponent\text{-}bias}\times 1\cdot\text{significand}$. Some special values can be useful to represent, e.g. zero and infinity. So, if the exponent and the significand bits are all zeros, then this represents a value of zero, i.e. the implicit leading 1 of the significand is not applied. The sign bit can still be used with zero, such that +0 and −0 can be separately represented in a floating point format (which can, for example, be used to preserve the sign of an exact result of a floating point operation, prior to rounding to zero). If the exponent bits are all ones and the significand bits are all zero, then this represents a value of infinity. Again, the sign bit can still be used with infinity, such that +∞ and −∞ can be separately represented in a floating point format. If the exponent bits are all ones and the significand bits are not all zero, then this indicates an undefined or unrepresentable number, which is referred to as Not a Number (NaN). Different numbers of exponent and significand bits can be used to alter the range and precision with which the floating point format can represent numbers. For example, the IEEE 754 standard specifies a double-precision binary floating point format in which a value can be represented with 64 bits, made up of 1 sign bit, 11 exponent bits and 52 significand bits. Other floating point formats also exist, e.g. half precision, quadruple precision, etc. There is a limit to the precision with which floating point values can be defined, and this limit depends upon the number of bits used to represent the floating point values. As such, floating point values are not infinitely precise. Furthermore, a floating point format has a minimum non-zero representable magnitude and a maximum finite representable magnitude.

Some comparison operations can be used to partition an n-dimensional space into two portions using an (n−1) dimensional hyperplane. For example, the comparison operation may classify results into one of two possible options, e.g. true or false, left or right, hit or miss, etc. The binary result of a comparison operation such as this can be used to determine how the system proceeds. Sometimes, a result of a comparison operation may be extremely close to the division between the two possible outputs, e.g. there may be no limit to how close to the (n−1) dimensional hyperplane a value is (it may even intersect the plane itself), and yet the comparison operation may need to classify the value into one of the two possible options.

An example use of a comparison operation is in intersection testing performed by a ray tracing system. Ray tracing is a computational rendering technique for generating an image of a scene (e.g. a 3D scene) by tracing paths of light ('rays') usually from the viewpoint of a camera through the scene. A ray may be modelled as originating from the camera and passing through a pixel into the scene. As a ray traverses the scene it may intersect objects within the scene. The interaction between a ray and an object it intersects can be modelled to create realistic visual effects. For example, in response to determining an intersection of a ray with an object, a shader program (i.e. a portion of computer code) may be executed in respect of the intersection. A programmer can write the shader program to define how the system reacts to the intersection which may, for example cause one or more secondary rays to be emitted into the scene, e.g. to represent a reflection of the ray off the intersected object or a refraction of the ray through the object (e.g. if the object is transparent or translucent). As another example, the shader program could cause one or more rays to be emitted into the scene for the purposes of determining whether the object is in shadow at the intersection point. The result of executing the shader program (and processing the relevant secondary rays) can be the calculation of a colour value for the pixel the ray passed through.

Rendering an image of a scene using ray tracing may involve performing many intersection tests, e.g. billions of intersection tests for rendering an image of a scene. In order to reduce the number of intersection tests that need to be performed, ray tracing systems can generate acceleration structures, wherein each node of an acceleration structure represents a region within the scene. Acceleration structures are often hierarchical (e.g. having a tree structure) such that they include multiple levels of nodes, wherein nodes near the top of the acceleration structure represent relatively large regions in the scene (e.g. the root node may represent the whole scene), and nodes near the bottom of the acceleration structure represent relatively small regions in the scene. A "tree node" refers to a node which has pointers to other nodes in the hierarchical acceleration structure, i.e. a tree node has child nodes in the hierarchical acceleration structure. A "leaf node" refers to a node which has one or more pointers to one or more primitives, i.e. a leaf node does not have child nodes in the hierarchical acceleration structure. In other words, leaf nodes of the acceleration structure represent regions bounding one or more primitives in the scene. The acceleration structure can have different structures in different examples, e.g. a grid structure, an octree structure, a space partitioning structure (e.g. a k-d tree) or a bounding volume hierarchy. The nodes can represent suitable shapes or regions in the scene (which may be referred to herein as "boxes"). In some examples the nodes represent axis-aligned bounding boxes (AABBs) in the scene.

Intersection testing can be performed for a ray (e.g. in a recursive manner) using the acceleration structure by first testing the ray for intersection with the root node of the acceleration structure. If the ray is found to intersect a parent node (e.g. the root node), testing can then proceed to the child nodes of that parent. In contrast, if the ray is found not to intersect a parent node, intersection testing of the child nodes of that parent node can be avoided, saving computational effort. If a ray is found to intersect a leaf node then it can be tested against the objects within the region represented by the leaf node to thereby determine which object(s) the ray intersects with. The objects may be represented as convex polygons. Often the convex polygons are triangles, but they may be other shapes, e.g. squares, rectangles, pentagons, hexagons, etc. If more than one intersection is found for a ray then the closest of the intersection points to the ray's origin (i.e. the first intersection that the ray encounters in the scene) may be identified and the ray may be determined to intersect at this identified closest intersection. It is possible that there may be multiple closest hits for a ray, and in this case some tie-break logic may be used to select one of the multiple closest hits to use as the identified closest intersection. For some types of rays, the closest intersection might not need to be identified. For example, when processing shadow rays, an indication that there is at least one intersection is sufficient, without determining which of the intersections is the closest, and some APIs may allow the traversal of an acceleration structure for shadow rays to be terminated in response to finding any intersection, to thereby reduce the number of intersection tests that need to be performed.

The intersection testing process performed by a ray tracing system can involve performing comparison operations to determine whether a ray intersects a box or to determine whether a ray intersects a primitive, which may be represented as a convex polygon (e.g. a triangle). The results of the comparison operations for intersection testing can be used to indicate either a "hit" or a "miss". As suggested above, there is no limit to how close to the boundary between a "hit" or a "miss" the result of an intersection test may be, and it is possible for a ray to exactly intersect an edge of a polygon or a box. However, the result of the intersection test should still be either "hit" or "miss". Determining whether the result of an intersection test should be a "hit" or a "miss" in some situations can be problematic.

For example, problems can occur if it is determined that the ray intersects a point on an edge that is shared between two polygons. Often objects are represented with multiple polygons, e.g. with meshes of polygons, wherein at least one of the vertices is a shared vertex which is used to define two or more of the convex polygons, such that polygons can have shared edges. If a ray intersects a point on a shared edge, then it is desirable for the ray to be found to intersect one (and only one) of the polygons. If the intersection tests ensure that a ray that intersects a point on a shared edge is found to intersect at least one of the polygons then the intersection tests may be described as being "watertight". If the intersection tests ensure that a ray that intersects a point on a shared edge is found to intersect a single one (i.e. one and only one) of the polygons then the intersection tests may be described as being "non-redundantly watertight". If a ray which intersected a point on a shared edge was found to intersect zero polygons then it may appear as though the polygon mesh has a hole in it, such that a colour behind the polygon mesh can be seen through the mesh in the rendered image (this can occur for non-watertight intersection tests, but not for watertight intersection tests). These sorts of rendering errors can be very noticeable, e.g. if the colour behind the polygon mesh is significantly different to the colour of the polygon mesh. Furthermore, if a ray which intersected a point on a shared edge was found to intersect more than one polygon then the colour that is rendered at positions on that shared edge may depend upon the order in which the polygons are tested for intersection, such that the rendering may become non-deterministic, or it may result in redundant shader execution with an attendant performance penalty and/or rendering artefacts if the shader relies on assumptions of non-redundant intersection (with respect to a given object). The testing of a ray for intersection with a first polygon is normally performed independently of the testing of the ray for intersection with a second polygon, and it is noted that ensuring watertightness, and specifically non-redundant watertightness, for the intersection tests is not trivial.

Since intersection tests of rays against convex polygons (e.g. triangles), are performed many times in a ray tracing system, it can be beneficial to implement the functionality for performing these intersection tests in dedicated hardware modules, e.g. using fixed function circuitry, rather than implementing these intersection tests using software modules executed on general purpose processing units. Software implementations generally provide more flexibility because software is more easily altered after it is designed and/or created than hardware implementations are. However, hardware implementations generally provide more efficient implementations in terms of latency and power consumption, so if the desired functionality is known in advance, hardware implementations may be preferred over software implementations. When designing a hardware implementation of an intersection testing module which is configured for performing intersection testing there are generally competing aims of having: (i) a smaller size (i.e. smaller silicon area), (ii) a lower latency, and (iii) lower power consumption.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

There is provided a method of performing, in a processing module, a particular comparison operation using floating point values, the method comprising:

receiving the floating point values in a scalar format;

promoting the received floating point values to a vector format, wherein the received floating point values are used as a first component of the vector floating point values;

setting a second component of one or more of the vector floating point values to a non-zero, finite value;

performing the particular comparison operation using the vector floating point values to determine a vector result having first and second components;

determining a scalar result of the particular comparison operation, wherein the magnitude of the scalar result is given by the magnitude of the first component of the vector result, and wherein if the first component of the vector result is non-zero then the sign of the scalar result equals the sign of the first component of the vector result, and wherein if the first component of the vector result is zero and if the second component of the vector result is non-zero then the sign of the scalar result equals the sign of the second component of the vector result; and outputting the scalar result of the particular comparison operation.

The vector format may be a polynomial format. A polynomial representation may be used to perform the particular comparison operation using the vector floating point values.

Each vector floating point value may have three components, wherein for a first set of the floating point values the second component may be set to a non-zero, finite value, and wherein for a second set of the floating point values the third component may be set to a non-zero, finite value.

If the first and second components of the vector result are zero and if the third component of the vector result is non-zero then the sign of the scalar result may equal the sign of the third component of the vector result.

For each of the vector floating point values, either the second component or the third component may be set to a non-zero, finite value.

Said non-zero, finite value may be 1.

Each vector floating point value may have only two components, wherein for a first set of the floating point values the second component may be set to a first non-zero, finite value 1, and wherein for a second set of the floating point values the second component may be set to a second non-zero, finite value e2/e1, wherein e1>>e2.

Said setting a second component of one or more of the vector floating point values to a non-zero, finite value may comprise: if a received floating point value is zero, setting the second component of the corresponding vector floating point value to a non-zero, finite value.

Said setting a second component of one or more of the vector floating point values to a non-zero, finite value may comprise: if a received floating point value is infinity, setting the second component of the corresponding vector floating point value to a non-zero, finite value.

Each vector floating point value may have only two components, wherein said setting a second component of one or more of the vector floating point values to a non-zero, finite value may comprise setting a second component of all of the vector floating point values to non-zero, finite floating point values.

The processing module may be implemented as part of a ray tracing system, wherein the particular comparison operation may be part of an intersection testing process performed by the ray tracing system, and wherein the outputted result of the particular comparison operation may be used in the ray tracing system for rendering an image.

The particular comparison operation may comprise comparing the result of multiplying two floating point values with the result of multiplying two other floating point values.

The processing module may be implemented as part of a ray tracing system, and wherein the particular comparison operation may be part of an intersection testing process to determine whether a ray intersects a convex polygon defined by an ordered set of vertices, wherein the method may further comprise:

projecting the vertices of the convex polygon onto a pair of axes orthogonal to the ray direction, wherein the origin of the pair of axes corresponds with the ray origin;

for each edge of the convex polygon defined by two of the projected vertices, using the particular comparison operation to determine a sign of a signed parameter by performing a 2D cross product of the positions of the two projected vertices defining the edge; and determining whether the ray intersects the convex polygon based on the signs of the signed parameters determined for the edges of the convex polygon.

Said determining whether the ray intersects the convex polygon may comprise:

determining that the ray intersects the convex polygon if the signed parameters determined for the edges of the convex polygon all have the same sign; and determining that the ray does not intersect the convex polygon if it is not the case that the signed parameters determined for the edges of the convex polygon all have the same sign.

Said determining whether the ray intersects the convex polygon may comprise:

determining that the ray intersects the convex polygon if it is determined that the ray passes on the inside of all of the edges of the convex polygon; and determining that the ray does not intersect the convex polygon if it is determined that the ray passes on the outside of one or more of the edges of the convex polygon.

The 2D cross product, $f(v_i,v_j)$, of the positions of the two projected vertices, $v_i$ and $v_j$, defining an edge, may be defined as $f(v_i,v_j)=p_iq_j-q_ip_j$, where $p_i$ and $q_i$ are components of the projected vertex $v_i$ along the respective axes of the pair of axes, and where $p_j$ and $q_j$ are components of the projected vertex $v_j$ along the respective axes of the pair of axes, and wherein the comparison operation may comprise performing the 2D cross product and determining the sign of the result.

The method may further comprise, in response to determining that the result of the 2D cross product is zero, setting the sign of the signed parameter to match the sign of a predetermined one of the floating point values used in the 2D cross product.

The method may further comprise outputting an indication of a result of the determination of whether the ray intersects the convex polygon, wherein the outputted indication may be used in the ray tracing system for rendering an image of a 3D scene.

The processing module may be implemented as part of a ray tracing system, and wherein the particular comparison operation may be part of an intersection testing process to determine whether a ray intersects a box defining a volume within a scene.

The box may be an axis-aligned box defined by, for each axis of the coordinate system in which the scene is represented, two planes each having a respective constant component value along the axis, wherein the method may further comprise translating the coordinates of the box by subtracting the component values of a ray origin of the ray, wherein the particular comparison operation may comprise comparing, for each of a plurality of edges of the box, values of $b_uD_v$ and $b_vD_u$, wherein $b_u$ and $b_v$ are the component values that are constant for the respective two planes which intersect to define the edge of the box, and $D_u$ and $D_v$ are the components of a ray direction vector of the ray along the axes for which the two intersecting planes are defined, and wherein the method may further comprise determining whether the ray intersects the axis-aligned box based on results of the comparisons for the plurality of edges of the box.

The box may be an axis-aligned box defined by, for each axis of the coordinate system in which the scene is represented, two planes each having a respective constant component value along the axis, wherein the method may further comprise translating the coordinates of the box by subtracting the component values of a ray origin of the ray, wherein floating point values defining the components of a ray direction vector of the ray may be received as reciprocal values, wherein the particular comparison operation may comprise comparing, for each of a plurality of edges of the box, values of $$b_u\left(\frac{1}{D_u}\right) \text{ and } b_v\left(\frac{1}{D_v}\right),$$

wherein $b_u$ and $b_v$ are the component values that are constant for the respective two planes which intersect to define the edge of the box, and $$\frac{1}{D_u} \text{ and } \frac{1}{D_v}$$

are the reciprocals of the components of the ray direction vector of the ray along the axes for which the two intersecting planes are defined, and wherein the method may further comprise determining whether the ray intersects the axis-aligned box based on results of the comparisons for the plurality of edges of the box.

The two planes of the box for each axis may comprise a front-facing plane and a back-facing plane, and wherein said determining whether the ray intersects the convex polygon may comprise:

based on the results of the comparisons for the plurality of edges of the box:

identifying which of the front-facing planes of the box intersects the ray furthest along the ray;

identifying which of the back-facing planes of the box intersects the ray least far along the ray; and determining whether the ray intersects the identified back-facing plane before it intersects the identified front-facing plane;

wherein it may be determined that the ray does not intersect the axis-aligned box if it is determined that the ray intersects the identified back-facing plane before it intersects the identified front-facing plane; and wherein the ray may be determined to intersect the axis-aligned box based on determining that the ray does not intersect the identified back-facing plane before it intersects the identified front-facing plane.

The axis-aligned box may be an axis-aligned bounding box which bounds geometry to be rendered and which corresponds to a node of a hierarchical acceleration structure to be used for performing intersection testing in the ray tracing system, and wherein the method may comprise outputting an indication of a result of the determination of whether the ray intersects the axis-aligned box, wherein the outputted indication may be used in the ray tracing system for rendering an image of a 3D scene.

The method may be performed in fixed function circuitry of the processing module.

There is provided a processing module configured to perform a particular comparison operation using floating point values, the processing module being configured to:

receive the floating point values in a scalar format;

promote the received floating point values to a vector format, wherein the received floating point values are used as a first component of the vector floating point values;

set a second component of one or more of the vector floating point values to a non-zero, finite value;

perform the particular comparison operation using the vector floating point values to determine a vector result having first and second components;

determine a scalar result of the particular comparison operation, wherein the magnitude of the scalar result is given by the magnitude of the first component of the vector result, and wherein if the first component of the vector result is non-zero then the sign of the scalar result equals the sign of the first component of the vector result, and wherein if the first component of the vector result is zero and if the second component of the vector result is non-zero then the sign of the scalar result equals the sign of the second component of the vector result; and output the scalar result of the particular comparison operation.

The processing module may be an intersection testing module, implemented in a ray tracing system, wherein the particular comparison operation may be part of an intersection testing process performed by the ray tracing system, and wherein the outputted result of the particular comparison operation may be used in the ray tracing system for rendering an image of a 3D scene.

There may be provided a processing module configured to perform any of the methods described herein.

There may be provided computer readable code configured to cause any of the methods described herein to be performed when the code is run.

There may be provided a method of performing, in a processing module, a particular comparison operation using floating point values, the method comprising:

receiving the floating point values in one or more input formats, such that each floating point value is represented with: (i) a sign bit, (ii) a plurality of bits to indicate an exponent, and (iii) a plurality of bits to indicate a significand, extending the exponent range of the floating point values;

one or more of:

(a) replacing a floating point value of zero with a non-zero substitute floating point value whose magnitude is small enough to behave like zero in said particular comparison operation if all other values involved in the particular comparison operation are non-zero finite values that are representable in their input format, wherein said non-zero substitute floating point value has a magnitude that is too small to be representable using the one or more input formats but is representable using the extended exponent range;

(b) shifting one or more of the floating point values by a non-zero amount which is small enough to behave like zero in said particular comparison operation if all other values involved in the particular comparison operation are non-zero finite values that are representable in their input format, wherein said non-zero amount is too small to be representable using the one or more input formats but is representable using the extended exponent range; and (c) replacing a floating point value of infinity with a finite substitute floating point value whose magnitude is large enough to behave like infinity in said particular comparison operation if all other values involved in the particular comparison operation are non-zero finite values that are representable in their input format, wherein said finite substitute floating point value has a magnitude that is too large to be representable using the one or more input formats but is representable using the extended exponent range;

performing the particular comparison operation using one or more of: (i) the non-zero substitute floating point value, (ii) the one or more shifted floating point values, and (iii) the finite substitute floating point value; and outputting a result of the particular comparison operation.

There may be provided a processing module configured to perform a particular comparison operation using floating point values, the processing module being configured to:

receive the floating point values in one or more input formats, such that each floating point value is represented with: (i) a sign bit, (ii) a plurality of bits to indicate an exponent, and (iii) a plurality of bits to indicate a significand;

extend the exponent range of the floating point values;

one or more of:

(a) replace a floating point value of zero with a non-zero substitute floating point value whose magnitude is small enough to behave like zero in said particular comparison operation if all other values involved in the particular comparison operation are non-zero finite values that are representable in their input format, wherein said non-zero substitute floating point value has a magnitude that is too small to be representable using the one or more input formats but is representable using the extended exponent range;

(b) shift one or more of the floating point values by a non-zero amount which is small enough to behave like zero in said particular comparison operation if all other values involved in the particular comparison operation are non-zero finite values that are representable in their input format, wherein said non-zero amount is too small to be representable using the one or more input formats but is representable using the extended exponent range; and (c) replace a floating point value of infinity with a finite substitute floating point value whose magnitude is large enough to behave like infinity in said particular comparison operation if all other values involved in the particular comparison operation are non-zero finite values that are representable in their input format, wherein said finite substitute floating point value has a magnitude that is too large to be representable using the one or more input formats but is representable using the extended exponent range;

perform the particular comparison operation using one or more of: (i) the non-zero substitute floating point value, (ii) the one or more shifted floating point values, and (iii) the finite substitute floating point value; and output a result of the particular comparison operation.

There may be provided a method of performing, in a processing module, a particular comparison operation using floating point values, the method comprising:

receiving the floating point values in one or more input formats, such that each floating point value is represented with: (i) a sign bit, (ii) a plurality of bits to indicate an exponent, and (iii) a plurality of bits to indicate a significand, extending the exponent range of the floating point values;

replacing one or more of the floating point values with a respective one or more substitute floating point values, said replacing comprising one or both of:

(a) replacing a floating point value of zero with a non-zero substitute floating point value whose magnitude is small enough to behave like zero in said particular comparison operation if all other values involved in the particular comparison operation are non-zero finite values that are representable in their input format, wherein said non-zero substitute floating point value has a magnitude that is too small to be representable using the one or more input formats but is representable using the extended exponent range; and (b) replacing a floating point value of infinity with a finite substitute floating point value whose magnitude is large enough to behave like infinity in said particular comparison operation if all other values involved in the particular comparison operation are non-zero finite values that are representable in their input format, wherein said finite substitute floating point value has a magnitude that is too large to be representable using the one or more input formats but is representable using the extended exponent range;

performing the particular comparison operation using the one or more substitute floating point values; and outputting a result of the particular comparison operation.

There may be provided a method of performing, in a processing module, a particular comparison operation using floating point values, the method comprising:

receiving the floating point values in one or more input formats, such that each floating point value is represented with: (i) a sign bit, (ii) a plurality of bits to indicate an exponent, and (iii) a plurality of bits to indicate a significand, extending the exponent range of the floating point values;

replacing a floating point value of zero with a non-zero substitute floating point value whose magnitude is small enough to behave like zero in said particular comparison operation if all other values involved in the particular comparison operation are non-zero finite values that are representable in their input format, wherein said non-zero substitute floating point value has a magnitude that is too small to be representable using the one or more input formats but is representable using the extended exponent range; and performing the particular comparison operation using the non-zero substitute floating point value; and outputting a result of the particular comparison operation.

There may be provided a method of performing, in a processing module, a particular comparison operation using floating point values, the method comprising:

receiving the floating point values in one or more input formats, such that each floating point value is represented with: (i) a sign bit, (ii) a plurality of bits to indicate an exponent, and (iii) a plurality of bits to indicate a significand, extending the exponent range of the floating point values;

replacing a floating point value of infinity with a finite substitute floating point value whose magnitude is large enough to behave like infinity in said particular comparison operation if all other values involved in the particular comparison operation are non-zero finite values that are representable in their input format, wherein said finite substitute floating point value has a magnitude that is too large to be representable using the one or more input formats but is representable using the extended exponent range;

performing the particular comparison operation using the finite substitute floating point value; and outputting a result of the particular comparison operation.

There may be provided a method of performing, in a processing module, a particular comparison operation using floating point values, the method comprising:

receiving the floating point values in an input format, such that each floating point value is represented with: (i) a sign bit, (ii) a plurality of bits to indicate an exponent, and (iii) a plurality of bits to indicate a significand, extending the exponent range of the floating point values;

shifting one or more of the floating point values by a non-zero amount which is small enough to behave like zero in said particular comparison operation if all other values involved in the particular comparison operation are non-zero finite values that are representable in their input format, wherein said non-zero amount is too small to be representable using the one or more input formats but is representable using the extended exponent range; and performing the particular comparison operation using the one or more shifted floating point values; and outputting a result of the particular comparison operation.

The processing module (e.g. an intersection testing module of a ray tracing system) may be embodied in hardware on an integrated circuit. There may be provided a method of manufacturing, at an integrated circuit manufacturing system, a processing module. There may be provided an integrated circuit definition dataset that, when processed in an integrated circuit manufacturing system, configures the system to manufacture a processing module. There may be provided a non-transitory computer readable storage medium having stored thereon a computer readable description of a processing module that, when processed in an integrated circuit manufacturing system, causes the integrated circuit manufacturing system to manufacture an integrated circuit embodying a processing module.

There may be provided an integrated circuit manufacturing system comprising: a non-transitory computer readable storage medium having stored thereon a computer readable description of the processing module; a layout processing system configured to process the computer readable description so as to generate a circuit layout description of an integrated circuit embodying the processing module; and an integrated circuit generation system configured to manufacture the processing module according to the circuit layout description.

There may be provided computer program code for performing any of the methods described herein. There may be provided non-transitory computer readable storage medium having stored thereon computer readable instructions that, when executed at a computer system, cause the computer system to perform any of the methods described herein.

The above features may be combined as appropriate, as would be apparent to a skilled person, and may be combined with any of the aspects of the examples described herein.

The following additional features may also be combined in an appropriate fashion with any of the above features, as would be apparent to the skilled person.

The particular comparison operation may comprise multiplying a first vector floating point value and a second vector floating point value. When a first vector floating point value and a second vector floating point value are multiplied together, only terms involving the multiplication of two components, at least one of which is a first component of either the first or second vector floating point value, may be included in the vector result.

Each component of the vector floating point value may represent a respective polynomial term of the vector floating point value in the polynomial format.

A first vector floating point value having n components representing n polynomial terms may be multiplied by a second vector floating point value having n components representing n polynomial terms, wherein the vector result may comprise n components representing n polynomial terms, wherein each component of the vector result is of the same polynomial degree as each respective component in each of the vector floating points values.

Each vector floating point value may have n components, the n components representing a summation of n polynomial terms, wherein each polynomial term other than the first term (for example, each polynomial term other than the received floating point value) may be associated with a respective coefficient.

Each respective coefficient may be a finite epsilon value, or a combination of finite epsilon values.

Multiplication of two vector floating point values may represent an expansion of the summed n polynomial terms, wherein the vector result of the multiplication may comprise n components, wherein the first component comprises terms not associated with a coefficient, and wherein each remaining component contains all terms associated with each said respective component, wherein terms associated with the product of two or more coefficients are disregarded.

BRIEF DESCRIPTION OF THE DRAWINGS

Examples will now be described in detail with reference to the accompanying drawings in which:

FIG. 10 shows a ray intersecting a polygon from the viewpoint of the origin of the ray;

FIG. 11 shows a ray intersecting a point on an edge that is shared between two polygons from the viewpoint of the origin of the ray, with indications of winding orders of the two polygons;

FIG. 12 shows a ray intersecting a vertex that is shared between five polygons from the viewpoint of the origin of the ray, with indications of winding orders of the five polygons;

FIG. 13 illustrates a perturbation ε which can be applied to positions of vertices;

FIG. 14*a* shows scalar floating point input values;

FIG. 14*b* shows vector floating point values;

FIG. 15 is a flow chart for a method of performing a comparison operation on floating point values using a vector format;

Figure 1:
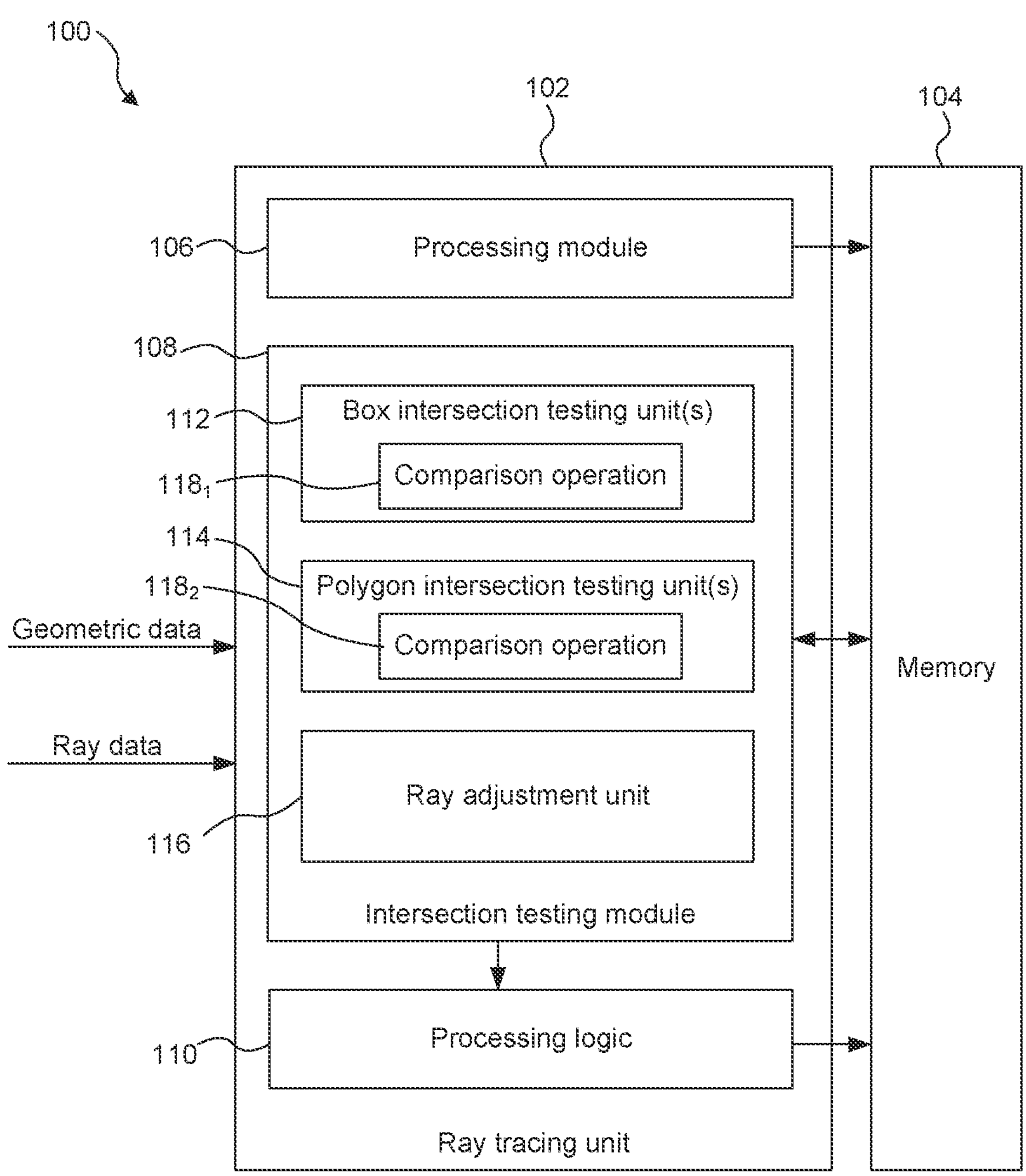
FIG. 1 shows a ray tracing system according to examples described herein.

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art.

Embodiments will now be described by way of example only. As described above, floating point values can represent zero and infinity as special cases. This is useful because values of zero and infinity are often needed in calculations performed by processing modules in computing systems. However, these special cases often need to be handled as exceptions in logic that is configured to process the floating point values. When the logic is implemented in hardware in fixed-function circuitry (i.e. rather than in software) then extra dedicated hardware logic will be needed to handle the exception cases, and extra selection logic (e.g. including multiplexers) will be needed to select and output a correct output. Therefore, the exception handling logic increases the size (i.e. the silicon area) and complexity of a processing module that includes the exception handling logic in hardware. In some examples described herein, floating point values of zero can be replaced with very small, but non-zero, substitute floating point values, and in some other examples, floating point values of infinity can be replaced with very large, but finite, substitute floating point values. In this way, the need for exception handling logic can be avoided, such that the size and complexity of the processing module can be reduced. An explanation of how small the "very small" non-zero substitute floating point values are, and of how large the "very large" finite substitute floating point values are, is provided below.

Hardware which is configured to perform calculations such as multiplication, addition and subtraction on floating point values is useful in many situations. For example, a hardware module for performing dot products can perform multiplication and addition of two or more input values. Generally, the input values may have any value that is representable in the input format and may be positive or negative. To perform a multiplication of two normal input floating point values, the significands of the two input values can be multiplied together and the exponents of the two input values can be summed, with an additional increment if the significand product exceeds the maximum and is therefore normalised. However, this approach does not work if one of the input values is a denormal value (e.g. zero), infinity or NaN, so these cases need to be handled as exceptions. The result of a multiplication may have too many bits to be represented perfectly accurately in the input format (e.g. the multiplication of the significands may double the number of significand bits), so some rounding may be performed to provide the result. Different types of hardware can perform the rounding in different ways, e.g. truncated multipliers apply some amount of truncation to the partial products of the significands prior to summation, often with a correction term to reduce error, before truncation of any remaining excess bits. Accurate multipliers evaluate the exact product and determine a rounded representable result based on this product and possibly also the sign and exponent, according to a given rounding mode (e.g. "round to zero" select the representable value with corresponding sign and maximum magnitude less than or equal to the exact result). As another example, where one or more multiplications and then a subtraction are to be performed in the same hardware module (e.g. for calculating a (fused) multiply-add or a dot product) then the full expanded result of the multiplication may be used for the subtraction and then the result of the subtraction can be rounded (i.e. singly rounded). A subtraction of two floating point values may involve calculating the difference of the exponents of the two floating point values, shifting the significand of the smaller input to align it with the scale of the larger input and then performing the subtraction. If the result of the subtraction is exactly zero then the result needs to be handled differently because zero is not represented in a consistent manner to other "normal" floating point numbers. So the hardware has the ability to flag up when the result of the subtraction is zero. When the result is zero, the significand and exponent bits are all set to 0, and the sign bit may be set either as 0 (to represent +0) or as 1 (to represent −0).

In the examples given above (and in others), the exponent of the rounded result may lie outside of the (normal) representable range, which must also be handled as a special case. If the exponent exceeds the maximum, it is said to overflow, and may be replaced with a specific value according to the rounding mode (perhaps infinity or the representable value with the maximum finite magnitude and appropriate sign).

If, on the other hand, the exponent falls short of the (nonzero) minimum, it is said to underflow, and may either be represented by a denormal number (i.e. without a leading 1 in the significand) or may otherwise be replaced with a specific value according to the rounding mode (perhaps 0, with or without the sign of the exact result or the non-denormal representable value with the minimum finite magnitude and appropriate sign). Note that it is possible to eliminate these exceptions by ensuring that the output floating point format of a given operation has sufficiently many exponent bits to represent the rounded result within its normal range, in accordance with whatever bounds exist on the range of input values.

Furthermore, the presence of floating point values of zero and/or infinity, can lead to undefined results. For example, the results of zero divided by zero, or zero multiplied by infinity, or infinity divided by infinity are undefined. So, as well as avoiding the extra logic that would be required to handle the zero and/or infinity exceptions, replacing the floating point values of zero with non-zero substitute floating point values and/or replacing the floating point values of infinity with finite substitute floating point values can avoid some undefined results.

Furthermore, we can exploit the limitations on the range of floating point values that can be represented in order to avoid situations in which a comparison operation exactly hits a boundary between determining which of two possible binary outcomes are found. If all of the input floating point values are received according to an input format, then there is a minimum representable, non-zero magnitude ($f_L$) and a maximum representable, finite magnitude ($f_U$) of the input values. The values can be shifted by a very small, but non-zero amount, such that it is not possible for the result of the comparison operation to exactly hit a boundary between determining which of the two possible outcomes are found. If the way in which the input values are going to be processed by a particular comparison operation is known then an upper limit on the magnitude of the small amount by which the floating point values are shifted, can be determined, such that the "small amount" would behave like zero in the particular comparison operation if all other values involved in the particular comparison operation were non-zero, finite values that are representable in the input format. Here, "behave like zero" implies that the result of any such comparison operation will generate identical results, whether or not the shift by a small amount is applied.

Similarly, where floating point values of zero are replaced by non-zero substitute floating point values, if the way in which the input values are going to be processed by a particular comparison operation is known then an upper limit on the magnitude of a non-zero substitute floating point value which can be used to replace floating point values of zero, can be determined, such that the non-zero substitute floating point value would behave like zero in the particular comparison operation if all other values involved in the particular comparison operation were non-zero, finite values that are representable in the input format. Here, "behave like zero" implies that the result of an such comparison operation will generate identical results, whether or not the zero substitution is applied. Similarly, where floating point values of infinity are replaced by finite substitute floating point values, if the way in which the input values are going to be processed by a particular comparison operation is known then a lower limit on the magnitude of a finite substitute floating point value which can be used to replace floating point values of infinity, can be determined, such that the finite substitute floating point value would behave like infinity in the particular comparison operation if all other values involved in the particular comparison operation were non-zero, finite values that are representable in the input format. Here, "behave like infinity" implies that the result of an such comparison operation will generate identical results, whether or not the infinity substitution is applied. Note that in all these examples, consistent results (e.g. with or without substitution) are not expected if one ore more of the remaining values is zero or infinite and indeed this is evident when considering zero divided by zero, or zero multiplied by infinity (as described above), which will produce defined results after e.g. substitution, Furthermore, as explained in more detail below with references to FIGS. 11 to 13, the shifting or replacing of values using the small non-zero floating point values (ε) described herein can be used for performing intersection testing of rays with convex polygons, to enable an elegant and efficient architecture for ensuring that the intersection tests are "watertight". In an accurate implementation, intersection tests are considered "watertight" if a ray that intersects a shared edge or vertex, i.e. with equal world/instance space coordinates, of two or more polygons, within the interior of the object's silhouette from the perspective of the ray, it is determined to intersect at least one of the polygons sharing the edge or vertex. An accurate implementation ensures that appropriate intersection results are obtained outside of shared edges and vertices; we do not consider inaccurate implementations here. Furthermore, the shifting or replacing of values using the small non-zero floating point values (ε) described herein can be used to ensure that the (accurate) intersection tests are "non-redundantly watertight". Intersection tests are "non-redundantly watertight" if a ray that intersects a shared edge or vertex of two or more polygons is determined to intersect a single one of the polygons sharing the edge or vertex.

In the disclosure provided herein, a "comparison operation" may comprise: (i) a comparison of two values, e.g. a determination of whether A<B, (ii) a determination of the sign of a 2D cross product, e.g. a component of a 3D cross product, e.g. of the form ab−cd, (iii) a determination of the sign of a tangent calculation, e.g. of the form $$a\left(\frac{1}{b}\right)-c\left(\frac{1}{d}\right),$$

(iv) a calculation of a determinant, e.g. a triple product, (v) a determination of the sign of a subtraction of the form A−B, or (vi) sums or other linear combinations of comparisons, cross products, tangent calculations and/or determinant calculations. For example, a determination of whether A<B yields a Boolean result (i.e. either 0 or 1), and this Boolean result can be converted into a sign indication, sgn(A−B) (i.e. either −1 or +1) for use in a sum or linear combination, e.g. such that $(-1)^{(A<B)}=\text{sgn}(A-B)$. Sign indications and Booleans can be freely interchanged such that a Boolean value of 0 corresponds to a sign indication of +1, and a Boolean value of 1 corresponds to a sign indication of −1. In other implementations, the opposite correspondence could be used such that a Boolean value of 0 corresponds to a sign indication of −1, and a Boolean value of 1 corresponds to a sign indication of +1. The "comparison operations" described herein may also be referred to as "alternating multilinear operations". The comparison operations are antisymmetric under exchange of operands. For example, swapping inputs (a,b) and (c,d) will reverse the sign in examples (ii) and (iii) given above.

In the description provided herein, a "comparison operator" or "comparison operation" is a function of two or more scalar or vector inputs outputting a single boolean or signed value, where the boolean or sign of the value represents a dichotomy e.g., hit/miss, in/out, left/right etc. The comparison operations described herein are "antisymmetric" (which may be described as "anticommutative"), which means that transposing two of the inputs negates the boolean or sign of the value, giving the opposite result. Sums or linear combinations of such functions (where applicable) are also functions of this kind. Where a function is linear (or affine), an antisymmetric function can be described as "alternating", i.e. it has a linear (or affine) dependence on the inputs.

The definition of"antisymmetric" implies that a general permutation of the inputs negates the result if and only if it is an odd permutation (i.e., one comprising an odd number of transpositions). Such "comparison operators" (non-exhaustively) include: comparison, subtraction, 2D cross product, component of 3D cross product, "tangent calculation", triple product, general determinant.

The primary use of "comparison operators" described herein is for intersection testing in a ray tracing system, which generally comprises of a sequence of in/out, left/right determinations to establish a hit/miss result between a ray and an object. However, in other examples, comparison operations can be used for other purposes.

Comparison operations can cause some issues that are addressed in the examples described herein. In particular a) Sometimes comparison operations can have ill-defined intermediate values, e.g. caused by dividing zero by zero or by multiplying zero with infinity, which may not be defined consistently.

b) The architecture for floating point scalars or vectors may require special case handling for input/intermediate values of zero and/or infinity.

c) Comparison operations return a binary result (e.g., for non-redundant watertightness, as described herein), but they actually generate a ternary result:

| Boolean result | Signed value |
|---|---|
| < | − |
| = | 0 = (±0) This is the "middle set" |
| > | + |

where outputs in the "middle set" are problematic as inputs mapped to them have no restriction placed on them by the "antisymmetric" requirement. In general, we can switch between the Boolean and signed value forms by "A<B"<->"A+(−B)", where A and −B are the positive and negative terms, respectively.

The techniques described herein address the issues denoted a), b) and c) above by:

A) Avoiding zero (and/or infinite) inputs to deal with a);

B) Avoiding zero (and/or infinite) inputs to deal with b);

Ci) Reassigning the "middle set" to one of the binary results (on a case-by-case basis) to deal with c); and/or Cii) Avoiding the middle set entirely to deal with c).

For example, the comparison operation may comprise comparing the result of multiplying a first floating point value a and a second floating point value b with the result of multiplying a third floating point value c and a fourth floating point value d, i.e. the comparison may be a determination of whether ab<cd or whether ab−cd<0, where a, b, c and d are floating point values. If one of the floating point values is zero, then it can be replaced with a non-zero substitute floating point value of $\varepsilon_1$ and still behave like zero in this particular comparison operation if $$|\varepsilon_1| < \left|\frac{c_{min} d_{min}}{b_{max}}\right|$$

wherein $c_{min}$ is the minimum non-zero magnitude that the third floating point value c can have, $d_{min}$ is the minimum non-zero magnitude that the fourth floating point value d can have, and $b_{max}$ is the maximum finite magnitude that the second floating point value b can have. For example, all four of the floating point values a, b, c and d may have the same in format, and they may be able to take any representable value in the input format, and in these examples, $$|\varepsilon_1| < \left|\frac{f_L^2}{f_U}\right|.$$

In this example, the value of $\varepsilon_1$ is necessarily outside of the range of representable values in the input format. In particular, the magnitude of $\varepsilon_1$ is less than the minimum representable, non-zero magnitude ($f_L$) in the input format. Similarly, if one of the floating point values is infinity, then it can be replaced with a finite substitute floating point value of $\varepsilon_{1,\infty}$ and still behave like infinity in this particular comparison operation if $$|\varepsilon_{1,\infty}| > \left|\frac{c_{max} d_{max}}{b_{min}}\right|$$

wherein $c_{max}$ is the maximum finite magnitude that the third floating point value c can have, $d_{max}$ is the maximum finite magnitude that the fourth floating point value d can have, and $b_{min}$ is the minimum non-zero magnitude that the second floating point value b can have. For example, all four of the floating point values a, b, c and d may have the same input format, and they may be able to take any representable value in the input format, and in these examples, $$|\varepsilon_{1,\infty}| > \left|\frac{f_U^2}{f_L}\right|.$$

In this example, the value of $\varepsilon_{1,\infty}$ is necessarily outside of the range of representable values in the input format. In particular, the magnitude of $\varepsilon_{1,\infty}$ is greaterthan the maximum representable, finite magnitude ($f_U$) in the input format. However, the values of $\varepsilon_1$ and $\varepsilon_{1,\infty}$ can be represented by extending the exponent range, i.e. by increasing the number of bits that are used to indicate the exponents of the floating point values. It is noted that in some examples, $$f_U = \frac{1}{f_L},$$

so in some examples, $$|\varepsilon_1| < |f_L^3| \text{ and } |\varepsilon_{1,\infty}| > |f_U^3|.$$

Embodiments are described below in which a comparison operation is performed in fixed-function circuitry of a processing module which is implemented as part of a ray tracing system, wherein the comparison operation is part of an intersection testing process performed by the ray tracing system. However, it is to be understood that the same principles of the implementation of the comparison operation can be used in other processing systems, e.g. in other data processing systems such as graphics processing systems, signal processing systems, audio processing systems, etc.

FIG. 1 shows a ray tracing system 100 comprising a ray tracing unit 102 and a memory 104. The ray tracing unit 102 comprises a processing module 106, an intersection testing module 108 and processing logic 110. The intersection testing module 108 comprises one or more box intersection testing units 112, one or more polygon intersection testing units 114 and a ray adjustment unit 116. In operation the ray tracing unit 102 receives geometric data defining objects within the 3D scene. The ray tracing unit 102 also receives ray data defining rays that are to be tested for intersection. The rays may be primary rays or secondary rays. The processing module 106 is configured to generate an acceleration structure based on the geometric data, and to send the acceleration structure to the memory 104 for storage therein. After the acceleration structure has been stored in the memory 104, the intersection testing module 108 can retrieve nodes (e.g. comprising data defining axis-aligned boxes corresponding to the nodes) of the acceleration structure from the memory 104 to perform intersection testing of rays against the retrieved nodes. To avoid reading in the whole acceleration structure at a time, the intersection testing module 108 retrieves a subset of the boxes from one level of the acceleration structure from memory 104 at each stage, based on the results of previous intersection tests. The box intersection testing unit(s) 112 perform intersection tests to determine whether or not a ray intersects each of the bounding boxes corresponding to nodes of the acceleration structure (where a miss can cull vast swathes of the hierarchical acceleration structure). If a leaf node bounding one or more primitives is intersected then the intersecting testing module 108 can retrieve the one or more polygons from memory for the polygon intersection testing unit(s) 114 to perform one or more polygon intersection tests to determine which object(s) (if any) the ray intersects. In this example, the convex polygons are triangles, although it is noted that in other examples, the convex polygons could be other shapes such as squares, rectangles, pentagons, hexagons, etc. The results of the intersection tests indicate which object in the scene a ray intersects, and the results may also indicate a position on the object at which the ray intersects the object, and may also indicate a distance along the ray that the intersection occurs. The results of the intersection testing are provided to the processing logic 110. The processing logic 110 is configured to process the results of the intersection testing to determine rendered values representing the image of the 3D scene. The rendered values determined by the processing logic 110 can be passed back to the memory 104 for storage therein to represent the image of the 3D scene.

The box intersection testing unit(s) 112 includes comparison operation logic $\mathbf{118}_1$, and the polygon intersection testing unit(s) 114 includes comparison operation logic $\mathbf{118}_2$. References are made herein to "comparison operation logic 118", and this is to be understood to be referring to either comparison operation logic $\mathbf{118}_1$, or comparison operation logic $\mathbf{118}_2$, or both. The two blocks of comparison operation logic $\mathbf{118}_1$ and $\mathbf{118}_2$ are implemented in fixed-function circuitry and configured to perform a respective particular comparison operation using floating point values in accordance with examples described herein. The comparison operation performed by the comparison operation logic $\mathbf{118}_1$ may be different to the comparison operation performed by the comparison operation logic $\mathbf{118}_2$.

Figure 2A:
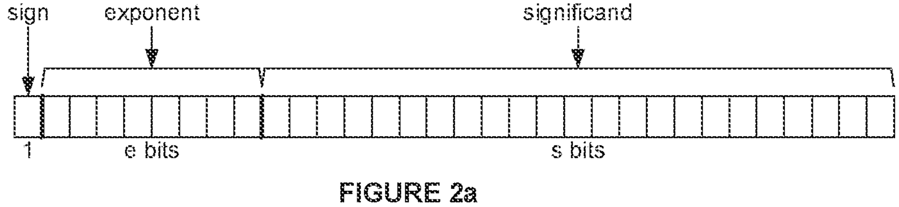
FIG. 2*a* illustrates bits of a floating point value in an input format.

FIG. 2*a* illustrates bits of a floating point value in an input format. A floating point value is represented with: (i) a sign bit, (ii) a plurality of bits, e, to indicate an exponent, and (iii) a plurality of bits, s, to indicate a significand. In particular, in the example shown in FIG. 2*a* the input format is the single-precision binary floating point format specified by the IEEE 754 standard, in which a floating point value is represented with 32 bits, made up of 1 sign bit, 8 exponent bits and 23 significand bits. The sign bit indicates the sign of the value (either positive or negative, indicated with a 0 or a 1 respectively). The exponent is an 8-bit unsigned integer from 0 to 255, and an exponent bias of 127 is used. If the exponent bits are all zeros then: (i) this represents a value of plus or minus zero if all the significand bits are zero, and (ii) this represents a denormal value (or"subnormal" value) if not all of the significand bits are zero. If the exponent bits are all ones then: (i) this represents a value of plus or minus infinity if all the significand bits are zero, and (ii) this represents a NaN (Not a Number) if not all of the significand bits are zero. Therefore, for "normal" values, i.e. values that are not zero, denormal, infinity or NaN, the exponent can lie in the range −126 to +127. The significand indicates 23 fractional bits to the right of a binary point and an implicit leading bit with a value 1 (unless the exponent is stored with all zeros, i.e. unless the value is either zero or a denormal value). The represented value is $(-1)^{sign}\times 2^{exponent-bias}\times 1\cdot$significand. In the description provided herein, unless a sign is specified, any mention of zero or infinity for a floating-point value may refer to plus or minus zero or infinity respectively.

Figure 2B:
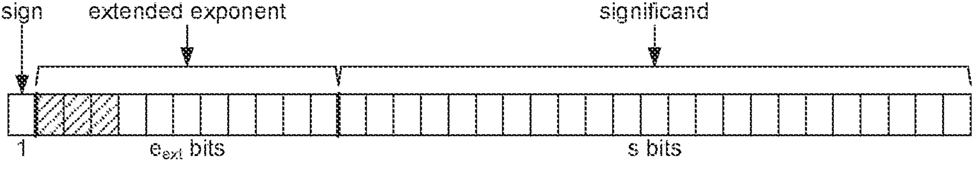
FIG. 2*b* illustrates bits of a floating point value using an extended exponent range.

In examples described herein, the fixed function circuitry of the comparison operation logic 118 is configured to use an extended exponent range. This allows values to be represented that are unrepresentable using the input format. FIG. 2*b* illustrates bits of a floating point value using an extended exponent range. In particular, the exponent range of the floating point value shown in FIG. 2*a* has been extended as shown in FIG. 2*b* by increasing the number of exponent bits from 8 to 11. In general, the number of exponent bits used to indicate the exponents of the floating point values with the extended exponent range is $e_{ext}$, where $e_{ext}>e$. In the example shown in FIGS. 2*a* and 2*b*, the exponent range has been extended by adding three exponent bits, but in other examples, a different number of exponent bits may be added to extend the exponent range (e.g. 1 bit, 2 bits, 4 bits, etc.) The number of exponent bits that are added depends upon the amount by which the exponent range needs to be extended. The extended exponent range reduces the occurrences of underflow and overflow. The exponent range can also be slightly extended further by removing the need to reserve special exponent values for one or more of zeros, denormals, infinities and NaNs. It is noted that the number of significand bits, s, is not altered in this example, e.g. s=23 in both FIG. 2*a* and FIG. 2*b*, but in other examples, the significand may be extended if that is considered to be beneficial to the general accuracy of the calculation. It is noted that although in the main examples described herein, all of the input values have the same input format, in other examples, they may have different input formats, and it will be apparent how to apply the principles of this invention to examples in which the input values have different input formats.

Figure 3:
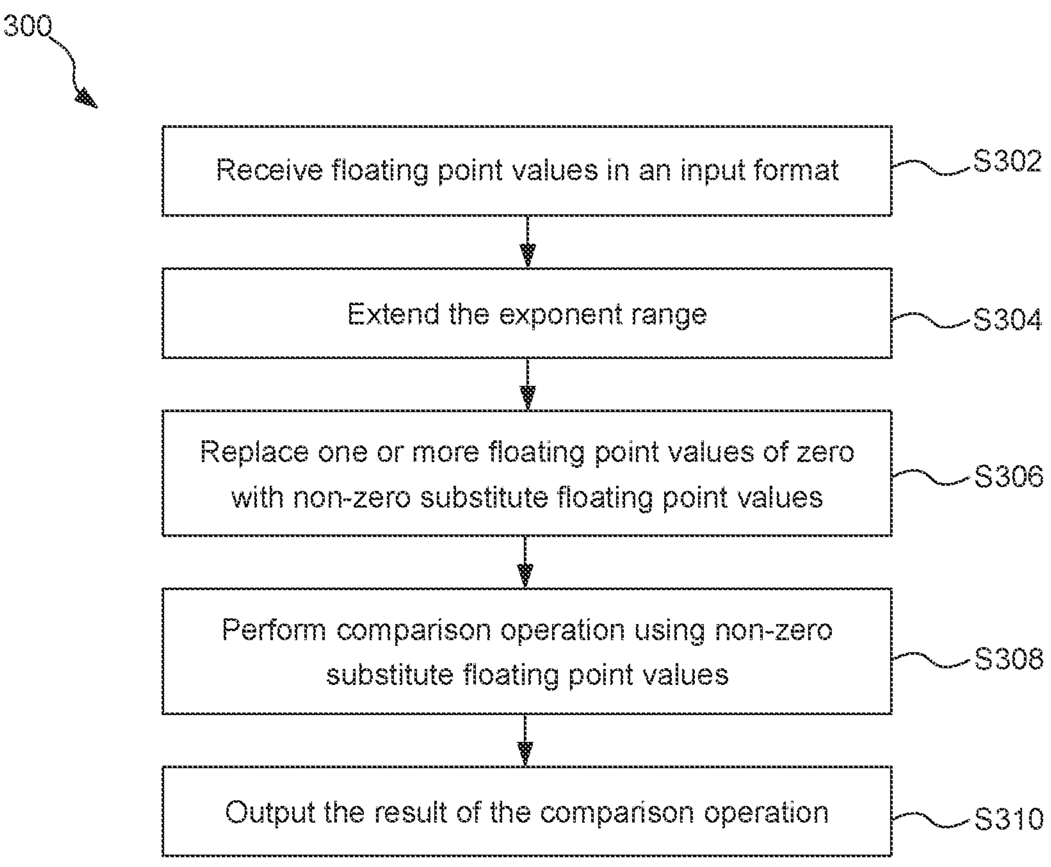
FIG. 3 is a flow chart for a first method of performing a comparison operation using floating point values involving an extended exponent range.

FIG. 3 is a flow chart for a first method 300 of performing a particular comparison operation at comparison operation logic 118 using floating point values involving an extended exponent range. In step S302 floating point values are received at the comparison operation logic 118 in an input format, e.g. in the format shown in FIG. 2*a*. As described above, in accordance with the input format, the number of exponent bits in the received floating point values is e.

In step S304 the comparison operation logic 118 extends the exponent range of the floating point values, such that the number of exponent bits is $e_{ext}$, where $e_{ext}>e$.

In step S306 the comparison operation logic 118 replaces one or more floating point values of zero with non-zero substitute floating point values. Each of the non-zero substitute floating point values has a magnitude that is small enough that it would behave like zero in said particular comparison operation if all other values involved in the particular comparison operation were non-zero finite values that are representable in the input format. Furthermore, each of the non-zero substitute floating point values has a magnitude that is too small to be representable using the input format but is representable using the extended exponent range. In the example given above, the particular comparison operation implements a determination of whether $ab<cd$ or whether $ab-cd<0$, where a, b, c and d are floating point values. If one of the floating point values is zero, then it can be replaced with a non-zero substitute floating point value of $\varepsilon_1$ and still behave like zero in this particular comparison operation if $$|\varepsilon_1| < \left|\frac{f_L^2}{f_U}\right|.$$

In other words, we want to preserve the property that 0*b<c*d for positive b, c and d if we replace the zero with $\varepsilon_1$. That is, as far as these comparisons are concerned, we don't want there to exist some combination of non-zero, finite values for b, c and d which are representable in the input form for which the result differs between 0 and the substitute floating point value $\varepsilon_1$. Given that (finite non-zero) floating point values have a lower and upper bound, we can just require that $\varepsilon_1 b<cd$ for any representable values of b, c and d, and a finite value exists for $\varepsilon_1$. If the particular comparison operation had a different form, then the upper limit on the magnitude of $\varepsilon_1$ may be different. For example, a, b, c and d might not all have the same range of representable values. A person skilled in the art would understand how the upper limit on the magnitude of $\varepsilon_1$ would be determined in different examples, but to give an example, if the comparison operation implements a determination of whether ab<cd or whether ab–cd<0, and a zero value of a is to be replaced with the non-zero substitute floating point value $\varepsilon_1$, then it would still behave like zero in this particular comparison operation if $$|\varepsilon_1| < \left|\frac{f_{L,c}\cdot f_{L,d}}{f_{U,b}}\right|,$$

where $f_{U,b}$ is a maximum representable, finite magnitude of b, $f_{L,c}$ is a minimum representable, non-zero magnitude of c and $f_{L,d}$ is a minimum representable, non-zero magnitude of d.

In some examples, although the format may allow values to be represented throughout a large range, due to the nature of the values and/or the quantities that they represent, the representable range may be reduced for valid values. For example, if it is known that a value is greater than or equal to x (e.g. where x=1) then the minimum representable, non-zero magnitude for that value may be set to be x. As another example, if it is known that a value has a magnitude that is less than or equal to x then the maximum representable, finite magnitude for that value may be set to be x. By reducing the range of representable values in this manner based on knowledge of what the values represent, the extent to which the exponent range is extended may be reduced. In general, as described above, $$|\varepsilon_1| < \left|\frac{c_{min}d_{min}}{b_{max}}\right|$$

wherein $c_{min}$ is the minimum non-zero magnitude that the third floating point value c can have, $d_{min}$ is the minimum non-zero magnitude that the fourth floating point value d can have, and $b_{max}$ is the maximum finite magnitude that the second floating point value b can have.

In some examples, the non-zero substitute floating point values which are used to replace floating point values of zero might not all have the same magnitude. For example, the floating point values may represent different types of value in the comparison operation, and different non-zero substitute floating point values may be used to replace floating point values of zero which represent values of different types. For example, for a first type of value, the non-zero substitute floating point value, $\varepsilon_1$, has a magnitude that is less than $$\left|\frac{c_{min}d_{min}}{b_{max}}\right|$$

(e.g. less than $$\left|\frac{f_L^2}{f_U}\right|$$

if all of the input values have the same input format) as described above; and for a second type of value, the non-zero substitute floating point value, $\varepsilon_2$, has a magnitude that is less than $$|\varepsilon_1|\left|\frac{d_{min}}{a_{max}}\right|$$

(e.g. less than $$|\varepsilon_1|\left|\frac{f_L}{f_U}\right|$$

if all of the input values have the same input format). In this way, the non-zero substitute floating point value, $\varepsilon_2$ behaves like zero in a comparison operation of the form ab<cd or ab–cd<0 even if one of the other values in the comparison operation has a value of $\varepsilon_1$. In other words, we want to preserve the property that $a*0<\varepsilon_1*d$ for positive a and d if we replace the zero with $\varepsilon_2$. That is, as far as these comparisons are concerned, we don't want there to exist some combination of non-zero, finite values for a and d which are representable in the input format for which the result differs between 0 and the substitute floating point value $\varepsilon_2$. Given that (finite non-zero) floating point values have a lower and upper bound, we can just require that $a\varepsilon_2<\varepsilon_1 d$ for any representable values of a and d, and a finite value exists for $\varepsilon_2$. If the particular comparison operation had a different form, then the upper limit on the magnitude of $\varepsilon_2$ may be different. For example, the input floating point values might not all have the same range of representable values, and a person skilled in the art would understand how the upper limit on the magnitude of $\varepsilon_2$ would be determined in different examples. Having two different types of values with magnitudes having different upper limits can be useful, e.g. for coordinate systems with two or more dimensions, as described in more detail below with reference to intersection testing in ray tracing systems.

In step S308 the comparison operation logic 118 performs the particular comparison operation using the one or more non-zero substitute floating point values. The particular comparison operation may also use other received floating point values which have not been substituted, e.g. because they were not zero. These other received floating point values have had their exponent ranges extended in step S304, but the values that they represent might not have been altered. The fixed function circuitry of the comparison operation logic 118 is configured to perform the particular comparison operation on floating point values which have the extended exponent ranges, e.g. on floating point values which have $e_{ext}$ exponent bits.

In step S310 the comparison operation logic 118 outputs a result of the particular comparison operation. For example, the comparison operation logic 118$_1$ may output a result of the particular comparison operation for use in the box intersection testing unit(s) 112 as described in more detail below. As another example, the comparison operation logic 118$_2$ may output a result of the particular comparison operation for use in the polygon intersection testing unit(s) 114 as described in more detail below.

Figure 4:
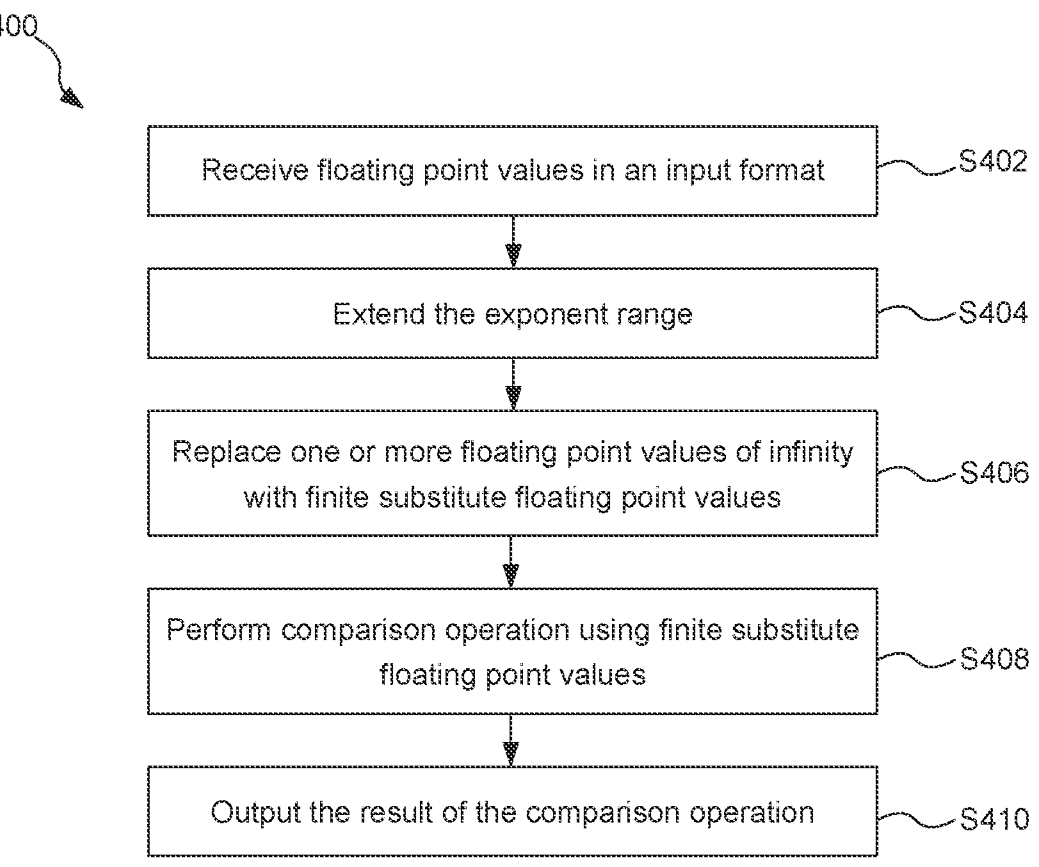
FIG. 4 is a flow chart for a second method of performing a comparison operation using floating point values involving an extended exponent range.

FIG. 4 is a flow chart for a second method 400 of performing a particular comparison operation at comparison operation logic 118 using floating point values involving an extended exponent range. Steps S402, S404 and S410 are the same as steps S302, S304 and S310 respectively. Therefore, in step S402 floating point values are received at the comparison operation logic 118 in an input format, e.g. in the format shown in FIG. 2*a*. In step S404 the comparison operation logic 118 extends the exponent range of the floating point values, e.g. such that it has the format shown in FIG. 2*b*.

In step S406 the comparison operation logic 118 replaces one or more floating point values of infinity with finite substitute floating point values. Each of the finite substitute floating point values has a magnitude that is large enough that it would behave like infinity in said particular comparison operation if all other values involved in the particular comparison operation were non-zero finite values that are representable in the input format. Furthermore, each of the finite substitute floating point values has a magnitude that is too large to be representable using the input format but is representable using the extended exponent range. In the example given above, the particular comparison operation implements a determination of whether ab<cd or whether ab−cd<0, where a, b, c and d are floating point values. If one of the floating point values is infinity, then it can be replaced with a finite substitute floating point value of $\varepsilon_{1,\infty}$ and still behave like infinity in this particular comparison operation if $$|\varepsilon_{1,\infty}| > \left|\frac{c_{max} d_{max}}{b_{min}}\right|,$$

wherein $c_{max}$ is the maximum finite magnitude that the third floating point value c can have, $d_{max}$ is the maximum finite magnitude that the fourth floating point value d can have, and $b_{min}$ is the minimum non-zero magnitude that the second floating point value b can have. For example, if all of the input values have the same input format then $$|\varepsilon_{1,\infty}| > \left|\frac{f_U^2}{f_L}\right|.$$

If the particular comparison operation had a different form, then the lower limit on the magnitude of $\varepsilon_{1,\infty}$ may be different. For example, a, b, c and d might not all have the same range of representable values. A person skilled in the art would understand how the lower limit on the magnitude of $\varepsilon_{1,\infty}$ would be determined in different examples, but to give an example, if the comparison operation implements a determination of whether ab<cd or whether ab−cd<0, and an infinity value of a is to be replaced with the finite substitute floating point value $\varepsilon_{1,\infty}$, then it would still behave like infinity in this particular comparison operation if $$|\varepsilon_{1,\infty}| > \left|\frac{f_{U,c} \cdot f_{U,d}}{f_{L,b}}\right|,$$

where $f_{L,b}$ is a minimum representable, non-zero magnitude of b, $f_{U,c}$ is a maximum representable, finite magnitude of c and $f_{U,d}$ is a maximum representable, finite magnitude d. As described above, in some examples, although the format may allow values to be represented throughout a large range, due to the nature of the values and/or the quantities that they represent, the representable range may be reduced for valid values. For example, if it is known that a value is greater than or equal to x (e.g. where x=1) then the minimum representable, non-zero magnitude for that value may be set to be x. As another example, if it is known that a value has a magnitude that is less than or equal to x then the maximum representable, finite magnitude for that value may be set to be x. By reducing the range of representable values in this manner based on knowledge of what the values represent, the extent to which the exponent range is extended may be reduced.

In some examples, the finite substitute floating point values which are used to replace floating point values of infinity might not all have the same magnitude. For example, the floating point values may represent different types of value in the comparison operation, and different finite substitute floating point values may be used to replace floating point values of infinity which represent values of different types. For example, for a first type of value, the finite substitute floating point value, $\varepsilon_{1,\infty}$ has a magnitude that is greater than $$\left|\frac{c_{max} d_{max}}{b_{min}}\right|$$

(e.g. greater than $$\left|\frac{f_U^2}{f_L}\right|$$

if all of the input values have the same input format) as described above; and for a second type of value, the finite substitute floating point value, $\varepsilon_{2,\infty}$ has a magnitude that is greater than $$|\varepsilon_{1,\infty}|\left|\frac{d_{max}}{a_{min}}\right|$$

(e.g. greater than $$|\varepsilon_{1,\infty}|\left|\frac{f_U}{f_L}\right|$$

if all of the input values have the same input format). In this way, the finite substitute floating point value, $\varepsilon_{2,\infty}$ behaves like infinity in a comparison operation of the form ab<cd or ab−cd<0 even if one of the other values in the comparison operation has a value of $\varepsilon_{1,\infty}$. In other words, we want to preserve the property that $a*\infty>\varepsilon_{1,\infty}*d$ for positive a and d if we replace the infinity with $\varepsilon_{2,\infty}$. That is, as far as these comparisons are concerned, we don't want there to exist some combination of non-zero, finite values for a and d which are representable in the input format for which the result differs between $\infty$ and the substitute floating point value $\varepsilon_{2,\infty}$. Given that (finite non-zero) floating point values have a lower and upper bound, we can just require that $a\varepsilon_{2,\infty}>\varepsilon_{1,\infty}$ d for any representable values of a and d, and a finite value exists for $\varepsilon_{2,\infty}$. If the particular comparison operation had a different form, then the upper limit on the magnitude of $\varepsilon_{2,\infty}$ may be different. If the particular comparison operation had a different form, then the lower limit on the magnitude of $\varepsilon_{2,\infty}$ may be different. For example, the input floating point values might not all have the same range of representable values, and a person skilled in the art would understand how the lower limit on the magnitude of $\varepsilon_{2,\infty}$, would be determined in different examples.

In step S408 the comparison operation logic 118 performs the particular comparison operation using the one or more finite substitute floating point values. The particular comparison operation may also use other received floating point values which have not been substituted, e.g. because they were not infinity.

These other received floating point values have had their exponent ranges extended in step S404, but the values that they represent might not have been altered. As described above, the fixed function circuitry of the comparison operation logic 118 is configured to perform the particular comparison operation on floating point values which have the extended exponent ranges, i.e. on floating point values which have $e_{ext}$ exponent bits.

In step S410 the comparison operation logic 118 outputs a result of the particular comparison operation.

Figure 5:
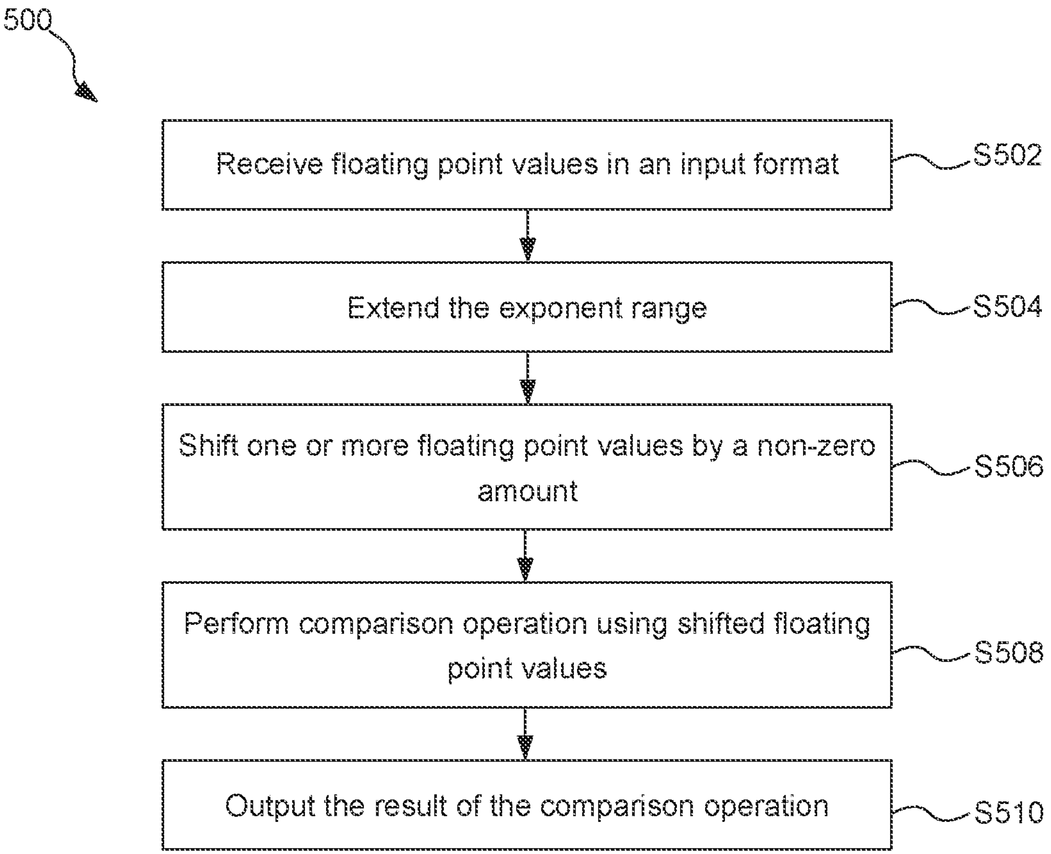
FIG. 5 is a flow chart for a third method of performing a comparison operation using floating point values involving an extended exponent range.

FIG. 5 is a flow chart for a third method 500 of performing a particular comparison operation at comparison operation logic 118 using floating point values involving an extended exponent range. Steps S502, S504 and S510 are the same as steps S302, S304 and S310 respectively. Therefore, in step S502 floating point values are received at the comparison operation logic 118 in an input format, e.g. in the format shown in FIG. 2*a*. In step S504 the comparison operation logic 118 extends the exponent range of the floating point values, e.g. such that it has the format shown in FIG. 2*b*.

In step S506 the comparison operation logic 118 shifts one or more of the floating point values by a non-zero amount which is small enough that it would behave like zero in said particular comparison operation if all other values involved in the particular comparison operation were non-zero finite values that are representable in the input format. Furthermore, the non-zero amount is too small to be representable using the input format but is representable using the extended exponent range. In the example given above, the particular comparison operation implements a determination of whether ab<cd or whether ab−cd<0, where a, b, c and d are floating point values. A floating point value can be shifted by a small amount $\varepsilon_1$ and still behave as if it had not been shifted in this particular comparison operation if $$|\varepsilon_1| < \left|\frac{f_L^2}{f_U}\right|.$$

If the particular comparison operation had a different form, then the upper limit on the magnitude of $\varepsilon_1$ may be different. In general, as described above, $$|\varepsilon_1| < \left|\frac{c_{min} d_{min}}{b_{max}}\right|$$

wherein $c_{min}$ is the minimum non-zero magnitude that the third floating point value c can have, $d_{min}$ is the minimum non-zero magnitude that the fourth floating point value d can have, and $b_{max}$ is the maximum finite magnitude that the second floating point value b can have. The amount by which the floating point values are shifted may be a fixed known amount, and it may be added implicitly in subsequent calculations rather than explicitly being added in a separate "shifting" stage. If the shift is implemented implicitly (i.e. as part of an operation) then it may add no (or very little) latency or silicon area to the system.

In step S508 the comparison operation logic 118 performs the particular comparison operation using the one or more shifted floating point values. In some examples, all of the floating point values are shifted, whereas in some other examples only a subset of the floating point values might be shifted.

However, all of the floating point values have had their exponent ranges extended in step S504. As described above, the fixed function circuitry of the comparison operation logic 118 is configured to perform the particular comparison operation on floating point values which have the extended exponent ranges, i.e. on floating point values which have $e_{ext}$ exponent bits.

In some examples, the amounts by which the floating point values are shifted by might not all have the same magnitude. For example, there may be different types of floating point value in the comparison operation, which may be shifted by different amounts. For example, values of a first type may be shifted by a first amount, $\varepsilon_i$, which has a magnitude that is less than $$\left|\frac{c_{min} d_{min}}{b_{max}}\right|$$

(e.g. less than $$\left|\frac{f_L^2}{f_U}\right|$$

if all of the input values have the same input format) as described above; and values of a second type may be shifted by a second amount, $\varepsilon_2$, which has a magnitude that is less than $|\varepsilon_1|$ $$|\varepsilon_1|\left|\frac{d_{min}}{a_{max}}\right|$$

e.g. less than $$|\varepsilon_1|\left|\frac{f_L}{f_U}\right|$$

if all of the input values have the same input format).

In step S510 the comparison operation logic 118 outputs a result of the particular comparison operation.

The methods 300, 400 and 500 can be performed separately, or a combination of two or more of the techniques of these three methods could be combined. In particular, one or more of steps S306, S406 and S506 could be performed on different received floating point values. For example, the method could implement both of steps S306 and S406 such that the comparison operation logic 118 replaces one or more floating point values of zero with non-zero substitute floating point values, and replaces one or more floating point values of infinity with finite substitute floating point values. As another example, the method could implement both of steps S306 and S506 such that the comparison operation logic 118 replaces one or more floating point values of zero with non-zero substitute floating point values, and shifts one or more floating point values by a non-zero amount. As another example, the method could implement both of steps S406 and S506 such that the comparison operation logic 118 replaces one or more floating point values of infinity with finite substitute floating point values, and shifts one or more floating point values by a non-zero amount.

As another example, the method could implement all three of steps S306, S406 and S506 such that such that the comparison operation logic 118 replaces one or more floating point values of zero with non-zero substitute floating point values, replaces one or more floating point values of infinity with finite substitute floating point values, and shifts one or more floating point values by a non-zero amount. It is noted that replacing a floating point value of zero with a non-zero substitute floating point value $\varepsilon_i$ has the same effect as shifting the floating point value of zero by the non-zero amount $\varepsilon_1$.

As described above, the comparison operation may be part of an intersection testing process to determine whether a ray intersects a box defining a volume within a scene. For example, the comparison operation may be performed by the comparison operation logic 118$_1$ in the one or more box intersection testing unit(s) 112 of the intersection testing module 108.

Figure 6:
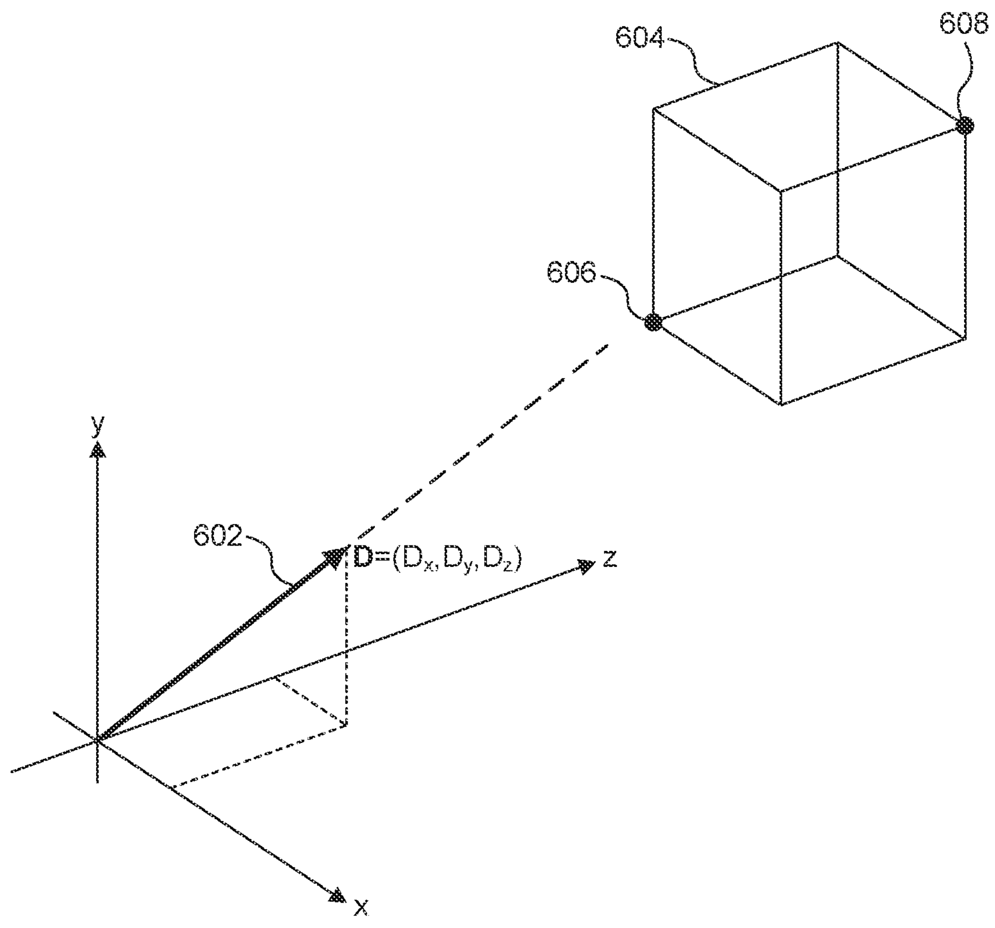
FIG. 6 shows a ray and an axis-aligned box, and shows the axes of the coordinate system in which the scene is represented.

FIG. 6 shows a ray 602 and an axis-aligned box 604. The axes of the coordinate system in which the scene is represented are also shown, denoted "x", "y" and "z". The ray 602, r(t), can be represented as r(t)=O+Dt, where O is a vector representing the origin of the ray and D is the direction vector of the ray, where $O=(O_x,O_y,O_z)$ and $D=(D_X, D_y, D_z)$. In this example, the origin of the ray 602 is at the origin of the coordinate system. This can be achieved by translating the positions of the ray origins and the box by subtracting the ray origin. The box 604 is an axis-aligned box with respect to the x, y and z axes of the coordinate system. The coordinate system could be a world space coordinate system of a scene being rendered, or the coordinate system could be an instance space coordinate system of an instance of a set of geometry within a scene being rendered. The corner 606 of the box 604 is at a position $b_{min}=(b_{x,min},b_{y,min},b_{z,min})$ wherein $b_{x,min}$ is the minimum x component of a position within the box 604, $b_{y,min}$ is the minimum y component of a position within the box 604, and $b_{z,min}$ is the minimum z component of a position within the box 604. The opposite corner 608 of the box 604 is at a position $b_{max}=(b_{x,max}, b_{y,max}, b_{z,max})$ wherein $b_{x,max}$ is the maximum x component of a position within the box 604, $b_{y,max}$ is the maximum y component of a position within the box 604, and $b_{z,min}$ is the maximum z component of a position within the box 604. In the example shown in FIG. 6, the ray 602 and the box 604 are completely within the positive octant of the coordinate system, i.e. the direction vector of ray 602 has positive values for all of its component values $D_x$, $D_y$ and $D_z$, and all of $b_{x,min}$, $b_{y,min}$, $b_{z,min}$, $b_{x,max}$, $b_{y,max}$ and $b_{z,max}$ are positive.

Figure 7:
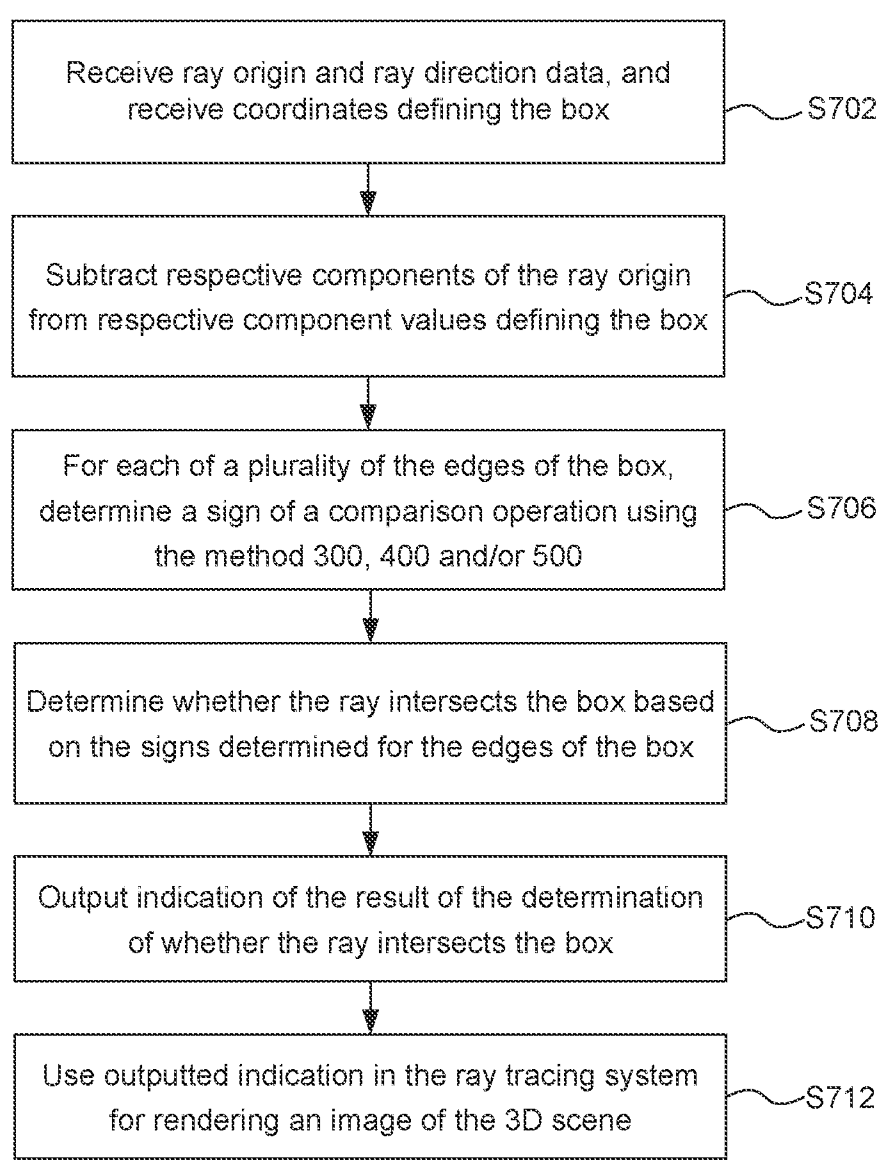
FIG. 7 is a flow chart for a method of performing intersection testing for a ray with respect to a box according to examples described herein.

FIG. 7 is a flow chart for a method of performing intersection testing for the ray 602 with respect to the box 604 according to examples described herein.

In step S702 data defining the ray 602 and the box 604 are received at the intersection testing module 108. In particular, data defining the components of the ray origin and the ray direction are obtained. The data defining the ray origin may be the three components of the ray origin position, $O_x$, $O_y$, and $O_z$. The data defining the ray direction may comprise the three components of the ray direction, $D_x$, $D_y$ and $D_z$. Alternatively, some different values defining the ray direction may have been pre-computed and stored in a store, such that in step S702 the pre-computed values may be read. For example, three values may be read to define the ray direction data, and these three values may be $$\frac{D_x}{D_z}, \frac{D_y}{D_z} \text{ and } \frac{1}{D_z}.$$

In other examples, different combinations of pre-computed values may be read to sufficiently define the ray direction for the purposes of performing intersection testing on the ray with respect to the box 604, e.g. values of $$\frac{D_x}{|D_z|}, \frac{D_y}{|D_z|} \text{ and } \frac{1}{D_z}$$

may be read, values of $$\frac{D_x}{D_z}, \frac{D_y}{D_z}$$

and $D_z$ may be read, values of $$\frac{D_x}{|D_z|}, \frac{D_y}{|D_z|}$$

and $D_z$ may be read, values of $$\frac{D_z}{D_x}, \frac{D_z}{D_y} \text{ and } \frac{1}{D_z}$$

may be read, values of $$\frac{|D_z|}{D_x}, \frac{|D_z|}{D_y} \text{ and } \frac{1}{D_z}$$

may be read, values of $$\frac{D_z}{D_x}, \frac{D_z}{D_y}$$

and $D_z$ may be read, values of $$\frac{|D_z|}{D_x}, \frac{|D_z|}{D_y}$$

and $D_z$ may be read, or value of $$\frac{D_x}{D_z}, \frac{D_y}{D_z}$$

and sgn($D_z$) may be read. It is noted that, for a value f, sgn(f)=+1 if f is non-negative (e.g. +0), and sgn(f)=−1 if f is non-positive (e.g. −0). In other examples, other values may be pre-computed and read in order to define the ray direction. The data defining the box may be data defining the positions of the planes representing the box, e.g. the component values $b_{x,min}$, $b_{y,min}$, $b_{z,min}$, $b_{x,max}$, $b_{y,max}$ and $b_{z,max}$.

In step 6704, the intersection testing module 108 (e.g. the box intersection testing unit(s) 112) subtracts respective components of the origin of the ray 602 from respective components defining the position of the box 604. The origin of the ray is then set to be the origin of the coordinate system. Step S704 can be described as performing a translation on the ray 602 and the box 604 so that the origin of the coordinate system is at the origin of the ray 602. From this point on in the method described with reference to FIG. 7, the origin of the ray is at the origin of the coordinate system, i.e. at a position (0,0,0). FIG. 6 shows the ray 602 and the box 604 after the translation has been performed in step S704, such that the origin of the coordinate system is at the origin of the ray.

In some examples, the axes for the components of the ray and the box may be selectively reversed by the intersection testing module 108 (e.g. by the ray adjustment unit 116), such that $D_x \geq 0$, $D_y \geq 0$ and $D_z \geq 0$, using sgn(Dx), sgn(Dy) and sgn(Dz). In this way, the ray direction can be guaranteed to be into the octant with positive x, y and z. The "reversing" of the axes, may be referred to as "reflecting", "inverting" or "negating", and may involve changing the sign of all of the component values in the dimension along the axis in question. It is noted that reversing an odd number of the axes reverses the orientation of the geometry. Furthermore, in some examples, the intersection testing module 108 (e.g. the ray adjustment unit 116) may selectively permute (i.e. rearrange) the axes. A permutation of the axes comprises: (i) a rotation of three axes, (ii) a transposition of two axes, or (iii) the identity (i.e. not changing the axes). The first and third of these permutations (i.e. rotation and identity) do not change the orientation of the geometry, but the second of these permutations (i.e. transposition of two axes) does reverse the orientation of the geometry. As an example, a permutation of the axes may be performed so that the major component of the ray direction is $D_z$ (i.e. ensuring that $|D_z| \geq |D_x|$ and $|D_z| \geq |D_y|$).

The axis-aligned box 604 is defined by, for each axis of the coordinate system, two planes each having a respective constant component value along the axis. Each of the edges of the box 604 is defined by the intersection of a respective pair of these planes.

In step S706, a comparison operation is performed, as described above, for each of a plurality of edges of the box (e.g. for each of the silhouette edges of the box when viewed from the ray origin). For example, an edge of the axis-aligned bounding box may be defined by the component values ($b_u$ and $b_v$) that are constant for the respective two planes which intersect to define the edge of the box. The parameters u and v can correspond with any two of x, y and z which denote the axes of the coordinate system. For example, $b_u$ and $b_v$ can be two of $b_{x,min}$, $b_{y,min}$, $b_{z,min}$, $b_{x,max}$, $b_{y,max}$ and $b_{z,max}$. The comparison operation comprises comparing, for each of a plurality of edges of the box, values of $b_u D_v$ and $b_v D_u$, wherein $b_u$ and $b_v$ are the component values that are constant for the respective two planes which intersect to define the edge of the box, and $D_u$ and $D_v$ are the components of the ray direction vector along the axes (u and v) for which the two intersecting planes are defined. In some examples, the comparison operation is performed by the comparison operation logic 118$_1$ of the box intersection testing unit(s) 112 to determine, for each of a plurality of edges of the box, a sign of $b_u D_v - b_v D_u$. In some other examples, the comparison operation is performed by the comparison operation logic 118$_1$ of the box intersection testing unit(s) 112 to determine, for each of a plurality of edges of the box, whether $b_u D_v$ is greater than $b_v D_u$. The comparison operation can be performed as described above in relation to the methods 300, 400 and/or 500 shown in FIGS. 3, 4 and/or 5.

In order to test whether the ray 602 intersects the box 604, the sign of the comparison operation, i.e. the sign of $b_u D_v - b_v D_u$, can be determined for each of the silhouette edges of the box. For example, a pair of distinct planes, one from the set of planes where x has constant component $b_{x,min}$, y has constant component $b_{y,min}$ or z has constant component $b_{z,min}$ and one from the set of planes where x has constant component $b_{x,max}$, y has constant component $b_{y,max}$ or z has constant component $b_{z,max}$, may form a silhouette edge along their intersection such that $b_u$ can be one of $b_{x,min}$, $b_{y,min}$ or $b_{z,min}$ and $b_v$ can be one of $b_{x,max}$, $b_{y,max}$ or $b_{z,max}$ (with corresponding axes for $D_u$ and $D_v$). The comparison operation logic 118$_1$ outputs the result of the comparison operation determined for each silhouette edge of the box, for use in the box intersection testing unit(s) 112. In step S708 the box intersection testing unit(s) 112 determines whether the ray 602 intersects the box 604 based on the signs determined for the silhouette edges of the box 604 in step S706. The sign determined for a silhouette edge of the box 604 indicates whether the ray 602 passes on the inside or the outside of that silhouette edge. Intersection between the ray 602 and the box 604 occurs if, and only if, the ray 602 passes on the inside of all of the silhouette edges of the box 604. Therefore, step S708 comprises determining that the ray does not intersect the axis-aligned box if the signs determined for the silhouette edges of the box do not all have the same sign, and determining that the ray does intersect the axis-aligned box if the signs determined for the silhouette edges of the box all have the same sign.

Another way to think about the box testing is to consider intersection distances to the planes of the box and compare these intersection distances for pairs of planes to determine which of the planes of the pair the ray intersects first (or second). For each axis, the box is defined with a front-facing plane and a back-facing plane. After reversing the axes with respect to the ray direction component signs, the front-facing plane for an axis has a lower constant component value along that axis than the back-facing plane for the axis. Therefore, if the ray origin lies outside the box and enters the box then a front-facing plane is a plane through which the ray may enter the box and a back-facing plane is a plane through which the ray may exit the box. In other words, for each axis, the front-facing plane is the least far plane, looking along the direction of the ray (from t=−∞), and the back-facing plane is the furthest plane. These comparison operations have the same form as described above, i.e. they involve determining the sign of $b_uD_v-b_vD_u$. For example, pairings of planes from the three front facing planes (one with constant x component values at $b_{x,min}$, one with constant y component values at $b_{y,min}$ and one with constant z component values at $b_{z,min}$) can be compared. For example, the box intersection testing unit(s) 112 can determine whether the ray intersects the front-facing x-plane with components $b_{x,min}$ before the ray intersects the front-facing y-plane with components $b_{y,min}$ by determining the sign of $b_{x,min}D_y-b_{y,min}D_x$ (or by determining whether $b_{x,min}D_y>b_{y,min}D_x$); the box testing can determine whether the ray intersects the front-facing x-plane with components $b_{x,min}$ before the ray intersects the front-facing z-plane with components $b_{z,min}$ by determining the sign of $b_{x,min}D_z-b_{z,min}D_x$ (or by determining whether $b_{x,min}D_y>b_{z,min}D_x$); and the box testing can determine whether the ray intersects the front-facing y-plane with components $b_{y,min}$ before the ray intersects the front-facing z-plane with components $b_{z,min}$ by determining the sign of $b_{y,min}D_z-b_{z,min}D_y$ (or by determining whether $b_{y,min}D_z>b_{z,min}D_y$). In this way the box intersection testing unit(s) 112 can determine the front-facing plane which the ray intersects furthest along the ray. Pairings of planes from the three back facing planes (one with constant x component values at $b_{x,max}$, one with constant y component values at $b_{y,max}$ and one with constant z component values at $b_{z,max}$) can be compared. The box intersection testing unit(s) 112 can determine whether the ray intersects the back-facing x-plane with components $b_{x,max}$ before the ray intersects the back-facing y-plane with components $b_{y,max}$ by determining the sign of $b_{x,max}D_y-b_{y,max}D_x$ (or by determining whether $b_{x,max}D_y>b_{y,max}D_x$); the box testing can determine whether the ray intersects the back-facing x-plane with components $b_{x,max}$ before the ray intersects the back-facing z-plane with components $b_{y,max}$ by determining the sign of $b_{x,max}D_z-b_{z,max}D_x$ (or by determining whether $b_{x,max}D_z>b_{z,max}D_x$); and the box testing can determine whether the ray intersects the back-facing y-plane with components by $b_{y,max}$ before the ray intersects the back-facing z-plane with components $b_{z,max}$ by determining the sign of $b_{y,max}D_z-b_{z,max}D_y$ (or by determining whether $b_{y,max}D_z>b_{z,max}D_y$). In this way the box intersection testing unit(s) 112 can determine the back-facing plane which the ray intersects least far along the ray. The box intersection testing unit(s) 112 can then perform another comparison (of the form $b_xD_v-b_vD_u$ or $b_uD_v>b_vD_u$) to determine whether the ray intersects the least far back-facing plane before it intersects the furthest front-facing plane. If the ray does intersect the least far back-facing plane before it intersects the furthest front-facing plane then it is determined that the ray does not intersect the box, but if the ray does not intersect the least far back-facing plane before it intersects the furthest front-facing plane then it can be determined that the ray intersects the box.

In some examples, the box testing is conservative which means that any errors (e.g. rounding errors) in the implementation of the comparison operation are permitted to cause false positives (i.e. to determine an intersection between a ray and a box even though a perfectly accurate determination would find that the ray misses the box) but are not permitted to cause false negatives (i.e. errors are not permitted to result in a determination that a ray misses a box if a perfectly accurate determination would find that the ray intersects the box). Therefore, if $b_uD_v$-$b_vD_u$ is within some error tolerance of finding an intersection of a ray with a box then the result can be determined to be either positive or negative to ensure that the farthest front-facing plane is always determined to be nearer than the least far back-facing plane, i.e. that such a ray always intersects the box, to guarantee box testing is conservative.

The values of $b_u$, $b_v$, $D_u$ and $D_v$, are floating point values. As described above in relation to the method 300 if any of these values are zero then they can be replaced with non-zero substitute floating point values. Furthermore, as described in relation to the method 500, in some examples, all of the floating point values may be shifted by a non-zero small amount. To avoid extending the mantissa, the floating point values may be shifted by the non-zero small amount implicitly in the comparison operation or a vector format can be used (as explain in more detail below). In some examples, e.g. in a software implementation, the floating point values may be shifted by the non-zero small amount by an explicit addition operation, after converting the floating point values to a different format in which the non-zero small amount can be represented, e.g. by converting the floating point values from a single precision format to a double precision format. For example, the components of the ray direction vector D may be shifted to be $D_u+\varepsilon_1$ and $D_v+\varepsilon_1$, and the components of a box edge may be shifted to be $b_u+\varepsilon_2$ and $b_v+\varepsilon_2$. As described above, $$|\varepsilon_1| < \left|\frac{f_L^2}{f_U}\right|, \text{ and } |\varepsilon_2| < |\varepsilon_1|\left|\frac{f_L}{f_U}\right|.$$

In this example, all of the input floating point values ($b_u$, $b_v$, $D_u$ and $D_v$) have the same input format, but in other examples the input values might not all have the same format, and they might have other bounds placed upon them which are not due to their format. For example, for a first type of value, e.g. the ray direction vector component values ($D_u$ and $D_v$), the value of $\varepsilon_1$ may have a magnitude that is less than $$\left|\frac{D_{min}b_{min}}{b_{max}}\right|$$

wherein $D_{min}$ is the minimum non-zero magnitude that the ray direction vector components may take, $b_{min}$ is the minimum non-zero magnitude that the box components may take, and $b_{max}$ is the maximum finite magnitude that the box components may take. For example, if the ray direction vector and box components have the same input format and can take any value that is representable in the input format then $$|\varepsilon_1| < \left|\frac{f_L^2}{f_U}\right|$$

as described above. For a second type of value, e.g. the box component values, the value of $\varepsilon_2$ may have a magnitude that is less than $$|\varepsilon_1|\left|\frac{b_{min}}{D_{max}}\right|$$

wherein $D_{max}$ is the maximum finite magnitude that the ray direction vector components may take. For example, if the ray direction vector and box components have the same input format and can take any value that is representable in the input format then $$|\varepsilon_2| < |\varepsilon_1|\left|\frac{f_L}{f_U}\right|$$

as described above.

Since, in this example, D, and D, are shifted by the same amount, the ray direction vector is shifted at an angle of 45 degrees to the edge defined by the components $b_u$ and $b_v$, which is aligned with one of the axes of the coordinate system. The magnitude of $\varepsilon_1$ is so small that it behaves like zero in the particular comparison $b_uD_v-b_vD_u$ if the other values are constrained to lie within a representable interval $[f_L,f_U]$ according to the input format, so it is no longer possible for boundary intersections to occur, i.e. it is no longer possible for the ray to be exactly parallel to the edge of the box, when the extended exponent range is used to implement the comparison operation. The values of the box components are shifted by an even smaller amount $\varepsilon_2$, such that the shifting of the box components cannot cancel out the shifting of the ray components, but can be used to avoid having component values of zero in the calculations. Since floating point values of zero are replaced (or shifted) by a small non-zero amount, the comparison operation logic 118 does not need to be configured with exception handling logic for handling zeros. As described above, this can reduce the physical size of the fixed function circuitry implemented in the comparison operation logic 118, and it can also reduce the latency of the comparison operation logic 118 because the exception handling for zeros is avoided. For example, any floating point value of zero can be substituted with either $\varepsilon_1$ or $\varepsilon_2$ in advance of a multiplication operation in the comparison operation logic, so we can remove the need for some exception handling in the floating point multiplier. For example, the substitution of the zero floating point values can be made away from the critical path so it does not add to the latency.

As mentioned above, in some examples, the floating point values defining the components of the ray direction vector may be received as reciprocal values, e.g. in a form such as $$\left(\frac{1}{D_u}\right) \text{ and } \left(\frac{1}{D_v}\right).$$

In this case, in step S706, rather than determining the sign of $b_uD_v-b_vD_u$, the comparison operation may determine the sign of $$b_u\left(\frac{1}{D_u}\right) - b_v\left(\frac{1}{D_v}\right)$$

for a plurality of the edges (e.g. the silhouette edges) of the box, or to determine and/or compare the largest entry distance and the smallest exit distance for the ray to the planes of the box.

It is clear in this example how we may end up performing calculations such as 0 divided by 0 (or 0 multiplied by infinity), which can be problematic as it cannot be consistently defined. The use of $e_1$ and $e_2$ to avoid zeros can avoid undefined results, e.g. avoid undefined intersection distances to boxes, without having to treat them as special cases. As above, in step S708 the box intersection testing unit(s) 112 determines whether the ray 602 intersects the box 604 based on results of the comparisons for the plurality of edges of the box, e.g. based on the signs of the comparison operations for the box 604, in step S706.

When the received ray direction components are reciprocal values $$\left(\text{e.g. } \left(\frac{1}{D_u}\right) \text{ and } \left(\frac{1}{D_v}\right)\right),$$

then it is possible for them to be infinity, e.g. when $D_u$ and $D_v$ are zero. As described above in relation to the method 400 if any of these values are infinity then they can be replaced with finite substitute floating point values. For example, if either $$\left(\frac{1}{D_u}\right) \text{ or } \left(\frac{1}{D_v}\right)$$

or is infinity then it can be replaced with the finite substitute floating point value $\varepsilon_{1,\infty}$. In another example, the ray direction components could be shifted such that $$\frac{1}{D_u}$$

becomes $$\frac{1}{D_u+\varepsilon_1}$$

and such that $$\frac{1}{D_v}$$

become $$\frac{1}{D_v+\varepsilon_1}.$$

This shifting can, for example, happen explicitly (e.g. as an addition operation) before the reciprocal is evaluated (e.g. prior to box testing). The components of a box edge may still be shifted to be $b_u+\varepsilon_2$ and $b_v+\varepsilon_2$. In this example, $$|\varepsilon_{1,\infty}| > \left|\frac{D'_{max}b_{max}}{b_{min}}\right|,$$

where $D'_{max}$ is the maximum finite magnitude that $$\left(\frac{1}{D_u}\right) \text{ or } \left(\frac{1}{D_v}\right)$$

can have, $b_{max}$ is the maximum finite magnitude that $b_u$ or $b_v$ can have, and $b_{min}$ is the minimum non-zero magnitude that $b_u$ or $b_v$ can have. Furthermore, in this example, $$|\varepsilon_2| < \frac{1}{|\varepsilon_{1,\infty}|}|D'_{min}b_{min}|,$$

where $D'_{min}$ is the minimum finite magnitude that $$\left(\frac{1}{D_u}\right) \text{ or } \left(\frac{1}{D_v}\right)$$

can have. As described above, in some examples in which the reciprocal ray component values and the box component values have the same input format, then $$|\varepsilon_{1,\infty}| > \left|\frac{f_U^2}{f_L}\right|, \text{ and } |\varepsilon_2| < \frac{1}{|\varepsilon_{1,\infty}|}\left|\frac{f_L}{f_U}\right|.$$

It is noted that in some examples, there may be different floating bounds on the inverse ray components and box plane coefficients. The magnitude of $\varepsilon_{1,\infty}$ is so large that it behaves like infinity in the particular comparison $$b_u\left(\frac{1}{D_u}\right) - b_v\left(\frac{1}{D_v}\right)$$

if the other values are constrained to lie within a representable interval $[f_L,f_U]$ according to the input format. With this substitution, it is no longer possible for boundary intersections to occur, i.e. it is no longer possible for the ray to be exactly parallel to an edge of the box, when the extended exponent range is used to implement the comparison operation. As above, the values of the box components are shifted by a tiny amount, such that the shifting of the box components cannot cancel out the shifting of the ray components, but can be used to avoid having component values of zero in the calculations. As mentioned above, avoiding zeros can avoid undefined results, e.g. undefined intersection distances to boxes, which may result from calculations such as 0 multiplied by infinity (which is equivalent to 0 divided by 0). Furthermore, since floating point values of zero are replaced (or shifted) by a small non-zero amount and floating point values of infinity are replaced by finite values, the comparison operation logic 118 does not need to be configured with exception handling logic for handling zeros or infinities. As described above, this can reduce the physical size of the fixed function circuitry implemented in the comparison operation logic 118, and it can also reduce the latency of the comparison operation logic 118 because the exception handling for zeros and infinities is avoided. For example, any floating point value of zero or infinity can be substituted in advance of a multiplication operation in the comparison operation logic, so we can remove the need for some exception handling in the floating point multiplier. For example, the substitution can be made away from the critical path so it does not add to the latency.

In step S710 the box intersection testing unit(s) 112 outputs an indication of the result of the determination of whether the ray intersects the box.

In step S712 the outputted indication is used in the ray tracing system for rendering an image of a 3D scene. As described above, the box 604 may be an axis-aligned bounding box (AABB) which bounds geometry to be rendered in the scene. The AABB may correspond to a node of a hierarchical acceleration structure which is used for performing the intersection testing in the ray tracing system.

In the example described with reference to FIGS. 6 and 7, the box 604, with which the ray 602 is to be tested for intersection, is an axis-aligned box. In this example, the components of the ray direction vector are shifted by the same amount ($\varepsilon_1$). This means that the ray direction vector is shifted in a direction at 45 degrees to each of the axis. Since the box 604 is axis-aligned, the shift to the ray direction vector is not parallel to any of the edges or faces of the box 604. This ensures that the shifting of the ray direction vector prevents the ray direction vector from being exactly parallel with the edges of the box, which can prevent problems such as undefined results (e.g. undefined intersection distances) occurring.

As described above, boxes may correspond to nodes of a hierarchical acceleration structure.

When a ray is found to intersect a box corresponding to a leaf node of the hierarchical accelerations structure, then the ray may be scheduled for intersection testing with the primitives referenced by the leaf node. The primitives may be defined as convex (i.e., no interior angle greater than 180 degrees) or strictly convex (i.e., no interior angle greater than or equal to 180 degrees) polygons, e.g. triangles.

Figure 8:
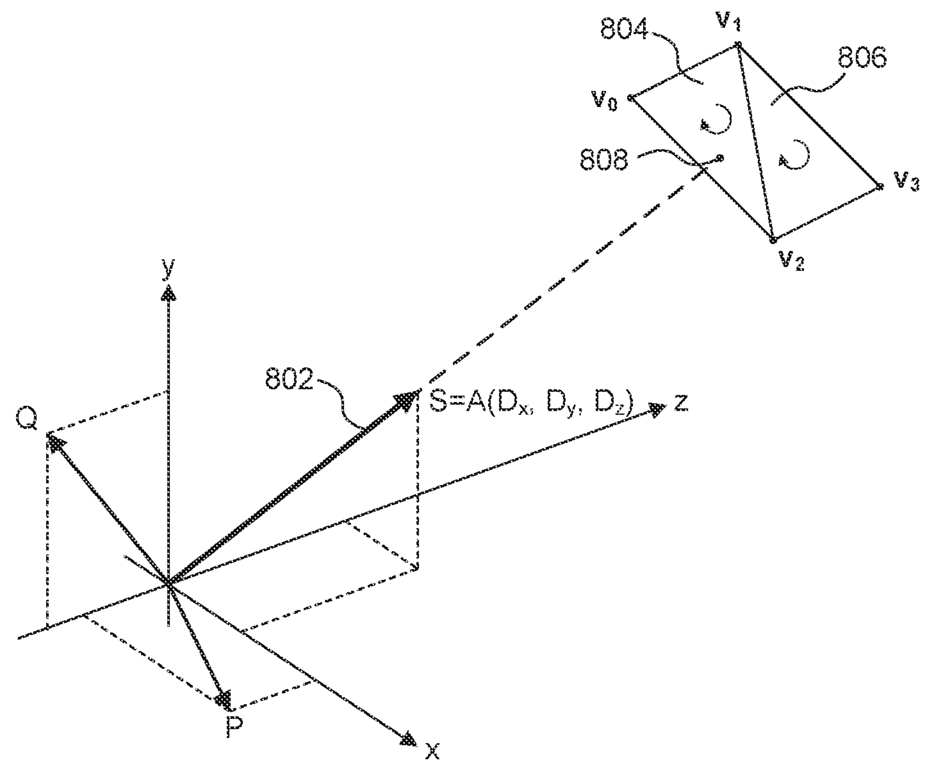
FIG. 8 shows a ray and two polygons, the basis vectors of a space-coordinate system, and the basis vectors of a ray-coordinate system.

FIG. 8 illustrates a ray 802 (which may or may not be the same ray as ray 602) and two convex polygons 804 and 806. The two polygons are triangles and they share an edge such that they form a quad.

The orientations of the two polygons are indicated as clockwise, as viewed from the ray's perspective, in FIG. 8. Polygon 804 is defined by the ordered set of vertices $\{v_0,v_1,v_2\}$, and polygon 806 is defined by the ordered set of vertices $\{v_1,v_3,v_2\}$. The edge between vertices $v_1$ and $v_2$ is shared by polygons 804 and 806. The x, y and z basis vectors of the space-coordinate system are shown in FIG. 8. As described above, the space-coordinate system could be a world space coordinate system of a scene being rendered, or the space-coordinate system could be an instance space coordinate system of an instance of a set of geometry within a scene being rendered. The origin of a ray-coordinate system that is used in the intersection testing of the ray 802 with the convex polygons 804 and 806 is the origin of the ray. The positions of the vertices defining the polygons 804 and 806 are translated by subtracting the ray origin from the positions of the vertices. In the example shown in FIG. 8, the ray 802 intersects the polygon 804 at an intersection point 808.

Furthermore, in some examples described herein, the x, y and z components of the ray and the vertices defining the polygons are selectively permuted and/or reversed, such that $D_z \geq D_x \geq 0$ and $D_z \geq D_y \geq 0$, before performing intersection testing (noting that in these examples we must also have $D_r > 0$ for valid ray directions). The selective reversing of the axes may be performed such that the ray direction vector will point in the octant of the space-coordinate system which has positive values for x, y and z, and the selective permutation of the axes is performed such that $D_z$ will be the major component of the ray direction, i.e. $|D_z| \geq |D_x|$ and $|D_z| \geq |D_y|$.

FIG. 8 shows the ray 802 and the polygons 804 and 806 in relation to the basis vectors after the translation and the selective permutation of the axes of the ray and the box have been performed, such that the origin of the ray is at the origin of the coordinate system, and such that $|D_z| \geq |D_x|$ and $|D_z| \geq |D_y|$. This ensures that $D_r$ is non-zero because a valid ray cannot have $D_x=D_y=D_r=0$.

The intersection testing of the ray with the polygons 804 and 806 can be performed in a ray coordinate system. It is noted that the same ray coordinate system may be used by the box intersection testing unit(s) 112 and the polygon intersection testing unit(s) 114. This is useful because it reduces at least part of the intersection testing process down into a 2D problem even though the ray 802 and the polygons 804 and 806 are defined in a 3D scene. In particular, one of the basis vectors of the ray coordinate system is aligned with the ray. For example, the basis vectors of the ray-coordinate system are represented as P, Q and S in FIG. 8. The first basis vector, S, of the ray-coordinate system is set to be along the direction of the ray, $S=A(D_x,D_y,D_z)$, where A is a scalar value. In some examples, $$A = \frac{1}{D_z},$$

such that $$S = \left(\frac{D_x}{D_z}, \frac{D_y}{D_z}, 1\right).$$

The second and third basis vectors, P and Q, of the ray coordinate system are: (i) orthogonal to the first basis vector, S, and (ii) not parallel with each other. To give some examples, the second and third basis vectors, P and Q, may be defined to be $P=B(D_z, 0, -D_x)$ and $=C(0, D_z, -D_y)$, where B and C may be any non-zero scalar values. In an example, $$B = C = \frac{1}{D_z}.$$

To give some other examples, B could be $$\pm 1, \pm\frac{1}{D_z}, \pm\frac{1}{|D_z|}, \pm\frac{1}{D_x}, \pm\frac{1}{|D_x|}, \pm\text{sgn}(D_z),$$

or $\pm\text{sgn}(D_x)$, and C could be $$\pm 1, \pm\frac{1}{D_z}, \pm\frac{1}{|D_z|}, \pm\frac{1}{D_y} \text{ or } \pm\frac{1}{|D_y|}, \pm\text{sgn}(D_z),$$

or $\pm\text{sgn}(D_y)$. It is noted that P and Q are not necessarily orthogonal to each other. In the examples given above: (i) S is orthogonal to P and to Q, (ii) P and Q are not parallel with each other, and (iii) P and Q have a zero as one component when expressed in the space-coordinate system. Furthermore, in some of these examples, P and Q have a value of ±1 as one component when expressed in the space-coordinate system. Conditions (i) and (ii) together imply that P,Q and S are always linearly independent. This implies that they are also spanning, and so do form a basis. Using the ray-coordinate system with basis vectors as described in the examples above can simplify some of the processing involved in intersection testing. In particular, if a basis vector has a zero as a component value then a multiply and/or add operation (e.g. as used for performing a dot product or a cross product) involving that basis vector will not include a multiply and/or an add operation for the component which is zero, thereby reducing the number of operations that need to be performed. Similarly, if a basis vector has ±1 as a component value then a multiply-and-add operation (e.g. as used for performing a dot product or a cross product) involving that basis vector will not include a multiply operation for the component which is ±1, thereby reducing the number of operations that need to be performed. Reducing the number of operations that are performed will tend to reduce the latency and power consumption of the intersection testing module 108. Furthermore, when the intersection testing module 108 is implemented in fixed function circuitry then reducing the number of operations that are performed will tend to reduce the size (i.e. the silicon area) of the intersection testing module 108. For example, the fixed function circuitry may comprise one or more multiply-and-add components (e.g. a fused multiply-add unit) for performing multiplications and additions using the second and third basis vectors of the ray-coordinate system. Although the examples given above of the basis vectors of the ray coordinate system have advantages, it would be possible to implement examples described herein using different ray coordinate systems, e.g. where the basis vectors do not have 0 or ±1 as components when expressed in the space-coordinate system.

Figure 9:
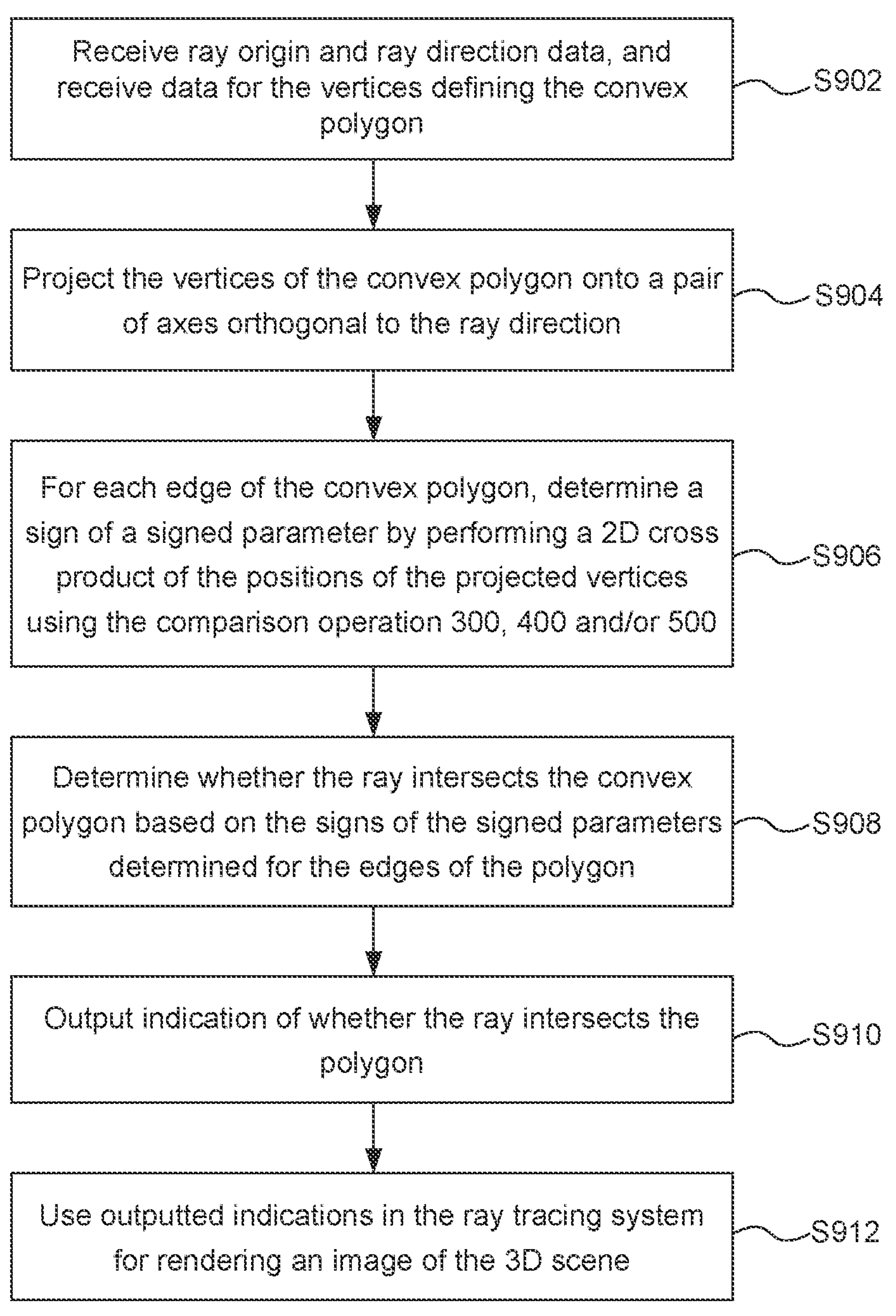
FIG. 9 is a flow chart for a method of performing intersection testing for a ray with respect to a convex polygon according to examples described herein.

FIG. 9 is a flow chart for a method of performing intersection testing for a ray with respect to a convex polygon (e.g. a triangle), performed by the polygon intersection testing unit(s) 114 of the intersection testing module 108. The method is described below with reference to testing the ray 802 for intersection with the polygon 804, and a corresponding method would be performed for testing the ray 802 for intersection with other polygons, e.g. with polygon 806.

In step S902 data defining the ray 802 and data for the vertices defining the convex polygon 804 are obtained at the intersection testing module 108. In particular, data defining the components of the ray origin and the ray direction in the space-coordinate system are obtained. The data defining the ray origin may be the three components of the ray origin position in the space-coordinate system, $O_x$, $O_y$ and $O_z$. The data defining the ray direction may comprise the three components of the ray direction in the space-coordinate system, $D_x$, $D_y$ and $D_z$. Alternatively, as described above, some different values defining the ray direction may have been pre-computed and stored in a store, such that in step S902 the pre-computed values may be read. For example, three values may be read to define the ray direction data, and these three values may be $$\frac{D_x}{D_z}, \frac{D_y}{D_z} \text{ and } \frac{1}{D_z}.$$

In other examples, different pre-computed values may be read to define the ray direction, e.g. values of $$\frac{D_z}{D_x}, \frac{D_z}{D_y}$$

and $D_z$ may be read. As another example, values of $$\frac{D_z}{D_x}, \frac{D_z}{D_y} \text{ and } \frac{1}{D_z}$$

may be read. In other examples, other values may be pre-computed and read which can be used to define the ray direction. For example, values of $$\frac{D_x}{|D_z|}, \frac{D_y}{|D_z|} \text{ and } \frac{1}{D_z}$$

may be read, values of $$\frac{D_x}{D_z}, \frac{D_y}{D_z}$$

and $D_z$ may be read, values of $$\frac{D_x}{|D_z|}, \frac{D_y}{|D_z|}$$

and $D_z$ may be read, values of $$\frac{D_z}{D_x}, \frac{D_z}{D_y} \text{ and } \frac{1}{D_z}$$

may be read, values of $$\frac{|D_z|}{D_x}, \frac{|D_z|}{D_y} \text{ and } \frac{1}{D_z}$$

may be read, or values of $$\frac{|D_z|}{D_x}, \frac{|D_z|}{D_y}$$

and $D_z$ may be read.

In the example described with reference to FIG. 9, data defining the x, y and z components of the positions of the vertices defining the convex polygon 804 is read in step S902.

In step S904, the intersection testing module 108 projects the vertices of the convex polygon 804 onto a pair of axes orthogonal to the ray direction, wherein the origin of the pair of axes corresponds with the ray origin. This projection of the vertices of the convex polygon onto a pair of axes orthogonal to the ray direction may comprise transforming the vertices of the convex polygon into the ray coordinate system described above. As described above, the ray-coordinate system has an origin at the ray origin, so step S904 may involve subtracting the respective components of the ray origin ($O_x$, $O_y$ and $O_z$) from respective components of the data defining the positions of the vertices defining the polygon, to thereby determine components of the positions of the vertices defining the polygon relative to the ray origin.

The polygon intersection testing unit(s) 114 uses the same epsilon scheme (i.e. the same shifting or replacing of values by $\varepsilon_1$ and/or $\varepsilon_2$) as the box intersection testing unit(s) 112 for the ray direction vector, thus ensuring consistent results for rays as they are processed by the box intersection testing unit(s) 112 and then the polygon intersection testing unit(s) 114. Having a consistent approach between the box testing and the polygon testing ensures that the intersection testing module 108 as a whole operates correctly, e.g. it is a way to ensure that if a ray will be found to intersect a polygon then the ray will be found to intersect the box bounding the polygon. If a system does not have a way of ensuring this then rendering errors could be introduced into the images that are rendered by the ray tracing system 100.

For example, the projection in step S904 may be implemented as a 3D dot product which simplifies to a multiply-add with a zero and unital component. For a ray direction with a major axis W and minor axes U and V, the form of the projection of a 3D coordinate $v=(v_U, v_V, v_W)$ onto a 2D coordinate (p, q) on a plane orthogonal to the ray direction is either:

a. $p=D_W v_U - D_U v_W$, simplified to $$v_U - \left(\frac{D_U}{D_W}\right) v_W,$$

and $q=D_W v_V - D_V v_W$, simplified to $$v_V - \left(\frac{D_V}{D_W}\right) v_W,$$

b. $p=D_W v_U - D_U v_W$, simplified to $$\left(\frac{D_W}{D_U}\right) v_U - v_W$$

and $q=D_W v_V - D_V v_W$, simplified to $$\left(\frac{D_W}{D_V}\right) v_V - v_W.$$

The form of these expressions matches the plane tests in the box tester, and matching small non-zero shifts can be applied to the values in the expressions given above for the projection, e.g. a shift of $\varepsilon_1$ can be applied to the components of the ray direction vector ($D_U$, $D_V$ and $D_W$) and a shift of $\varepsilon_2$ can be applied to the components of the 3D coordinate ($v_U$, $v_Y$ and $v_W$).

In step S906 the polygon intersection testing unit(s) 114 of the intersection testing module 108 uses, for each edge of the convex polygon defined by two of the projected vertices, a particular comparison operation to determine a sign of a signed parameter. For example, the comparison operation may be performed by the comparison operation logic 1182, which is implemented in fixed function circuitry as described above. In particular, the comparison operation may be configured to perform an operation referred to herein as a "2D cross product" on the positions of the two projected vertices defining the edge and to determine the sign of the result. For example, the 2D cross product, $f(v_i,v_j)$, of the positions of the two projected vertices, $v_i$ and $v_j$, defining an edge of the polygon, is defined as $f(v_i,v_j)=p_i q_j - q_i p_j$, where $p_i$ and $q_i$ are components of the projected vertex $v_i$ along the respective axes of the pair of axes (P and Q), and where $p_j$ and $q_j$ are components of the projected vertex $v_j$ along the respective axes of the pair of axes (P and Q). The comparison operation can be performed as described above in relation to the methods 300, 400 and/or 500 shown in FIGS. 3, 4 and/or 5.

FIG. 10 illustrates the two polygons 804 and 806 shown in FIG. 8 when they have been projected onto the pair of axes aligned with the basis vectors P and Q (i.e. the second and third basis vectors of the ray coordinate system). In this projection, the ray is at the origin and directed into the page, i.e. the components of the ray direction vector along the P and Q axes are zero. Therefore the intersection position 808 representing the intersection of the ray with the polygon 804 is at the origin in FIG. 10. FIG. 10 indicates that the orientations of the two polygons 804 and 806 both appear as clockwise (as in FIG. 8), as determined by the ordering of the vertices in the ordered sets of vertices defining the polygons.

Each edge of a convex polygon is defined by two of the projected vertices. For example polygon 804 shown in FIG. 10 has a first edge defined by the projected vertices $v_0$ and $v_1$, a second edge defined by the projected vertices $v_1$ and $v_2$, and a third edge defined by the projected vertices $v_2$ and $v_0$. Similarly, polygon 806 shown in FIG. 10 has a first edge defined by the projected vertices $v_1$ and $v_3$, a second edge defined by the projected vertices $v_3$ and $v_2$, and a third edge defined by the projected vertices $v_2$ and $v_1$. The edge between projected vertices $v_1$ and $v_2$ is shared between polygons 804 and 806.

In step S906 the polygon testing unit(s) 114 of the intersection testing module 108 determines, for each edge of the polygon 804, a parameter, w, which is indicative of which side of the edge the ray passes on. For example, w may be a signed parameter which is determined as $w=f(v_i, v_j)=p_i q_j-q_i p_j$, wherein this operation is referred to herein as a "2D cross product". As described above, the projected vertex $v_i$ has components $p_i$ and $q_i$ along the respective P and Q axes, and where the projected vertex $v_j$ has components $p_j$ and $q_j$ along the respective P and Q axes. The sign of w for the edge of the polygon indicates whether the ray passes on the left or the right of that edge. The signs of w for respective edges of the polygon are output from the comparison operation logic 118$_2$ for use in the polygon intersection testing unit(s) 114 of the intersection testing module 108 to determine whether the ray 802 intersects the polygon 804.

In step S908 the polygon intersection testing unit(s) 114 of the intersection testing module 108 determines whether the ray 802 intersects the polygon 804 based on the signs of the w parameters determined for the edges of that polygon. For example, if the w parameters determined for the edges of the polygon 804 all have the same sign then it is determined that the ray intersects the polygon 804; whereas if it is not the case that the w parameters determined for the edges of the polygon 804 all have the same sign then it is determined that the ray does not intersect the polygon 804. In this way, step S908 comprises using the parameters determined for the edges of the convex polygon to determine whether the ray passes on the inside of the edges of the convex polygon, wherein it is determined that the ray intersects the convex polygon if it is determined that the ray passes on the inside of all of the edges of the convex polygon, and wherein it is determined that the ray does not intersect the convex polygon if it is determined that the ray passes on the outside of one or more of the edges of the convex polygon. So in some examples, as soon as an edge test indicates that the ray passes on the outside of an edge of a polygon, then a determination can be made that the ray does not intersect the polygon, without necessarily performing the edge tests for all of the edges of the polygon. It is noted that a ray can be determined to miss degenerate polygons (i.e. projected polygons with zero area) even though the signs of the w parameters may be the same for all of the edges of a degenerate polygon. The 2D cross products, f, are zero for all of the edges of a degenerate polygon intersected by a ray. In some examples, if $f=\pm 0$ for all of the edges of a polygon then a 'miss' can be determined for the polygon, irrespective of the signs of the 2D cross products, i.e. irrespective of whether they are +0 or −0. In some examples, some degenerate polygons may be determined by checking that there are a sufficient number of duplicate 3D vertices (e.g., one or more for a triangle primitive, two or more for a quad etc.), or that there are a sufficient number of duplicate 2D projected vertices (e.g., one or more for a triangle, two or more for a quad etc.). In some examples, degenerate polygons may be (early) culled, i.e. before the signs of the w parameters are determined for the edges of the polygon. In some examples, if a convex polygon of higher order than a triangle is determined non-degenerate, then the w parameter signs of all edges whose 2D projected endpoints are equal are omitted from the intersection logic (i.e., when checking that all signs are equal).

In some examples, the signed parameter, w, for an edge equals the 2D cross product for the edge. In the example shown in FIG. 10, the 2D cross product for the first edge of polygon 804 defined by vertices $v_0$ and $v_1$ is given by $f(v_0, v_1)=p_0q_1-q_0p_1$, and it will be appreciated by considering FIG. 10 that this is a negative value. For a polygon with a clockwise orientation as viewed in the PQ plane given its winding order of $(v_0,v_1v_2)$ (as indicated in FIG. 10), a negative nonzero value for the 2D cross product for an edge indicates that the ray may pass on the inside of the convex polygon, as the ray passes on the right of the edge (with respect to the direction of the edge); whereas a positive non-zero value for the 2D cross product for an edge indicates that the ray does pass on the outside of the convex polygon, as the ray passes on the left of the edge (with respect to the direction of the edge). Conversely, for a polygon with an anticlockwise orientation as viewed in the PQ plane resulting from an alternative winding order of $(v_0,v_2v_1)$ (not shown in FIG. 10) a negative non-zero value for the 2D cross product for an edge indicates that the ray does pass on the outside of the convex polygon, as the ray passes on the right of the edge (with respect to the direction of the edge), whereas a positive non-zero value for the 2D cross product for an edge indicates that the ray may pass on the inside of the convex polygon, as the ray passes on the left of the edge (with respect to the direction of the edge). The 2D cross product for the second edge of polygon 804 defined by vertices $v_1$ and $v_2$ is given by $f(v_1,v_2)=p_1q_2-q_1p_2$, and it will be appreciated by considering FIG. 10 that this is a negative value, thereby indicating that the ray may pass on the inside of the convex polygon, as the ray passes on the right of the second edge (with respect to the direction of the edge). The 2D cross product for the third edge of polygon 804 defined by vertices $v_2$ and $v_0$ is given by $f(v_2, v_0)=p_2q_0-q_2p_0$, and it will be appreciated by considering FIG. 10 that this is a negative value, thereby indicating that the ray may pass on the inside of the convex polygon, as the ray passes on the right of the third edge (with respect to the direction of the edge). Having checked all three edges of the convex polygon 804 the w parameters, which are based on the 2D cross products, have the same sign (in particular they are all negative), so the ray is determined to pass on the inside and intersect the polygon 804. It can be seen that the intersection point 808 is within the polygon 804 with a clockwise orientation as viewed.

The 2D cross product for the first edge of polygon 806 defined by vertices $v_1$ and $v_3$ is given by $f(v_1,v_3)=p_1q_3-q_1p_3$, and it will be appreciated by considering FIG. 10 that this is a negative value. Polygon 806 has a clockwise orientation as viewed given its winding, so the ray may pass on the inside of the convex polygon, as the ray passes on the right of the first edge of polygon 806 defined by vertices $v_1$ and $v_3$ (with respect to the direction of the edge). The 2D cross product for the second edge of polygon 806 defined by vertices $v_3$ and $v_2$ is given by $f(v_3,v_2)=p_3q_2-q_3p_2$, and it will be appreciated by considering FIG. 10 that this is a negative value, thereby indicating that the ray may pass on the inside of the convex polygon, as the ray passes on the right of the second edge (with respect to the direction of the edge). The 2D cross product for the third edge of polygon 806 defined by vertices $v_2$ and $v_1$ is given by $f(v_2,v_1)=p_2q_1-q_2p_1$, and it will be appreciated by considering FIG. 10 that this is a positive value, thereby indicating that the ray does pass on the outside of the convex polygon, as the ray passes on the left of the third edge (with respect to the direction of the edge). Therefore, it is not the case that the w parameters, which are based on the 2D cross products, for all of the edges of polygon 806 have the same sign. In particular, the w parameters, which are based on the 2D cross products, for the first and second edges of polygon 806 are negative, whilst the w parameter, which is based on the 2D cross product, for the third edge of polygon 806 is positive. Therefore, the ray is determined to not intersect the polygon 806. It can be seen that the intersection point 808 is outside the polygon 806.

By using the comparison operations described above with reference to FIGS. 3, 4 and/or 5 to perform the 2D cross products, floating point values of zero and/or infinity are either replaced or shifted such that the comparison operation logic 1182 does not need to have exception handling to handle floating point values of zero or infinity. This can reduce the complexity, size, latency and power consumption of the intersection testing module 108.

Following step S908 the method passes to step S910 in which the polygon testing unit(s) 114 of the intersection testing module 108 outputs an indication of the result of the determination of whether the ray 802 intersects the polygon 804. This indication could be a binary indication (e.g. a one-bit flag) to indicate either a 'hit' or a 'miss' of the ray in respect of the polygon. In other examples, the indications could have different forms.

In step 6912, the outputted indication is used in the ray tracing system 100 (e.g. by the processing logic 110) for rendering an image of a 3D scene. For example, as well as the indication that the ray intersects a polygon, the polygon intersection testing unit(s) 114 of the intersection testing module 108 can determine an intersection distance (i.e. a distance between the ray origin and the point at which the ray intersects the polygon), and an indication of the position on the polygon at which the ray intersects it (e.g. defined in barycentric coordinates), and this information can be output to the processing logic 110. Intersection distances may be calculated in terms of ray lengths rather than actual Euclidean distances, e.g. by dividing the Euclidean distance result by the length (magnitude) of the ray direction. In a further example, the length of the ray may have been divided through by a factor of $|D_z|$ or $D_z$ before input to the polygon intersection testing unit(s) 114, but the intersection distance is to be determined in terms of the number of unscaled ray-lengths from the ray origin. In this case, with a rescaled ray, the intersection distance in ray lengths will overcount by a factor of $|D_z|$ or $D_z$. Therefore, the result can be rescaled by the reciprocal of $|D_z|$ or $D_z$ in order to determine the correct number of unscaled ray lengths. The magnitudes of the w parameters for the different edges of a polygon that the ray is determined to intersect are used for determining the barycentric coordinates. A skilled person would be aware of methods of determining the intersection distance and the barycentric coordinates, and further details about how intersection distances and barycentric coordinates may be determined are beyond the scope of the present disclosure. The extended exponent range used in the cross products (which may be used to determine the barycentric areas) is reduced back down to the (normal) exponent range of the output format, e.g. using a rounding operation, before the values are output from the intersection testing module 108.

As described above, it is important that intersection testing of rays with convex polygons is watertight, meaning that if a ray intersects a point on a shared edge or shared vertex, i.e. with equal world/instance space coordinates, of multiple convex polygons, within the interior of the object's silhouette from the perspective of the ray, then the ray is determined to intersect at least one of the polygons which share the edge or vertex. Furthermore, it is desirable for the intersection testing to be non-redundantly watertight, meaning that if a ray intersects a point on a shared edge or shared vertex of multiple convex polygons then the ray is determined to intersect one, and only one, of the polygons which share the edge or vertex. Using intersection testing which is watertight avoids errors (which may be referred to as "rendering artifacts") in the rendered image. Using intersection testing which is non-redundantly watertight avoids further errors in the rendered image, as well as reducing overdraw. In the examples described herein the vertices of the convex polygons are projected onto a pair of axes orthogonal to the ray direction, wherein the origin of the pair of axes corresponds with the ray origin. In this way, the intersection testing process for testing whether a ray intersects a convex polygon in a 3D scene is reduced to a 2D problem.

If the ray intersects a point on an edge of a polygon, the 2D cross product ($f(v_i,v_j)=p_iq_j-q_ip_j$) of the positions of two projected vertices ($v_i$ and $v_j$) defining the edge has a magnitude of zero. A situation like this is shown in FIG. 11, which shows a ray intersecting a point 1108 on an edge 1106 that is shared between two polygons 1102 and 1104. FIG. 11 indicates the orientations of the two polygons, i.e. both polygons 1102 and 1104 have a clockwise orientation as viewed from the ray origin. Another situation like this is shown in FIG. 12 in which the ray intersects a vertex shared by multiple polygons. In particular, FIG. 12 shows a ray intersecting a vertex $v_2$ that is shared between five polygons 1202, 1204, 1206, 1208 and 1210. FIG. 12 indicates the orientations of the five polygons as viewed from the ray origin, i.e. they all have a clockwise orientation.

If the ray intersects a point on a shared edge, or if the ray intersects a shared vertex, which is shared by multiple polygons then, in order for the intersection testing process to be "non-redundantly watertight", the polygon intersection testing unit(s) 114 should determine that the ray intersects a single one of the polygons. If the intersection testing process is not watertight, i.e. none of the polygons sharing an edge or a vertex is hit, then rendering errors may be introduced into the rendered images, such as cracks in geometry, which is not desirable.

The comparison operation methods described with reference to FIGS. 3, 4 and/or 5 can be useful in addressing the watertightness issue in intersection testing. In particular, the positions of the vertices can be shifted by a tiny amount (ε) so that it is no longer possible for any point to land exactly on the boundary of a polygon. In this way, we avoid watertightness issues by avoiding zero cases, i.e. by avoiding situations in which $f(v_i,v_j)=0$.

The tiny amount (ε) by which the vertices are shifted is a 2D vector with components along the P and Q axes. As shown as an example in FIG. 13, ε has (positive) components $\varepsilon_1$ and $\varepsilon_2$ along the P and Q axes respectively. There are eight options for the ε vector, i.e. $\varepsilon=(\varepsilon_1, \varepsilon_2)$, $\varepsilon=(\varepsilon_1,-\varepsilon_2)$, $\varepsilon=(-\varepsilon_1, \varepsilon_2)$, $\varepsilon=(-\varepsilon_1, -\varepsilon_2)$, $\varepsilon=(\varepsilon_2,\varepsilon_1)$, $\varepsilon=(\varepsilon_2, -\varepsilon_1)$, $\varepsilon=(-\varepsilon_2,\varepsilon_1)$ and $\varepsilon=(-\varepsilon_2, -\varepsilon_1)$. In the examples described herein the first of these options is chosen (i.e. $\varepsilon=(\varepsilon_1,\varepsilon_2)$) but in other implementation any one of the eight options given above may be chosen. Therefore, if the projected vertices $v_i$ and $v_i$ have components $v_i=(p_i, q_i)$ and $v_i=(p_j, q_j)$, then once they have been shifted by the vector ε, the position of the first projected vertex $v_i$ has coordinates $(p_i+\varepsilon_1, q_i+\varepsilon_2)$, and the second projected vertex $v_j$ has coordinates $(p_j+\varepsilon_1, q_j+\varepsilon_2)$. The shift can be described as $$v_n \mapsto v_n + \begin{pmatrix} \varepsilon_1 \\ \varepsilon_2 \end{pmatrix}.$$

As described above, in examples in which all of the input values have the same input format $$|\varepsilon_1| < \left|\frac{f_L^2}{f_U}\right| \text{ and } |\varepsilon_2| < |\varepsilon_1|\left|\frac{f_L}{f_U}\right|,$$

wherein $f_L$ is the minimum non-zero magnitude that is representable using the input format, and $f_U$ is the maximum finite magnitude that is representable using the input format. The shifted positions of the two projected vertices are used in the 2D cross product. As described above, $\varepsilon_1$ is any value small enough to behave like zero in the 2D cross product $f(v_i,v_j)$ if the other values are representable in the input format, and $\varepsilon_2$ is small enough to behave like zero in the 2D cross product, even relative to $\varepsilon_1$. The value of $\varepsilon_2$ is so much smaller than $\varepsilon_1$ that the direction of the vector ε is not parallel to any polygon edge which is representable by vertices with components in the input format.

The particular comparison operations described herein involve comparing the result of a first multiplication of two floating point values with the result of a second multiplication of two floating point values, i.e. they involve determining whether ab<cd or whether ab−cd<0, e.g. where $a=p_i$, $d=q_i$, $c=p_j$ and $b=q_j$. For this particular comparison operation, ignoring sign, we want to preserve the property that 0*b<c*d for positive b, c and d if we replace the zero with $\varepsilon_1$. In other words, as far as these edge tests are concerned, we don't want there to exist some combination of non-zero, finite values for b, c and d which are representable in the input form for which the result differs between 0 and the substitute floating point value $\varepsilon_1$. Given that (finite non-zero) floating point values have a lower and upper bound, we can just require that $\varepsilon_1 b<cd$ for any representable values of b, c and d, and a finite value exists for $\varepsilon_1$. As described above, the magnitude of that finite value has an upper limit, which is $$|\varepsilon_1| < \left|\frac{f_L^2}{f_U}\right|.$$

The vector $$\begin{pmatrix} \varepsilon_1 \\ \varepsilon_2 \end{pmatrix}$$

has been chosen so as not to be parallel with any definable vector within the representable interval using the input format. Because $\varepsilon_2$ appears in the vector $$\begin{pmatrix} \varepsilon_1 \\ \varepsilon_2 \end{pmatrix},$$

the stress cases involving $\varepsilon_2$ are necessarily of the form $\varepsilon_2$*a<$\varepsilon_1$*d or $\varepsilon_2$*a−$\varepsilon_1$*d<0, so a value for $e_2$ is chosen such that $|\varepsilon_2||a|<|\varepsilon_1||d|$ for any representable values of a and d in the input format. Therefore, as described above, in an example in which all of the values have the same input format, the magnitude of $\varepsilon_2$ has an upper limit, which is $$|\varepsilon_2| < |\varepsilon_1|\left|\frac{f_L}{f_U}\right|.$$

As described above, this ensures that the vector $$\begin{pmatrix} \varepsilon_1 \\ \varepsilon_2 \end{pmatrix}$$

is not parallel to a representable vector, so if a point lands on an edge, the shift does not shift the point along that edge.

It will be apparent that if the particular comparison operation had a different form then the upper limits on the magnitudes of $\varepsilon_1$ and $\varepsilon_2$ may be different. The values of $\varepsilon_1$ and $\varepsilon_2$ are necessarily outside of the range of representable values in the input format. If denormal numbers are allowed in the input format, then the upper limits on the magnitudes of $\varepsilon_1$ and $\varepsilon_2$ will be lower.

As described above, in some examples, the different values in the comparison operation (e.g. $p_i$, $q_i$, $p_j$ and $q_j$ in this case) might not all have the same format, and they might have other bounds placed upon them which are not due to their format. For example, for a first type of value, e.g. the p component values, the value of $\varepsilon_1$ may have a magnitude that is less than $$\left|\frac{p_{min} q_{min}}{q_{max}}\right|$$

wherein $p_{min}$ is the minimum non-zero magnitude that the p components may take, $q_{min}$ is the minimum non-zero magnitude that the q components may take, and $q_{max}$ is the maximum finite magnitude that the q components may take. For example, if the p and q components have the same input format and can take any value that is representable in the input
format then $$|\varepsilon_1| < \left|\frac{f_L^2}{f_U}\right|$$

as described above. For a second type of value, e.g. the q component values, the value of $\varepsilon_2$ may have a magnitude that is less than $$|\varepsilon_1|\left|\frac{q_{min}}{p_{max}}\right|$$

wherein $p_{max}$ is the maximum finite magnitude that the p components may take. For example, if the p and q components have the same input format and can take any value that is representable in the input format then $$|\varepsilon_2| < |\varepsilon_1|\left|\frac{f_L}{f_U}\right|$$

as described above.

The exponent range can be extended multiple times to allow smaller and smaller epsilon values to continue to be added for subsequent comparison operations. For example, an $\varepsilon_n$ value could be added, where n>1, which will behave like zero in the comparison operations compared to any representable values and any $\varepsilon_m$ values, where m<n, if $$|\varepsilon_n| < |\varepsilon_{n-1}|\left|\frac{f_L}{f_U}\right|.$$

This is an example in which all of the input values have the same input format. An alternative way of conceptualising this is to treat each iteration as a promotion of previous epsilon values such that they are included in the normal range of representable value (e.g. so that $f_L$ becomes $\varepsilon_{n-1}$ when defining $\varepsilon_n$). The polygon intersection tester provides an example of this when, as described above, epsilon values are used in the definition of the ray direction vector (for consistency with the box tester); the upper and lower bounds of the inputs to the edge tests thus depend on the extended range as implied by the inclusion of these epsilon (which can alternatively be seen in that the values for p and q use extended exponent formats to be represented without loss of range).

In some examples, all of the components of the vertices may be shifted in this manner. In these examples, this removes all situations in which $f(v_i,v_j)=0$, and thereby solves the watertightness issue. In other words, where polygons share one or more vertices, and if the ray would, without the shifting or replacing of the vertices as described herein, have intersected a shared edge or vertex, then the ray will now be determined to intersect a single one (i.e. one and only one) of the polygons sharing the edge or vertex. For example, with the epsilon vector defined as $\varepsilon=(\varepsilon_1,\varepsilon_2)$, with $\varepsilon_1>>\varepsilon_2$, such that the vertices are shifted predominantly towards the positive p direction, the primitive 1102 will be intersected in the example shown in FIG. 11 (i.e. primitive 1104 will not be intersected) and the primitive 1202 will be intersected in the example shown in FIG. 12 (i.e. primitives 1204, 1206, 1208 and 1210 will not be intersected). Therefore, the intersection testing will be watertight, and cracks will not appear in the geometry due to the intersection testing, and additionally the intersection testing will be non-redundantly watertight as the polygons only overlap on their shared edges and vertices, which are avoided. Furthermore, the shifts in the positions of the vertices are so small, that they will not cause any perceptible alteration to the rendered images. The same intersections (i.e. primitives 1102 and 1202) would be found in the examples shown in FIGS. 11 and 12 if $\varepsilon=(\varepsilon_1,-\varepsilon_2)$. If $\varepsilon=(-\varepsilon_1,\varepsilon_2)$ or $\varepsilon=(-\varepsilon_1,-\varepsilon_2)$, with $\varepsilon_1>>\varepsilon_2$, then the vertices are shifted predominantly towards the negative p direction, such that the primitive 1104 will be intersected in the example shown in FIG. 11 (i.e. primitive 1102 will not be intersected) and the primitive 1206 will be intersected in the example shown in FIG. 12 (i.e. primitives 1202, 1204, 1208 and 1210 will not be intersected). If $\varepsilon=(\varepsilon_2,\varepsilon_1)$ or $\varepsilon=(-\varepsilon_2,\varepsilon_1)$, with $\varepsilon_1>>\varepsilon_2$, then the vertices are shifted predominantly towards the positive q direction, such that the primitive 1102 will be intersected in the example shown in FIG. 11 (i.e. primitive 1104 will not be intersected) and the primitive 1210 will be intersected in the example shown in FIG. 12 (i.e. primitives 1202, 1204, 1206 and 1208 will not be intersected). If $\varepsilon=(\varepsilon_2,-\varepsilon_1)$ or $\varepsilon=(-\varepsilon_2,-\varepsilon_1)$, with $\varepsilon_1>>\varepsilon_2$, then the vertices are shifted predominantly towards the negative q direction, such that the primitive 1104 will be intersected in the example shown in FIG. 11 (i.e. primitive 1102 will not be intersected) and the primitive 1204 will be intersected in the example shown in FIG. 12 (i.e. primitives 1202, 1206, 1208 and 1210 will not be intersected).

When the positions of two vertices $v_i$ and $v_j$ are shifted by the vector $$\varepsilon = \begin{pmatrix}\varepsilon_1\\ \varepsilon_2\end{pmatrix},$$

then the 2D cross product function becomes:

$$f(v_i,v_j)=(p_i+\varepsilon_1)(q_j+\varepsilon_2)-(q_i+\varepsilon_2)(p_j+\varepsilon_1)=p_iq_j-q_ip_j+p_i\varepsilon_2+\varepsilon_1q_j-q_i\varepsilon_1-\varepsilon_2p_j \quad (1)$$

Since $0<\varepsilon_2<<\varepsilon_1<<f_L$, if $p_iq_j-q_ip_j\neq0$ then $f(v_i,v_j)\cong p_iq_j-q_ip_j$ and the epsilon terms are negligible. If $p_iq_j-q_ip_j=0$ then $f(v_i,v_j)\cong\varepsilon_1q_j-q_i\varepsilon_1$ and the terms involving $\varepsilon_2$ are negligible, unless $q_i=q_j=0$. For $q_i\neq0$ or $q_j\neq0$ it is noted that for a ray to intersect with an edge or vertex, i.e., edge endpoint (e.g. as shown in FIG. 11 and FIG. 12), it is necessary (but not sufficient) that either: (i) the signs of the q components of the two vertices defining the edge are different, or (ii) at least one of the q components of the two vertices defining the edge is zero. Therefore in this case (i.e. for $q_i\neq0$ or $q_j\neq0$), and for a ray that intersects an edge or vertex, $\varepsilon_1q_j-q_i\varepsilon_1\neq0$. If $q_i=0$ and $q_j=0$, and hence $p_iq_j-q_ip_j=0$ and $\varepsilon_1q_j-q_i\varepsilon_1=0$, then $f(v_i,v_j)\cong p_i\varepsilon_2-\varepsilon_2p_j$. For $q_i=0$ and $q_j=0$, and $p_i\neq0$ or $p_j\neq0$ it is noted that for a ray to intersect with an edge or vertex, i.e. edge endpoint (e.g. as shown in FIG. 11 and FIG. 12), it is necessary (but not sufficient) that either: (i) the signs of the p components of the two vertices defining the edge are different, or (ii) at least one of the p components of the two vertices defining the edge is zero. Therefore in this case (i.e. for $q_i=0$ and $q_j=0$, and $p_i\neq0$ or $p_j\neq0$), and for a ray that intersects an edge, $p_i\varepsilon_2-\varepsilon_2q_j\neq0$. In examples in which the polygon is a triangle having three vertices, an edge defined by two distinct vertices which are both at the origin, i.e. $q_i=0$, $q_j=0$, $p_i=0$ and $p_j=0$, is part of a triangular polygon which has zero projected area from the viewpoint of the ray and hence is degenerate, and so can be culled. Else, no edges of triangular polygons (with non-zero projected area) have all three of: (i) $p_iq_j-q_ip_j=0$, (ii) $\varepsilon_1q_j-q_i\varepsilon_1=0$, and (iii) $p_i\varepsilon_2-\varepsilon_2p_j=0$, and as such, no edge of a triangular polygon (with non-zero projected area) has a 2D cross product function given in equation (1) of exactly zero. In the general case, for non-triangular strictly convex polygons, having n>3 vertices, any polygon with more than (n−3) zero length edges will have zero projected area from the viewpoint of the ray and hence is degenerate, and so can be culled. Else, the above does not hold (i.e., that no edge of the strictly convex polygon satisfies all three of (i), (ii), and (iii)) if the polygon possesses zero length edges prior to projection, but these edges may be readily identified and excluded from the intersection determination, and as such, no remaining edge (of nonzero length) of a strictly convex polygon (with non-zero projected area) has a 2D cross product function given in equation (1) of exactly zero. As such, using the 2D cross product function given in equation (1) to determine the signed parameter w will provide a non-redundant watertight intersection testing process.

However, in some other examples, if an input floating point value (e.g. a vertex component) is non-zero, then it is not shifted. Instead, only input floating point values of zero, or infinity, are altered. In particular, floating point values of zero are replaced with non-zero substitute floating point values (e.g. as described with reference to the method 300 shown in FIG. 3) and/or floating point values of infinity are replaced with finite substitute floating point values (e.g. as described with reference to the method 400 shown in FIG. 4). In this way, the tiny shifts are not applied to non-zero, finite floating point values for which the magnitude of the shift might be insignificant relative to the magnitude of the non-zero value. This can simplify the configuration of the fixed function circuitry of the comparison operation logic 118. For example, floating point values of zero can be replaced with non-zero substitute floating point values and/or floating point values of infinity can be replaced with finite substitute floating point values in a pre-processing stage, away from the critical path, in the comparison operation logic 118. This removes infinities, and zero inputs, so there are fewer exceptions to handle. This results in a simplified floating point architecture with a lower latency of operation because shifts do not need to be applied in the critical path.

For example, if either of the components $p_i$ or $p_j$ is zero then it may be replaced (e.g. in a pre-processing stage) with a first non-zero substitute floating point value, $\varepsilon_1$, which has a magnitude that is less than $$\left|\frac{f_L^2}{f_U}\right|;$$

and if either of the components $q_i$ or $q_j$ is zero then it may be replaced with a second non-zero substitute floating point value, $\varepsilon_2$, which has a magnitude that is less than $$|\varepsilon_1|\left|\frac{f_L}{f_U}\right|.$$

Many of the situations in which a ray intersects an edge of a polygon arise because at least one of the components of the projected vertices defining the edge are zero. Replacing these zeros with the non-zero substitute floating point values will, in these cases, avoid finding that $f(v_i,v_j)=0$, and will therefore address the watertightness issue. However, it is possible to find that $f(v_i,v_j)=0$ even if none of the components of the projected vertices defining the edge are zero. Therefore, if only the component values of zero are shifted (i.e. if non-zero components are not shifted) then this case of $f(v_i,v_j)=0$ may be handled as an exception. For example, if the comparison operation logic $\mathbf{118}_2$ determines that $f(v_i,v_j)=0$ then the sign of the signed parameter (w) can be set to match the sign of a predetermined one of the floating point values used in the 2D cross product. For example, the sign of w may be set to be equal to the sign of $q_j$ (i.e. the sign of the q component of the second vertex), or the inverse of the sign of $q_i$ (i.e. the inverse of the q component of the first vertex). For a strictly convex polygon, since $f(v_i,v_j)=0$ then the sign of the q components of the two vertices defining the edge must be different (i.e. the edge must cross the P axis) for the ray to intersect the polygon. In other words, $\mathrm{sgn}(q_i)\neq\mathrm{sgn}(q_j)$. It is noted that for this type of edge of a strictly convex polygon (i.e. which has $f(v_i,v_j)=0$ and $p_i\neq0$, $q_i\neq0$, $p_j\neq0$ and $q_j\neq0$) it is also true that $\mathrm{sgn}(p_i)\neq\mathrm{sgn}(p_j)$, so if the relative magnitudes of $\varepsilon_1$ and $\varepsilon_2$ are swapped then the scheme can work by setting the sign of w to be equal to the sign of $p_j$ (i.e. the sign of the p component of the second vertex), or the inverse of the sign of $p_i$ (i.e. the inverse of the p component of the first vertex). A strictly convex polygon is a convex polygon having no two adjacent edges with an angle of π radians between them. Nondegenerate triangular primitives are always strictly convex. As an example, in FIG. 11 the shared edge 1106 crosses exactly through the origin but none of the component values of the vertices $v_1$ and $v_2$ are zero, and it can be appreciated that the signs of $q_1$ and $q_2$ are different, i.e. $q_1$ is positive whilst $q_2$ is negative. For polygon 1102, the edge 1106 is defined from $v_1$ to $v_2$, so the sign of w may be set to be equal to the sign of $q_2$ (e.g. negative in the example shown in FIG. 11); whereas, for polygon 1104, the edge 1106 is defined from $v_2$ to $v_1$, so the sign of w may be set to be equal to the sign of $q_1$ (e.g. positive in the example shown in FIG. 11). Therefore, different signs of w are found for the edge 1106 in the two polygons 1102 and 1104, so the ray will be determined to intersect one, and only one, of polygons 1102 and 1106 in the example shown in FIG. 11, so non-redundant watertightness is ensured. For a strictly convex polygon, the correct sign of f for the situations in which f=0 (i.e. a "cancellation" situation) is important only on genuine edge intersection, i.e. when the ray genuinely does intersect the edge. If cancellation occurs for a non-intersecting strictly convex polygon, then either (i) at least two of the remaining edges will have opposite signs for f such that the ray is determined to miss the polygon, or (ii) the projected polygon itself will be degenerate, and in both of these cases the ray is not determined to intersect the polygon.

Having exception handling logic to handle the situation in which $f(v_i,v_j)=0$ may add to the complexity and size of the comparison operation logic 118, but it ensures that the intersection testing is non-redundantly watertight, whilst also allowing the comparison operation logic 118 to not shift non-zero finite floating point values. The trade-off of whether the downside of including the exception handling logic outweighs the upside of not shifting non-zero finite floating point values is an implementation choice, which may be different in different examples. However, it is noted that a standard (singly rounded, i.e., with no intermediate rounding) floating point two-dimensional dot product (DP2) architecture has to test for exact cancellation so that it can output a value of zero rather than the result of the mantissa subtraction with an exponent of the maximum magnitude term offset by the required normalisation. When the result is zero the DP2 architecture makes a choice for the sign of zero. This choice can be made to be equal to the sign of one of the inputs with no additional cost to the normal floating point architecture. In particular, the output can be simplified by selecting the sign of one of the inputs (rather than a more complicated expression enumerating the cases involving zero at the inputs). Therefore, this example provides a simple replacement scheme for zeros at inputs (which can be preloaded as in the other cases) and zeros at output (by simply choosing the sign from a fixed input component).

In the example shown in FIG. 2, the floating point values are received in a single-precision format which uses 32 bits to represent a floating point value. The number of bits, e, indicating an exponent according to the input format is 8. As mentioned above, in a standard single-precision floating point format, the exponent bias of the input floating point values is 127. Denormal numbers (including zero) and infinity are represented with exponents of 00000000 and 11111111 respectively, so the range of normal numbers that can be represented have exponents between −126 and +127. It is noted that NaN values are also represented with exponents of 11111111, but these NaN values are invalidated at the earliest opportunity so they can be neglected from then on. The significand for normal numbers is in the range [1,2), so the magnitude of each representable value v, is in the range (excluding denormals) $2^{-126} \leq |v| < \mathbf{2}^{128}$. As described in examples above, $$|\varepsilon_1| < \left|\frac{f_L^2}{f_U}\right|,$$

so $|\varepsilon_1|$ can be set as a value less than $$\frac{(2^{-126})^2}{2^{128}} = 2^{-380}$$

in this example. Furthermore, as described in examples above, $$|\varepsilon_2| < |\varepsilon_1|\left|\frac{f_L}{f_U}\right|,$$

so $|\varepsilon_2|$ can be set as a value less than $$|\varepsilon_1|\frac{2^{-126}}{2^{128}} = |\varepsilon_1| \times 2^{-254}$$

in this example. There is freedom to choose any values for $|\varepsilon_1|$ and $|\varepsilon_2|$ which satisfy these upper bounds on $|\varepsilon_1|$ and $|\varepsilon_2|$. Some values may be simpler to encode than others. As an example, the magnitudes of $\varepsilon_1$ and $\varepsilon_2$ can be set as $|\varepsilon_1| = 2^{-512+128} = 2^{-384}$ and $|\varepsilon_2| = 2^{-512-128} = 2^{-640}$. In this example, the smallest value that needs to be representable with the extended exponent range is $2^{-640}$ and the largest value that needs to be representable with the extended exponent range is less than $2^{128}$, e.g. the largest value that needs to be representable with the extended exponent range in this example is $2^{128} - 2^{128-24} = 2^{128} - 2^{104}$. If 11 exponent bits are used (i.e. if $e_{ext}=11$ as shown in FIG. 2*b*) and if the exponent range is extended symmetrically about zero then the exponent bias for the extended exponent range will be 1023. Exponent values of 00000000 and 11111111 may still be reserved for denormal numbers (including zero) and infinity respectively, so the range of normal numbers that can be represented have exponents between −1022 and +1023. The significand for normal numbers is in the range [1,2), so the magnitude of each finite representable value, v, with the extended exponent range in this example is in the range (excluding denormals) $2^{-1022} \leq |v| < 2^{1024}$. Therefore the values of $\varepsilon_1$ and $\varepsilon_2$ (which are $2^{-384}$ and $2^{-640}$ respectively) are representable with the extended exponent range having 11 exponent bits.

If $e_{ext}=10$, and if the exponent range is extended symmetrically about zero then the exponent bias for the extended exponent range will be 511. Exponent values of 00000000 and 11111111 may still be reserved for denormal numbers (e.g. zero) and infinity respectively, so the range of normal numbers that can be represented have exponents between −510 and +511. The significand for normal numbers is in the range [1,2), so the magnitude of each finite representable value v, with the extended exponent range in this example is in the range (excluding denormals) $2\text{–}510 \leq |v| < 2^{512}$. Therefore the value of $\varepsilon_1$ (which is $2^{-384}$) is representable with the extended exponent range having 10 exponent bits in this example, but the value of $\varepsilon_2$ (which is $2^{-640}$) is not representable with the extended exponent range having 10 exponent bits in this example.

However, it can be appreciated in the example given in the preceding paragraph that the extended exponent range extends the exponents in the positive direction, such that the maximum representable number is just less than $2^{512}$. The maximum finite floating point value that needs to be representable is less than $2^{128}$, so there is a large range of numbers that are representable with the extended exponent range, but which may never be used. As such, in some examples, the exponent bias may be set so that the exponent range is extended asymmetrically about zero. For example, if $e_{ext}=10$, the exponent bias for the extended exponent range may be set to be 767. It is noted that 767=512+256−1, so it is simple to represent in binary. This exponent bias will extend the exponent range asymmetrically about zero such that the range of normal numbers that can be represented have exponents between −766 and +255. The significand for normal numbers is in the range [1,2), so the magnitude of each finite representable value, v, with the extended exponent range in this example is in the range (excluding denormals) $2^{-766} \leq |v| < 2^{256}$. Therefore the values of $\varepsilon_1$ and $\varepsilon_2$ (which are $2^{-384}$ and $2^{-640}$ respectively) are representable with the extended exponent range having 10 exponent bits and with an exponent bias of 767. It is also noted that the maximum finite representable input floating point value (bounded by $2^{128}$) is still representable with this example extended exponent range.

We now describe an example in which floating point values of infinity are replaced with finite substitute floating point values $\varepsilon_{1,\infty}$ and $\varepsilon_{2,\infty}$ as described above, in relation to the example shown in FIG. 2, in which the floating point values are received in a single-precision format which uses 32 bits to represent a floating point value. As mentioned above, the number of bits, e, indicating an exponent according to the input format is 8, and the exponent bias is 127, such that the magnitude of each finite representable value, v, is in the range (excluding denormals) $2^{-126} \leq |v| < 2^{128}$. As described above, $$|\varepsilon_{1,\infty}| > \left|\frac{f_U^2}{f_L}\right|,$$

so $|\varepsilon_{1,\infty}|$ can be set as a value greater than $$\frac{(2^{128})^2}{2^{-126}} = 2^{382}$$

in this example. Furthermore, as described above, $$|\varepsilon_{2,\infty}| > |\varepsilon_{1,\infty}|\left|\frac{f_U}{f_L}\right|,$$

so $|\varepsilon_2|$ can be set as a value greater than $$|\varepsilon_{1,\infty}|\frac{2^{128}}{2^{-126}} = |\varepsilon_{1,\infty}| \times 2^{254}$$

in this example. There is freedom to choose any values for $|\varepsilon_{1,\infty}|$ and $|\varepsilon_{2,\infty}|$ which satisfy these lower bounds on $|\varepsilon_1|$ and $|\varepsilon_2|$. Some values may be simpler to encode than others. As an example, the magnitudes of $\varepsilon_{1,\infty}$ and $\varepsilon_{2,\infty}$ can be set as $|\varepsilon_{1,\infty}|=2^{512-128}=2^{384}$ and $|\varepsilon_2|=2^{512+128}=2^{640}$. In this example, the largest value that needs to be representable with the extended exponent range is $2^{640}$ and the smallest value that needs to be representable with the extended exponent range is $2^{-126}$. If 11 exponent bits are used (i.e. if $e_{ext}=11$) and if the exponent range is extended symmetrically about zero then the exponent bias for the extended exponent range will be 1023. The magnitude of each finite representable value, v, with the extended exponent range in this example is in the range (excluding denormals) $2^{-1022}\leq|v|<2^{1024}$. Therefore the values of $\varepsilon_{1,\infty}$ and $\varepsilon_{2,\infty}$ (which are $2_{384}$ and $2^{640}$ respectively) are representable with the extended exponent range having 11 exponent bits.

If $e_{ext}=10$, and if the exponent range is extended symmetrically about zero then the exponent bias for the extended exponent range will be 511. The magnitude of each finite representable value, v, with the extended exponent range in this example is in the range (excluding denormals) $2^{-510}\leq|v|<2^{512}$. Therefore the value of $\varepsilon_{1,\infty}$ (which is $2^{384}$) is representable with the extended exponent range having 10 exponent bits in this example, but the value of $\varepsilon_{2,\infty}$ (which is $2^{640}$) is not representable with the extended exponent range having 10 exponent bits in this example.

However, in some examples, the exponent bias may be set so that the exponent range is extended asymmetrically about zero. For example, if $e_{ext}=10$, the exponent bias for the extended exponent range may be set to be 255. It is noted that 255 is simple to represent in binary. This exponent bias will extend the exponent range asymmetrically about zero such that the range of normal numbers that can be represented have exponents between −254 and +767. The magnitude of each finite representable value, v, with the extended exponent range in this example is in the range (excluding denormals) $2^{254}\leq|v|<2^{768}$. Therefore the values of $\varepsilon_{1,\infty}$ and $\varepsilon_{2,\infty}$ (which are $2^{384}$ and $2^{640}$ respectively) are representable with the extended exponent range having 10 exponent bits and with an exponent bias of 255. It is also noted that the minimum non-zero representable input floating point value ($2^{-126}$) is still representable with this example extended exponent range.

If an implementation is to use both small epsilon values (e.g. $\varepsilon_1$ and/or $\varepsilon_2$) and large epsilon values (e.g. $\varepsilon_{1,\infty}$ and $\varepsilon_{2\varepsilon}$) then in the examples given above the exponent range may be extended by three bits, such that $e_{ext=}11$. It is noted again that with $e_{ext}=11$ then the magnitude of each finite representable value, v, is in the range (excluding denormals) $2^{-1022}\leq|v|<2^{1024}$, and that this range is sufficient to represent all of $\varepsilon_1$, $\varepsilon_2$, $\varepsilon_{1,\infty}$ and $\varepsilon_{2,\infty}$ (which have respective values of $2^{-384}$, $2^{-640}$, $2^{384}$ and $2^{640}$ in the examples given above). It is possible for denormals (including/excluding zero) and infinity (including NANs) to be omitted from the input format, extending our exponent ranges by −1 on the minimum end of the exponent range and by +1 on the maximum end of the exponent range to include exponents of 0 . . . 0 and 1 . . . 1.

If the input floating point values have different formats (e.g. double precision format) then the exponent range will be extended accordingly in those different examples.

In the examples given above, comparison operations are used for intersection testing in a ray tracing system to determine whether a ray intersects a box or a convex polygon. The same principles can be applied, in general, to comparison operations that partition an n-dimensional space using an (n−1)-dimensional hyperplane. With n affinely independent points in the hyperplane (i.e. given any one such point, the remaining points, relative to the first, span the hyperplane), we can use the sign of their determinant to define a partition. When the determinant is zero, we can use the same prescription as here to assign the partition according to the orientation of space.

In the examples given above, an extended exponent range is used so that non-zero, finite epsilon values can be included outside of the representable range of the input floating point values to be used in tie-break situations, e.g. for watertightness tests. In other examples, rather than using an extended exponent range, the floating point values can be promoted to a vector format. The vector format is a polynomial format such that, as an example, if two values are (a,b) and (c,d) in the vector format, then they can be multiplied together as (a,b)·(c,d)=(ac,ad+bc,bd) Truncation may be applied to the result of a multiplication operation so that some finite number of leading terms are retained but some other terms are discarded. The received floating point values can be used as a first component of the vector values, and the epsilon values can be included in one or more (different) components of the vector values. For example, the epsilon values can be included in second and third components of the vector values respectively. In this example, when interpreting the result of a comparison (e.g. the sign of a cross product as described above in a polygon intersection test) the value in the second component is ignored unless it is nonzero and the value in the first component is zero. Moreover, the value in the third component is ignored unless it is nonzero and the value of the first two components are zero. In this way, the epsilon values do not alter the results of processing the received floating point values unless there is a tie. In this format, the epsilon values do not need to use an extended exponent range. However, processing vector values is generally a more complex process compared to processing scalar values, but may be more suited to a software implementation. Additionally, any input value (zero or nonzero) is treated identically by this method (i.e., effectively shifted by $(\varepsilon_1,\varepsilon_2)$), such that there is no need to treat the "cancellation" case as a special case. Further, in the context of polygon intersection testing, this method allows us to correctly handle endpoints of edges that may not cross one of the axes (at the expense of additional subtractions) broadening the scope to include all convex polygons (not just strictly convex ones). If all three components of the vector result are zero this indicates a degenerate case which can be ignored in the intersection determination.

FIG. 14*a* illustrates a set of four scalar input values: a, b, c, d. The input values are in a floating point format. FIG. 14*b* illustrates how these scalar input values can be promoted to a vec3 vector format such that each vector value has three components, whereby the received scalar input values shown in FIG. 14*a* become the first components of the corresponding vector values and the second and third components are $e_1$ and $e_2$ components respectively. In this example the input values a, b, c, and d pair up as 2D coordinates (a, b) and (c, d)), and in this case $a_1=b_2=c_1=d_2=1$ and $a_2=b_1=c_2=d_1=0$, such that the representations of the vector values are $a+e_1$, $b+e_2$, $c+e_1$ and $d+e_2$. These vec3 values do not need to be generated or stored as they can be implicitly assumed in the 2D cross product calculation (unlike the general case described above in which the exponent range is extended to explicitly represent the epsilon values). The $e_1$ and $e_2$ values may be thought of as equivalent to the epsilon values $\varepsilon_1$ and $\varepsilon_2$ described above. In this example, the vector format is a vec3 format, i.e. each vector value has three components, but in other examples, the vector format may be a vec2 format, i.e. each vector value may have two components. If a vec2 format was used then the $e_1$ and $e_2$ values would be represented in the same component of the vector format. The vec2 format allows the epsilon values to be represented as orthogonal to the received input values. A vec3 format additionally allows different types of epsilon values (e.g. similar to the $\varepsilon_1$ and $\varepsilon_2$ values described above) to be represented as orthogonal to each other. Higher order vector formats could also be used, e.g. a vec4 format for testing in the 3D case. By representing the values as vector values with the epsilon values being orthogonal to the received values, the particular comparison can be performed as a polynomial operation to determine results for the different, orthogonal components, e.g. without the need to extend the exponent range.

FIG. 15 shows a flow chart for a method 1500 of performing, in a processing module (e.g. in the intersection testing module 108), a particular comparison operation using floating point values in which a vector format is used. In step S1502, the floating point values are received at comparison operation logic 118 in a scalar format. As described above, the received floating point values could be components of ray data, e.g. components of the ray origin or ray direction, and/or the received floating point values could be components defining a box, e.g. the $b_{x,min}$, $b_{y,min}$, $b_{z,min}$, $b_{x,max}$, $b_{y,max}$ and $b_{z,max}$ values described above defining the planes of an axis-aligned bounding box, and/or the received floating point values could be components of positions of vertices of polygons to be tested for intersection, e.g. the $p_i$, $q_i$, $p_j$ and $q_j$ values described above representing two two-dimensional vertices $v_i$ and $v_j$ defining an edge of a polygon.

In step S1504 the comparison operation logic 118 promotes the received floating point values to a vector format (e.g. a vec3 format as described above), wherein the received floating point values are used as a first component of the vector floating point values. In step S1506 the comparison operation logic 118 sets the higher order components of the vector floating point values (e.g. the second and third components of the vector values in a vec3 format). For example, as described above, if four values are received which are paired up as 2D coordinates (a, b) and (c, d), then in step S1506 the first component of the first value $a_1$ can be set to 1 and the second component of the first value $a_2$ can be set to 0; the first component of the second value $b_1$ can be set to 0 and the second component of the second value $b_2$ can be set to 1; the first component of the third value $c_1$ can be set to 1 and the second component of the third value $c_2$ can be set to 0; and the first component of the fourth value $d_1$ can be set to 0 and the second component of the fourth value $d_2$ can be set to 1. In this way, the vec3 representations of the vector values are $a+e_1$, $b+e_2$, $c+e_1$ and $d+e_2$. These values (e.g. 0 or 1) for the second and third components of the vector floating point values may (or may not) be represented in the same format as the received input values. In particular, the values (e.g. 0 or 1) for the second and third components of the vector floating point values do not need to use an extended exponent range.

In step S1508, the comparison operation logic 118 performs the particular comparison operation using the vector floating point values to determine a vector result having first and second components. In vector arithmetic, if a first vec3 value $[a, a_1, a_2]$ (which represents a value of $a+a_1e_1+a_2e_2$) is added to a second vec3 value $[b, b_1, b_2]$ (which represents a value of $b+b_1e_1+b_2e_2$), we get $[a+b, a_1+b_1, a_2+b_2]$ (which represents a value of $a+b+(a_1+b_1)e_1+(a_2+b_2)e_2$)). Furthermore, in vector arithmetic, if a first vec3 value $[a, a_1, a_2]$ (which represents a value of $a+a_1e_1+a_2e_2$) is multiplied with a second vec3 value $[b, b_1, b_2]$ (which represents a value of $b+b_1e_1+b_2e_2$), we get $[ab, a*b_1+b*a_1, a*b_2+b*a_2]$ (which represents a value of $ab+(a*b_1+b*a_1)e_1+(a*b_2+b*a_2)e_2$)), where any terms involving $e_1*e_1$, $e_1*e_2$ or $e_2*e_2$ are ignored.

In step S1510, the comparison operation logic 118 determines a scalar result of the particular comparison operation. The value in the first component of the output vector always gives the magnitude of the result. If the first component is nonzero then the first component also gives the sign of the result. If the first component is zero and the second component is nonzero, then the second component gives the sign of the result. If the first and second components are zero and the third component is nonzero, then the third component gives the sign of the result. If all of the components are zero then we have a degenerate case.

For a triangle, such a degenerate edge implies that the polygon is degenerate, so may be culled. In general, for a higher order convex polygon of degree n, the sign of such a degenerate edge must be overlooked in the intersection determination, unless there are sufficiently many such edges (i.e., more than n−3) meaning the polygon is degenerate, so may be culled.

In step S1512 the comparison operation logic 118 outputs the scalar result of the particular comparison operation. As described above, this output can be used in a ray tracing system for rendering an image of a scene.

In some examples, either the second or third component of a vector floating point value may be set to a finite floating point value, rather than zero, only if the corresponding received floating point value is zero or infinity. In these examples, it is still possible to find f=0, and as such this "cancellation case" would be handled separately as described above. However, in other examples, either the second or third components of all of the vector floating point values may be set to non-zero, finite floating point values. The second or third components which are set for different vector values may have the same value, or they may have different values.

For example, when the method shown in FIG. 15 is used in the comparison operation logic $\mathbf{118}_1$ of the box intersection testing unit(s) 112 then, as described above, the particular comparison operation may determine the sign of $b_uD_v-b_vD_u$ or may determine whether $b_uD_v>b_vD_u$. Each of the four input values ($b_u$, $b_v$, $D_u$ and $D_v$) are promoted to a vector form, with the input values being the respective first components of the corresponding vector values. The second components of vector values for $D_u$ and $D_v$ may be set (in step S1506) to be 1 without needing to extend the exponent range. The third components of the vector values for $D_u$ and $D_v$ may be set (in step S1506) to be 0. The ray direction vectors therefore represent values of $D_u+e_1$ and $D_v+e_1$ respectively. The second components of the vector values for $b_u$ and $b_v$ may be set (in step S1506) to be 0. The third components of the vector values for $b_u$ and $b_v$ may be set (in step S1506) to be 1. The vector values for $b_u$ and $b_v$ may therefore represent values of $b_u+e_2$ and $b_v+e_2$ respectively. In some other examples, a vec2 format may be used and the second components of the vector values for $b_u$ and $b_v$ may be set (in step S1506) to be 0. In these other examples, the vector values for $b_u$ and $b_v$ would therefore represent values of $b_u$ and $b_v$ respectively, i.e. they would not be shifted. As described above, because the boxes are axis-aligned we can avoid situations in which rays are parallel to faces of the box by shifting the ray direction vectors without also shifting the box coordinates.

A similar approach can be taken when the ray direction vector components are received in a reciprocal form, such that as described above the articular comparison operation may determine the sign of $$b_u\frac{1}{D_u} - b_v\frac{1}{D_v}$$

or may determine whether $$b_u\frac{1}{D_u} > b_v\frac{1}{D_v}.$$

Each of the four input values $$\left(b_u, b_v, \frac{1}{D_u} \text{ and } \frac{1}{D_v}\right)$$

are promoted to a vector form, with the input values being the respective first components of the corresponding vector values. The second components of vector values for $$\frac{1}{D_u} \text{ and } \frac{1}{D_v}$$

may be set (in step S1506) to be 1 without needing to extend the exponent range. The third components of the vector values for $$\frac{1}{D_u} \text{ and } \frac{1}{D_v}$$

may be set (in step S1506) to be 0. The ray direction vectors therefore represent values of $$\frac{1}{D_u} + e_1 \text{ and } \frac{1}{D_v} + e_1$$

respectively. As described above, the second components of the vector values for $b_u$ and $b_v$ may be set (in step S1506) to be 0. The third components of the vector values for $b_u$ and $b_v$ may be set (in step S1506) to be 1. The vector values for $b_u$ and $b_v$ may therefore represent values of $b_u+e_2$ and $b_v+e_2$ respectively. In some other examples, a vec2 format may be used and the second components of the vector values for $b_u$ and $b_v$ may be set (in step S1506) to be 0. In these other examples, the vector values for $b_u$ and $b_v$ would therefore represent values of $b_u$ and $b_v$ respectively, i.e. they would not be shifted. As described above, because the boxes are axis-aligned we can avoid situations in which rays are parallel to faces of the box by shifting the ray direction vectors without also shifting the box coordinates.

The comparison operation can then be performed using a polynomial representation, wherein the magnitude of final scalar result is given by the magnitude of the first component of the output vector. If the first component of the output vector is nonzero then the first component also gives the sign of the result. If the first component is zero and the second component of the output vector is nonzero, then the second component gives the sign of the result. If the first and second components are zero and the third component of the output vector is nonzero, then the third component gives the sign of the result. If all of the components of the output vector are zero then we have a non-pathological tie-breaking case, where either sign may be used as the result.

As another example, when the method shown in FIG. 15 is used in the comparison operation logic 1182 of the polygon intersection testing unit(s) 114 then, as described above, the particular comparison operation may determine the sign of $p_iq_j-q_1p_j$ or may determine whether $p_iq_j>q_ip_j$. Each of the four input values ($p_i$, $q_i$, $p_j$ and $q_j$) are promoted to a vector form, with the input values being the respective first components of the corresponding vector values. The second components of vector values for $p_i$ and $p_j$ may be set (in step S1506) to be 1 without needing to extend the exponent range. The third components of the vector values for $p_i$ and $p_j$ may be set (in step S1506) to be 0. The ray direction vectors therefore represent values of $p_i+e_1$ and $p_j+e_1$ respectively. The second components of the vector values for $q_i$ and $q_j$ may be set (in step S1506) to be 0. The third components of the vector values for $q_i$ and $q_j$ may be set (in step S1506) to be 1. The vector values for $q_i$ and $q_j$ may therefore represent values of $q_i+e_2$ and $q_j+e_2$ respectively. In this example, for each of the vector floating point values ($p_i$, $p_j$, $q_i$ and $q_j$) either the second component or the third component is set to a non-zero, finite value (e.g. 1). In some other examples, a vec2 format may be used and the second components of the vector values for $q_i$ and $q_j$ may be set (in step S1506) to be $e_2/e_1$ where $e_1>>e_2$. In these other examples, the exponent range may need to be extended to differentiate between $e_1$ and $e_2$ but it would not need to be extended by as much as described above in the examples which do not use a vector format.

Equation (1) above gives the equation for the 2D cross product $f(v_i,v_j)$ of two vertices $v_i=(p_i,q_i)$ and $v_j=(p_j,q_j)$ when the epsilon values are used with the extended exponent range described above. If a vec3 format is used as described above, with $p_i \vdash (p_i, 1,0)$, $p_j \vdash (p_j,1,0)$, $q_i \vdash (q_i, 0,1)$ and $q_j \vdash (q_j, 0,1)$ then $p_iq_j \vdash (p_iq_j,q_j,p_i)$ and $q_ip_j \vdash (q_ip_j,q_1,p_j)$. Therefore, the 2D cross product becomes:

$f(v_i,v_j)=p_iq_j-q_ip_j \vdash (p_iq_j-q_ip_j, (q_j-q_i), (p_i-p_j))$. As described above, the value in the first component ($p_iq_j-q_ip_j$) of the output vector always gives the magnitude of the result for $f(v_i,v_j)$. If the first component is nonzero then the first component also gives the sign of the result for $f(v_i,v_j)$. If the first component ($p_iq_j-q_ip_j$) is zero and the second component ($q_j-q_i$) is nonzero, then the second component gives the sign of the result for $f(v_i,v_j)$. If the first and second components are zero and the third component ($p_i-p_j$) is nonzero, then the third component gives the sign of the result for $f(v_i,v_j)$. If all of the components are zero then we have a degenerate case. As described above, for a triangle, such a degenerate edge implies that the polygon is degenerate, so may be culled. In general, for a higher order convex polygon of degree n, the sign of such a degenerate edge must be overlooked in the intersection determination, unless there are sufficiently many such edges (i.e., more than n−3) meaning the polygon is degenerate, so may be culled.

If a vec2 format is used, with the two epsilon values being in the same component then $$p_i \mapsto (p_i, 1),\ p_j \mapsto (p_j, 1),\ q_i \mapsto \left(q_i, \frac{e_2}{e_1}\right) \text{ and } q_j \mapsto \left(q_j, \frac{e_2}{e_1}\right), \text{ then}$$

$$p_i q_j \mapsto \left(p_i q_j,\ q_j + \frac{e_2}{e_1} p_i\right) \text{ and } q_i p_j \mapsto \left(q_i p_j,\ q_i + \frac{e_2}{e_1} p_j\right).$$

Therefore, the 2D cross product becomes:

$$f(v_i, v_j) = p_i q_j - q_i p_j \mapsto \left(p_i q_j - q_i p_j,\ (q_j - q_i) + \frac{e_2}{e_1}(p_i - p_j)\right)$$

As described above, the value in the first component ($p_iq_j-q_ip_j$) of the output vector always gives the magnitude of the result for $f(v_i,v_j)$. If the first component is nonzero then the first component also gives the sign of the result for $f(v_i,v_j)$. It is noted again that $e_1>>e_2$, so if $q_j-q_i\neq0$ then the second component can be approximated as ($q_j-q_i$). Therefore, if the first component ($p_iq_j-q_ip_j$) is zero and $q_j-q_i\neq0$, then the sign of ($q_j-q_i$) gives the sign of the result for $f(v_i, v_j)$. If $q_j-q_i=0$ then the second component is given by $$\frac{e_2}{e_1}(p_i - p_j).$$

Therefore, if the first component is zero and $q_j-q_i=0$, then the sign of $$\frac{e_2}{e_1}(p_i - p_j)$$

gives the sign of the result for $f(v_i,v_j)$. If the first and second components of the output vector $f(v_i,v_j)$ are zero then we have a degenerate case. As described above, for a triangle, such a degenerate edge implies that the polygon is degenerate, so may be culled. In general, for a higher order convex polygon of degree n, the sign of such a degenerate edge must be overlooked in the intersection determination, unless there are sufficiently many such edges (i.e., more than n−3) meaning the polygon is degenerate, so may be culled.

It is noted that the method described with reference to FIG. 15 does not replace zeros or infinities, so it does not provide the benefit of avoiding having to handle zeros and infinities as exceptions as described above. Other drawbacks of using a vector format scheme (compared to extending the exponent range) are additional overhead in storing three floating point values in the format (although it can often be achieved implicitly), plus additional operations (e.g. an extra subtraction or comparison per epsilon value for the two epsilons in the 2D case). However, the vector format method does provide an elegant method for providing a watertight intersection testing process (in particular, a non-redundant watertight intersection testing process), and it does not (necessarily) require the exponent range to be extended. Other benefits of using a vector format scheme (compared to extending the exponent range) are that it is more suitable for a software implementation (in which an extended exponent might not be available), and it has a slightly broader scope in that it operates on convex polygons rather than strictly convex polygons.

Figure 16:
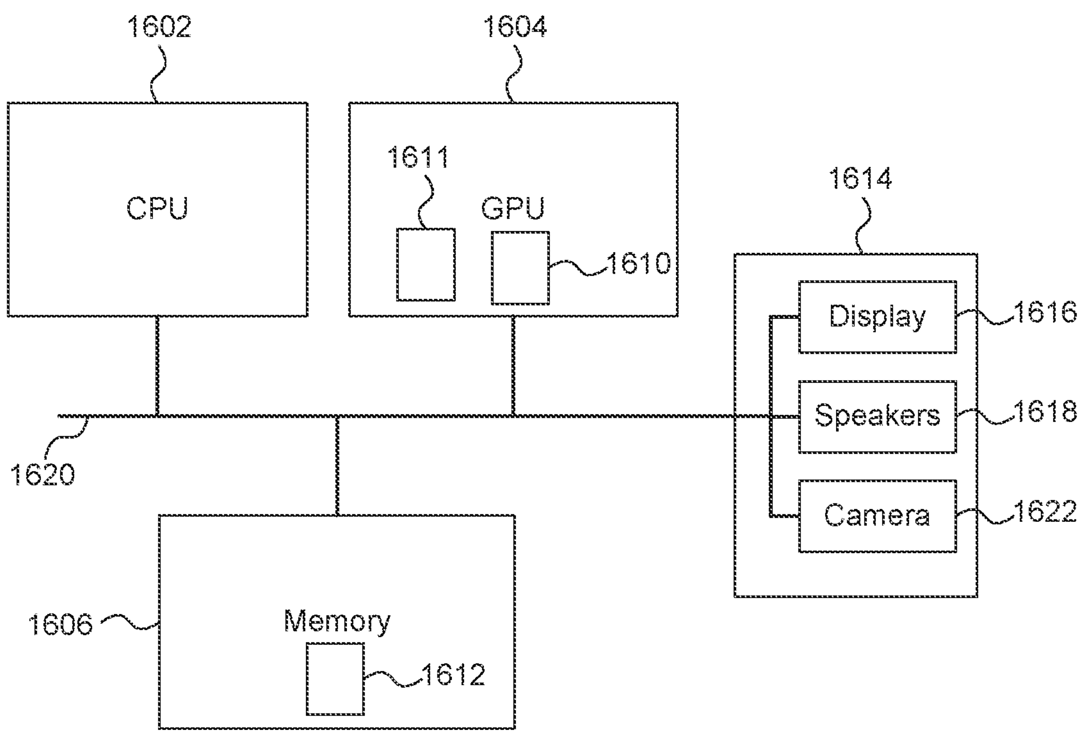
FIG. 16 shows a computer system in which a processing module is implemented.

FIG. 16 shows a computer system in which the ray tracing systems described herein may be implemented. The computer system comprises a CPU 1602, a GPU 1604, a memory 1606 and other devices 1614, such as a display 1616, speakers 1618 and a camera 1622. A ray tracing unit 1610 (corresponding to ray tracing unit 102) is implemented on the GPU 1604, as well as a Neural Network Accelerator (NNA) 1611. In other examples, the ray tracing unit 1610 may be implemented on the CPU 1602 or within the NNA 1611 or as a separate processing unit in the computer system. The components of the computer system can communicate with each other via a communications bus 1620. A store 1612 (corresponding to memory 104) is implemented as part of the memory 1606.

The ray tracing system of FIG. 1 is shown as comprising a number of functional blocks. This is schematic only and is not intended to define a strict division between different logic elements of such entities.

Each functional block may be provided in any suitable manner. It is to be understood that intermediate values described herein as being formed by a ray tracing system need not be physically generated by the ray tracing system at any point and may merely represent logical values which conveniently describe the processing performed by the ray tracing system between its input and output.

The ray tracing units, and specifically the processing modules (e.g. the intersection testing modules) described herein may be embodied in hardware on an integrated circuit. The processing modules described herein may be configured to perform any of the methods described herein. Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods.

Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, bytecode, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be or comprise any kind of general purpose or dedicated processor, such as a CPU, GPU, NNA, System-on-chip, state machine, media processor, an application-specific integrated circuit (ASIC), a programmable logic array, a field-programmable gate array (FPGA), or the like. A computer or computer system may comprise one or more processors.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed (i.e. run) in an integrated circuit manufacturing system configures the system to manufacture a processing module configured to perform any of the methods described herein, or to manufacture a processing module comprising any apparatus described herein. An integrated circuit definition dataset may be, for example, an integrated circuit description.

Therefore, there may be provided a method of manufacturing, at an integrated circuit manufacturing system, a processing module as described herein. Furthermore, there may be provided an integrated circuit definition dataset that, when processed in an integrated circuit manufacturing system, causes the method of manufacturing a processing module to be performed.

An integrated circuit definition dataset may be in the form of computer code, for example as a netlist, code for configuring a programmable chip, as a hardware description language defining hardware suitable for manufacture in an integrated circuit at any level, including as register transfer level (RTL) code, as high-level circuit representations such as Verilog or VHDL, and as low-level circuit representations such as OASIS (RTM) and GDSII. Higher level representations which logically define hardware suitable for manufacture in an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture a processing module will now be described with respect to FIG. 17.

Figure 17:
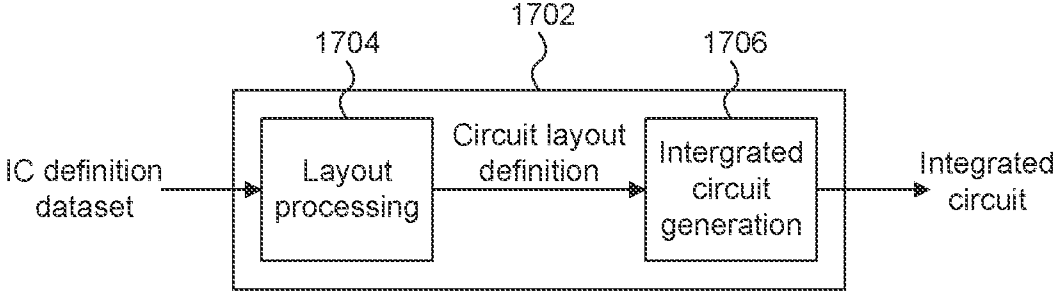
FIG. 17 shows an integrated circuit manufacturing system for generating an integrated circuit embodying a processing module.

FIG. 17 shows an example of an integrated circuit (IC) manufacturing system 1702 which is configured to manufacture a processing module as described in any of the examples herein. In particular, the IC manufacturing system 1702 comprises a layout processing system 1704 and an integrated circuit generation system 1706. The IC manufacturing system 1702 is configured to receive an IC definition dataset (e.g. defining a processing module as described in any of the examples herein), process the IC definition dataset, and generate an IC according to the IC definition dataset (e.g. which embodies a processing module as described in any of the examples herein). The processing of the IC definition dataset configures the IC manufacturing system 1702 to manufacture an integrated circuit embodying a processing module as described in any of the examples herein.

The layout processing system 1704 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1704 has determined the circuit layout it may output a circuit layout definition to the IC generation system 1706. A circuit layout definition may be, for example, a circuit layout description.

The IC generation system 1706 generates an IC according to the circuit layout definition, as is known in the art. For example, the IC generation system 1706 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1706 may be in the form of computer-readable code which the IC generation system 1706 can use to form a suitable mask for use in generating an IC.

The different processes performed by the IC manufacturing system 1702 may be implemented all in one iocation, e.g. by one party. Alternatively, the IC manufacturing system 1702 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different iocations and/or by different parties.

In other examples, processing of the integrated circuit definition dataset at an integrated circuit manufacturing system may configure the system to manufacture a processing module without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 17 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 17, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

The implementation of concepts set forth in this application in devices, apparatus, modules, and/or systems (as well as in methods implemented herein) may give rise to performance improvements when compared with known implementations. The performance improvements may include one or more of increased computational performance, reduced latency, increased throughput, and/or reduced power consumption. During manufacture of such devices, apparatus, modules, and systems (e.g. in integrated circuits) performance improvements can be traded-off against the physical implementation, thereby improving the method of manufacture. For example, a performance improvement may be traded against layout area, thereby matching the performance of a known implementation but using less silicon. This may be done, for example, by reusing functional blocks in a serialised fashion or sharing functional blocks between elements of the devices, apparatus, modules and/or systems. Conversely, concepts set forth in this application that give rise to improvements in the physical implementation of the devices, apparatus, modules, and systems (such as reduced silicon area) may be traded for improved performance. This may be done, for example, by manufacturing multiple instances of a module within a predefined area budget.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:

1. A method of performing an intersection testing process in a ray tracing unit, the method comprising performing a particular comparison operation using floating point values as part of the intersection testing process, wherein said performing the particular comparison operation comprises:

receiving the floating point values in a scalar format;

promoting the received floating point values to a vector format, wherein the received floating point values are used as a first component of the vector floating point values;

setting a second component of one or more of the vector floating point values to a non-zero, finite value;

performing the particular comparison operation using the vector floating point values to determine a vector result having first and second components;

determining a scalar result of the particular comparison operation, wherein the magnitude of the scalar result is given by the magnitude of the first component of the vector result, and wherein the ray tracing unit is configured to determine the sign of the scalar result such that:

in response to determining that the first component of the vector result is zero and that the second component of the vector result is non-zero, the sign of the scalar result is set to be equal to the sign of the second component of the vector result; and outputting the scalar result of the particular comparison operation, wherein the outputted result of the particular comparison operation is used in the ray tracing unit to render an image.

2. The method of claim 1, wherein each vector floating point value has three components, wherein for a first set of the floating point values the second component is set to a non-zero, finite value, and wherein for a second set of the floating point values the third component is set to a non-zero, finite value.

3. The method of claim 2, wherein the ray tracing unit is configured to determine the sign of the scalar result such that in response to determining that the first and second components of the vector result are zero and that the third component of the vector result is non-zero, the sign of the scalar result is set to be equal to the sign of the third component of the vector result.

4. The method of claim 2, wherein for each of the vector floating point values, either the second component or the third component is set to a non-zero, finite value.

5. The method of claim 1, wherein said non-zero, finite value is 1.

6. The method of claim 1, wherein each vector floating point value has only two components, wherein for a first set of the floating point values the second component is set to a first non-zero, finite value 1, and wherein for a second set of the floating point values the second component is set to a second non-zero, finite value $e_2/e_1$, wherein $e_1 \gg e_2$.

7. The method of claim 1, wherein said setting a second component of one or more of the vector floating point values to a non-zero, finite value comprises:

receiving a floating point value that is zero, and setting the second component of the corresponding vector floating point value to a non-zero, finite value.

8. The method of claim 1, wherein said setting a second component of one or more of the vector floating point values to a non-zero, finite value comprises:

receiving a floating point value that is infinity, and setting the second component of the vector floating point value to a non-zero, finite value.

9. The method of claim 1, wherein each vector floating point value has only two components, wherein said setting a second component of one or more of the vector floating point values to a non-zero, finite value comprises setting a second component of all of the vector floating point values to non-zero, finite floating point values.

10. The method of claim 1, wherein the particular comparison operation comprises comparing the result of multiplying two floating point values with the result of multiplying two other floating point values.

11. The method of claim 1, wherein the particular comparison operation is part of an intersection testing process to determine whether a ray intersects a convex polygon defined by an ordered set of vertices, the method further comprising:

- projecting the vertices of the convex polygon onto a pair of axes orthogonal to the ray direction, wherein the origin of the pair of axes corresponds with the ray origin;
- for each edge of the convex polygon defined by two of the projected vertices, using the particular comparison operation to determine a sign of a signed parameter by performing a 2D cross product of the positions of the two projected vertices defining the edge; and
- determining whether the ray intersects the convex polygon based on the signs of the signed parameters determined for the edges of the convex polygon.

12. The method of claim 11, wherein said determining whether the ray intersects the convex polygon comprises:

- determining that the ray intersects the convex polygon if the signed parameters determined for the edges of the convex polygon all have the same sign; and
- determining that the ray does not intersect the convex polygon if it is not the case that the signed parameters determined for the edges of the convex polygon all have the same sign.

13. The method of claim 11, wherein said determining whether the ray intersects the convex polygon comprises:

- determining that the ray intersects the convex polygon if it is determined that the ray passes on the inside of all of the edges of the convex polygon; and
- determining that the ray does not intersect the convex polygon if it is determined that the ray passes on the outside of one or more of the edges of the convex polygon.

14. The method of claim 11, wherein the 2D cross product, $f(v_i, v_j)$, of the positions of the two projected vertices, $v_i$ and $v_j$, defining an edge, is defined as $f(v_i, v_j)=p_i a_j-q_i p_j$, where $p_i$ and $q_i$ are components of the projected vertex $v_i$ along the respective axes of the pair of axes, and where $p_j$ and $q_j$ are components of the projected vertex $v_j$ along the respective axes of the pair of axes, and wherein the comparison operation comprises performing the 2D cross product and determining the sign of the result.

15. The method of claim 11, further comprising:

- determining that the result of the 2D cross product is zero; and
- in response to determining that the result of the 2D cross product is zero, setting the sign of the signed parameter to match the sign of a predetermined one of the floating point values used in the 2D cross product.

16. The method of claim 11, further comprising outputting an indication of a result of the determination of whether the ray intersects the convex polygon, wherein the outputted indication is used in the ray tracing unit for rendering an image of a 3D scene.

17. The method of claim 1, wherein the method is performed in fixed function circuitry of the ray tracing unit.

18. A ray tracing unit configured to perform an intersection testing process, the ray tracing unit being configured to perform a particular comparison operation using floating point values as part of the intersection testing process, the ray tracing unit being configured to:

- receive the floating point values in a scalar format;
- promote the received floating point values to a vector format, wherein the received floating point values are used as a first component of the vector floating point values;
- set a second component of one or more of the vector floating point values to a non-zero, finite value;
- perform the particular comparison operation using the vector floating point values to determine a vector result having first and second components;
- determine a scalar result of the particular comparison operation, wherein the magnitude of the scalar result is given by the magnitude of the first component of the vector result, and wherein:
  - if the first component of the vector result is non-zero then the sign of the scalar result equals the sign of the first component of the vector result, and
  - if the first component of the vector result is zero and if the second component of the vector result is non-zero then the sign of the scalar result equals the sign of the second component of the vector result; and
- output the scalar result of the particular comparison operation, wherein the outputted result of the particular comparison operation is used in the ray tracing unit to render an image.

19. A non-transitory computer readable storage medium having stored thereon an integrated circuit definition dataset that, when processed in an integrated circuit manufacturing system, configures the integrated circuit manufacturing system to manufacture a ray tracing unit configured to perform an intersection testing process, the ray tracing unit being configured to perform a particular comparison operation using floating point values as part of the intersection testing process, the ray tracing unit being further configured to:

- receive floating point values in a scalar format;
- promote the received floating point values to a vector format, wherein the received floating point values are used as a first component of the vector floating point values;
- set a second component of one or more of the vector floating point values to a non-zero, finite value;
- perform the particular comparison operation using the vector floating point values to determine a vector result having first and second components;
- determine a scalar result of the particular comparison operation, wherein the magnitude of the scalar result is given by the magnitude of the first component of the vector result, and wherein:
  - if the first component of the vector result is non-zero then the sign of the scalar result equals the sign of the first component of the vector result, and
  - if the first component of the vector result is zero and if the second component of the vector result is non-zero then the sign of the scalar result equals the sign of the second component of the vector result; and
- output the scalar result of the particular comparison operation, wherein the outputted result of the particular comparison operation is used in the ray tracing unit to render an image.

* * * * *